(12) United States Patent
Konishi

(10) Patent No.: US 9,577,159 B2
(45) Date of Patent: Feb. 21, 2017

(54) PRODUCTION METHOD FOR LIGHT-EMITTING DEVICE

(71) Applicant: Sharp Kabushiki Kaisha, Osaka-shi, Osaka (JP)

(72) Inventor: Masahiro Konishi, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/180,172

(22) Filed: Jun. 13, 2016

(65) Prior Publication Data

US 2016/0293807 A1 Oct. 6, 2016

Related U.S. Application Data

(62) Division of application No. 14/431,036, filed as application No. PCT/JP2013/061025 on Apr. 12, 2013, now Pat. No. 9,404,035.

(30) Foreign Application Priority Data

Sep. 28, 2012 (JP) ................. 2012-218578
Sep. 28, 2012 (JP) ................. 2012-218579

(51) Int. Cl.
*H01L 21/56* (2006.01)
*H01L 33/50* (2010.01)
(Continued)

(52) U.S. Cl.
CPC ......... *H01L 33/502* (2013.01); *B29C 47/0004* (2013.01); *B29C 47/025* (2013.01); *B29C 47/026* (2013.01); *B29C 47/30* (2013.01); *B29C 47/402* (2013.01); *C08J 3/18* (2013.01); *C08J 3/20* (2013.01); *C08J 3/203* (2013.01); *C08J 3/24* (2013.01); *C08J 3/244* (2013.01); *C09D 5/22* (2013.01); *C09D 183/04* (2013.01); *C09K 11/02* (2013.01); *C09K 11/77* (2013.01); *H01L 24/97* (2013.01); *H01L 33/005* (2013.01); *H01L 33/56* (2013.01); *C08J 2383/04* (2013.01); *H01L 33/50* (2013.01); *H01L 2224/45144* (2013.01);
(Continued)

(58) Field of Classification Search
CPC ...... H01L 21/56; H01L 21/565; H01L 33/438; H01L 33/502; C09K 11/02; C09K 11/77
See application file for complete search history.

(56) References Cited

U.S. PATENT DOCUMENTS

2005/0179398 A1* 8/2005 Onishi ............... H01J 29/085
 315/169.2
2009/0095969 A1* 4/2009 Kotani ............... H01L 33/486
 257/98

(Continued)

OTHER PUBLICATIONS

Konishi, "Production Method for Light-Emitting Device", U.S. Appl. No. 14/431,036, filed Mar. 25, 2015.

*Primary Examiner* — Phuc Dang
(74) *Attorney, Agent, or Firm* — Keating & Bennett, LLP

(57) ABSTRACT

A fluorescent material-containing sealing resin (20) production method of the present invention includes: a kneading step of kneading a powder mixture (24), which has been obtained by mixing a powder of silicone resins (21) and a powder of fluorescent materials (22) together, while melting the powder mixture (24) by heat, so that a kneaded mixture (25) is obtained; and an extruding step of extruding the kneaded mixture (25) in a form of a cord from an output port (37b) of a twin screw extruder (37).

7 Claims, 26 Drawing Sheets

(51) Int. Cl.
*C08J 3/20* (2006.01)
*C08J 3/24* (2006.01)
*H01L 23/00* (2006.01)
*H01L 33/56* (2010.01)
*C09D 183/04* (2006.01)
*C09K 11/77* (2006.01)
*H01L 33/00* (2010.01)
*B29C 47/02* (2006.01)
*B29C 47/30* (2006.01)
*C08J 3/18* (2006.01)
*B29C 47/00* (2006.01)
*B29C 47/40* (2006.01)
*C09K 11/02* (2006.01)
*C09D 5/22* (2006.01)

(52) U.S. Cl.
CPC ............... *H01L 2224/48091* (2013.01); *H01L 2224/48465* (2013.01); *H01L 2224/73265* (2013.01); *H01L 2933/005* (2013.01); *H01L 2933/0033* (2013.01); *H01L 2933/0041* (2013.01)

(56) References Cited

U.S. PATENT DOCUMENTS

2009/0186454 A1* 7/2009 Miyawaki ............... H01L 21/56
438/127
2013/0334557 A1* 12/2013 Uchida ................ H01L 23/564
257/98

* cited by examiner

F I G. 7
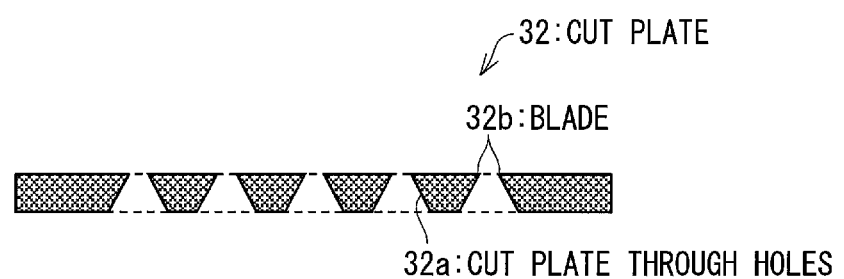

F I G. 8
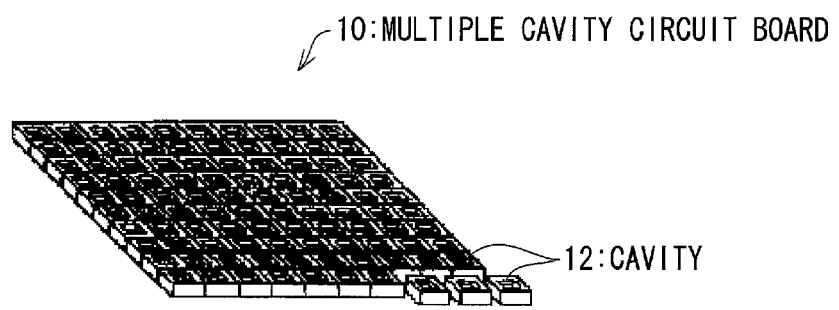

F I G. 1 2
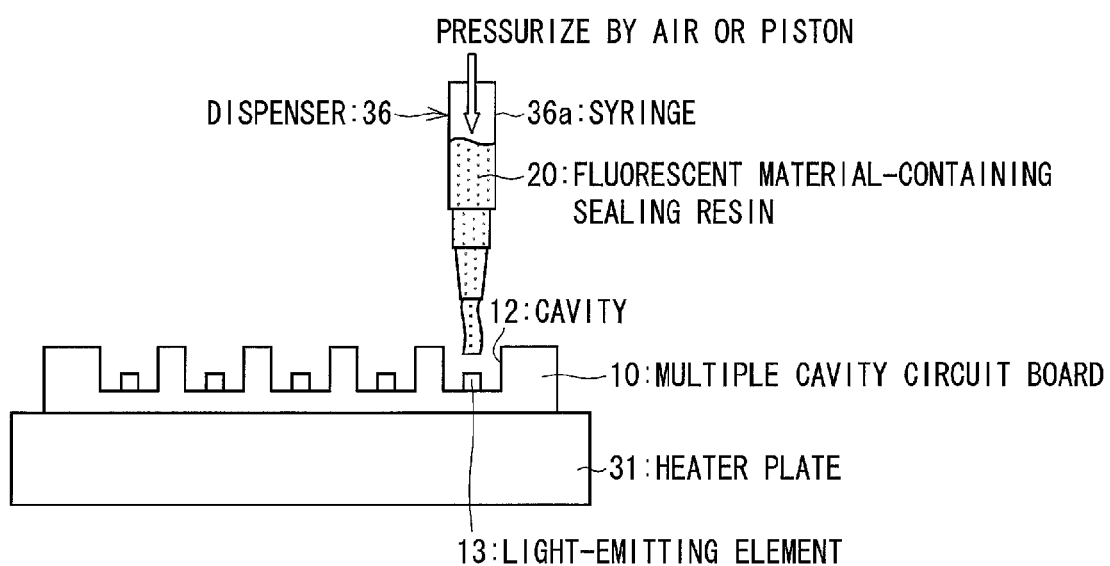

F I G. 1 8
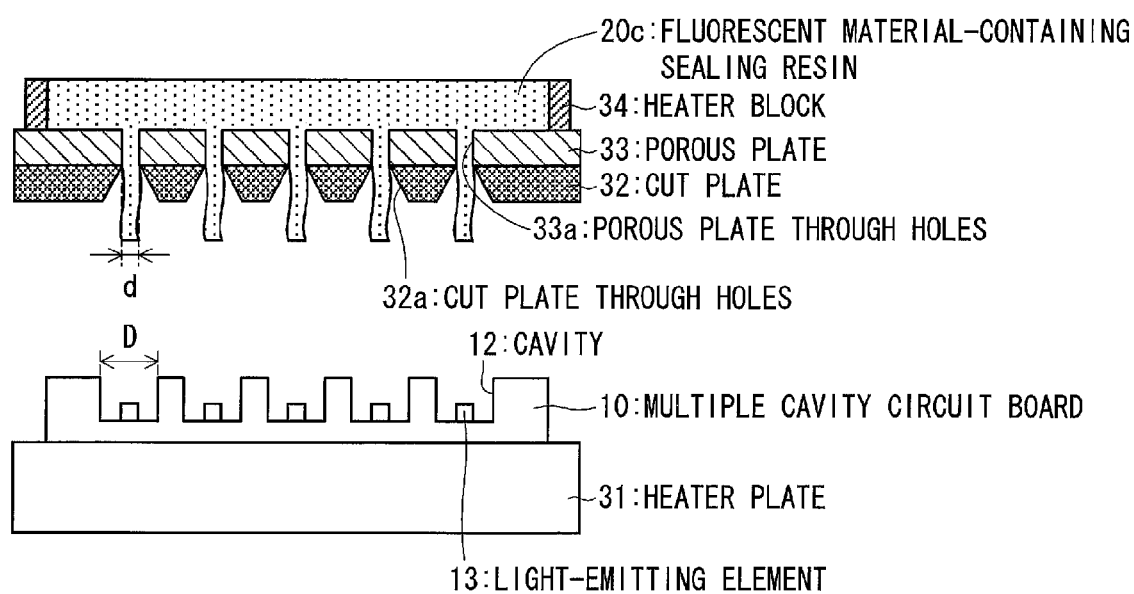

FIG. 21

|  | ELASTIC MODULUS G' (Pa) [SUBJECTED TO SECONDARY CROSSLINKING] | | VISCOSITY η' (Pa·s) [SUBJECTED TO PRIMARY CROSSLINKING] | |
|---|---|---|---|---|
|  | 25°C | 125°C | 25°C | 120°C |
| WITHOUT PLASTICIZER | ~5E+7 | ~1E+7 | ~4E+5 | ~1E+4 |
| WITH PLASTICIZER (11%) | ~2E+7 | ~1E+6 | ~1E+5 | ~1E+2 |

F I G. 2 3
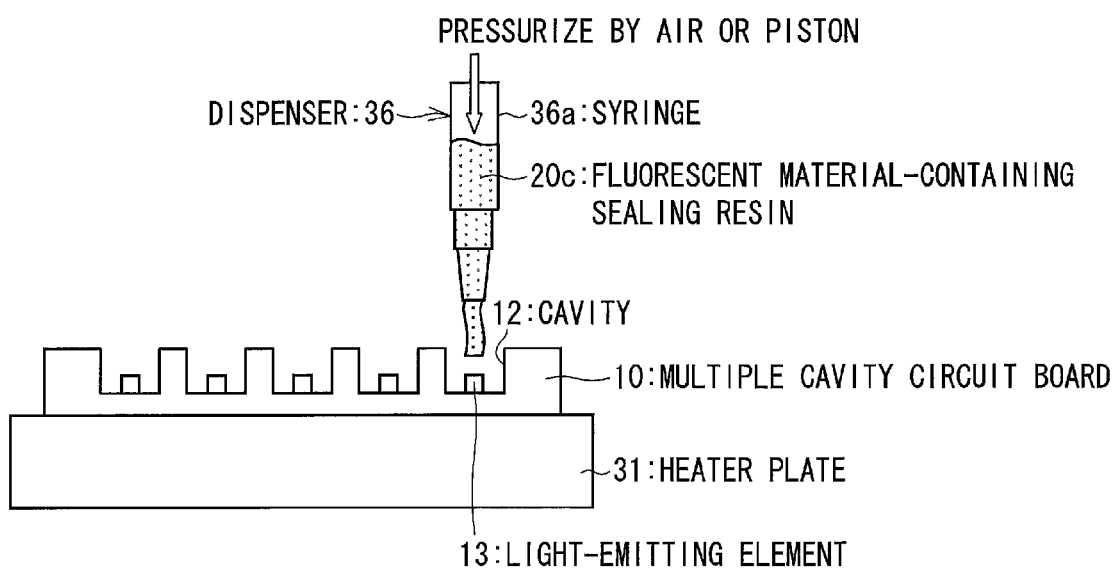

PRODUCTION METHOD FOR LIGHT-EMITTING DEVICE

TECHNICAL FIELD

The present invention relates to (i) a method of producing a fluorescent material-containing sealant for sealing a light-emitting element, (ii) a fluorescent material-containing sealant, (iii) a method of producing a light-emitting device, and (iv) a dispenser.

BACKGROUND ART

According to an existing light-emitting device that includes an LED chip and emits white light, the light-emitting device uses (i) a blue LED chip and (ii) YAG fluorescent materials (see Patent Literature 1) that emit yellow fluorescence when excited by light emitted from the blue LED chip. The light-emitting device emits white light by mixing together blue light emitted by the blue LED chip and yellow light emitted from the YAG fluorescent materials.

According to such a light-emitting device, an LED chip is sealed by, for example, silicone resins in which a fluorescent materials are dispersed.

CITATION LIST

Patent Literature

Patent Literature 1
Japanese Patent Application Publication, Tokukaihei, No. 10-242513 (Publication Date: Sep. 11, 1998)

SUMMARY OF INVENTION

Technical Problem

In a step of sealing an LED chip mounted in each cavity provided in a substrate, each cavity is filled, by use of a dispenser or the like, with liquid-state silicone resins containing fluorescent materials. In some cases, the fluorescent materials precipitated in a syringe of the dispenser as a result of a difference in specific gravity between the silicone resins and the fluorescent materials.

Therefore, there occurs a problem that silicone resins filling the respective cavities become different in fluorescent material content, and consequently variance in chromaticity occurs between mass-produced light-emitting devices.

The present invention has been made in view of the problem, and it is an object of the present invention to provide a method of producing a fluorescent material-containing sealant, a fluorescent material-containing sealant, a method of producing a light-emitting device, and a dispenser, each of which makes it possible to reduce variance in chromaticity among light-emitting devices by equalizing respective fluorescent material contents of the light-emitting devices.

Solution to Problem

In order to attain the object, a fluorescent material-containing sealant production method in accordance with an embodiment of the present invention includes: a mixing step of mixing (i) a powder of silicone resins which have been semi-cured by primary crosslinking and (ii) a powder of fluorescent materials, so that a powder mixture is obtained; a kneading step of kneading, by use of a kneading extruding device including at least one screw, the powder mixture while melting the powder mixture by heat at a temperature lower than a secondary crosslinking temperature, so that a kneaded mixture is obtained, the secondary crosslinking temperature being a temperature at which the silicone resins form secondary crosslinking; and an extruding step of extruding the kneaded mixture in a form of a cord from an output port of the kneading extruding device, which output port has at least one through hole, the silicone resins being configured to (i) reversibly change in viscosity in a temperature region between room temperature and the temperature lower than the secondary crosslinking temperature and (ii) be completely cured in a temperature region encompassing the secondary crosslinking temperature or higher.

In order to attain the object, a fluorescent material-containing sealant in accordance with an embodiment of the present invention is a fluorescent material-containing sealant in which a powder of fluorescent materials is dispersed in silicone resins which have been semi-cured by primary crosslinking, the silicone resins (i) having a form of a cord and (ii) being configured to (a) reversibly change in viscosity in a temperature region between room temperature and a temperature lower than a secondary crosslinking temperature at which the silicone resins form secondary crosslinking and (b) be completely cured in a temperature region encompassing the secondary crosslinking temperature or higher.

In order to attain the object, a light-emitting device production method in accordance with an embodiment of the present invention includes: a placing step of placing, above a substrate on which light-emitting elements are mounted in respective cavities facing upwards, a porous plate having through holes corresponding to the respective cavities, the placing being carried out so that the porous plate is placed substantially parallel to the substrate; a situating step of situating, on the porous plate, a fluorescent material-containing sealant in which a powder of fluorescent materials is kneaded with silicone resins that have been semi-cured by primary crosslinking; an extruding step of extruding the fluorescent material-containing sealant in a form of strings via the respective through holes toward the substrate while melting the fluorescent material-containing sealant by heat at (i) room temperature or (ii) a temperature lower than a secondary crosslinking temperature at which the silicone resins form secondary crosslinking; a filling step of filling the cavities with the respective strings of fluorescent material-containing sealant by cutting, to a predetermined length, each of the strings of fluorescent material-containing sealant thus extruded; and a curing step of curing the fluorescent material-containing sealant with which the cavities are filled, the curing being carried out by heating the fluorescent material-containing sealant at the secondary crosslinking temperature or higher, the silicone resins being configured to (i) reversibly change in viscosity in a temperature region between the room temperature and the temperature lower than the secondary crosslinking temperature and (ii) be completely cured in a temperature region encompassing the secondary crosslinking temperature or higher.

In order to attain the object, a dispenser in accordance with an embodiment of the present invention is a dispenser configured to discharge, toward light-emitting elements mounted on a substrate, respective strings of fluorescent material-containing sealant in which a powder of fluorescent materials is dispersed in silicone resins which have been semi-cured by primary crosslinking, said dispenser including: a containing section for containing the fluorescent material-containing sealant, the containing section having a heating mechanism capable of heating the fluorescent material-containing sealant thus contained, and the silicone resins being configured to (i) reversibly change in viscosity in a temperature region between room temperature and a temperature lower than a secondary crosslinking temperature at which the silicone resins form secondary crosslinking and (ii) be completely cured in a temperature region encompassing the secondary crosslinking temperature or higher.

Advantageous Effects of Invention

An embodiment of the present invention brings about an effect of providing a fluorescent material-containing sealant production method capable of reducing variance in chromaticity by equalizing fluorescent material contents of light-emitting devices.

An embodiment of the present invention brings about an effect of providing a fluorescent material-containing sealant capable of reducing variance in chromaticity by equalizing fluorescent material contents of light-emitting devices.

An embodiment of the present invention brings about an effect of providing a light-emitting device production method capable of reducing variance in chromaticity by equalizing fluorescent material contents of light-emitting devices.

An embodiment of the present invention brings about an effect of providing a dispenser capable of reducing variance in chromaticity by equalizing fluorescent material contents of light-emitting devices.

BRIEF DESCRIPTION OF DRAWINGS

FIG. 7 is a cross-sectional view illustrating a cut plate illustrated in FIG. 6.

FIG. 8 is a view schematically illustrating a step of dividing a multiple cavity circuit board.

FIG. 12 is a cross-sectional view illustrating a step of filling cavities with a fluorescent material-containing sealing resin with the use of a dispenser.

FIG. 18 is a cross-sectional view illustrating an extruding step illustrated in (c) of FIG. 17.

FIG. 21 is a table showing how viscosity and elastic modulus of silicone resins vary, depending on whether or not a plasticizer is added.

FIG. 23 is a cross-sectional view illustrating a step of filling, by use of a dispenser, cavities with a fluorescent material-containing sealing resin.

DESCRIPTION OF EMBODIMENTS

Embodiment 1

The following description will discuss, with reference to FIGS. 1 through 12, an embodiment of a method of producing a light-emitting device of the present invention.

<Configuration of Light-Emitting Device 1a>

A configuration of a light-emitting device (light-emitting device) 1a in accordance with Embodiment 1 will be described with reference to FIG. 1.

Figure 1:
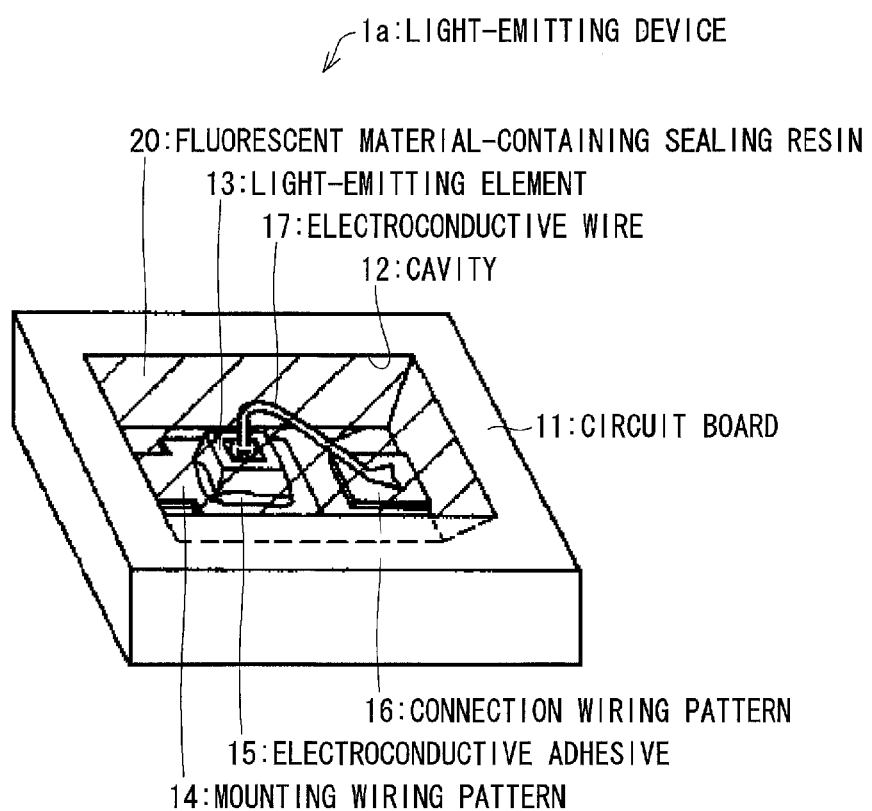
FIG. 1 is a perspective view illustrating an external appearance of a light-emitting device produced by a light-emitting device production method in accordance with Embodiment 1.

FIG. 1 is a perspective view illustrating an external appearance of the light-emitting device 1a produced by a light-emitting device production method in accordance with Embodiment 1. According to the light-emitting device 1a, a cavity 12 having a quadrilateral shape and facing upwards is provided in a circuit board (substrate) 11 which is an MID (Molded Interconnection Device, three-dimensional injection-molded circuit board) in the form of a rectangular parallelepiped having a base approximately 1 mm×1 mm (see FIG. 1). In other words, the cavity 12 is a recess provided on an upper surface of the circuit board 11. Inside the cavity 12, a light-emitting element 13 such as an LED chip is mounted.

The light-emitting element 13 has a lower surface that is connected (die-bonded), by an electroconductive adhesive 15, to a mounting wiring pattern 14 provided at a bottom of the cavity 12. Furthermore, the light-emitting element 13 has an upper surface that is connected (wire-bonded), via an electroconductive wire 17 made of, for example, a gold wire, to a connection wiring pattern 16 provided at the bottom of the cavity 12.

The inside of the cavity 12 of the circuit board 11 is sealed by a fluorescent material-containing sealing resin (fluorescent material-containing sealant) 20 made of a light-transmissive silicone resin.

Inner surfaces of the cavity 12 may serve as reflectors. This allows a light utilization efficiency of the light-emitting device 1a to be increased.

Note that how to mount the light-emitting element 13 on the circuit board 11 is not particularly limited. The light-emitting element 13 can be mounted on the circuit board 11 by, for example, a flip chip method instead of a wire bonding method.

The circuit board 11 can alternatively be configured by (i) subjecting a lead frame to insert molding by use of a light reflective resin that serves as a reflector or (ii) forming a cavity through, for example, combining a reflector member to a circuit board having a flat surface.

<Light-emitting Device 1a Production Method>

Next, the following description will discuss, with reference to FIGS. 2 through 8, a method of producing the light-emitting device 1a illustrated in FIG. 1.

Figure 2:
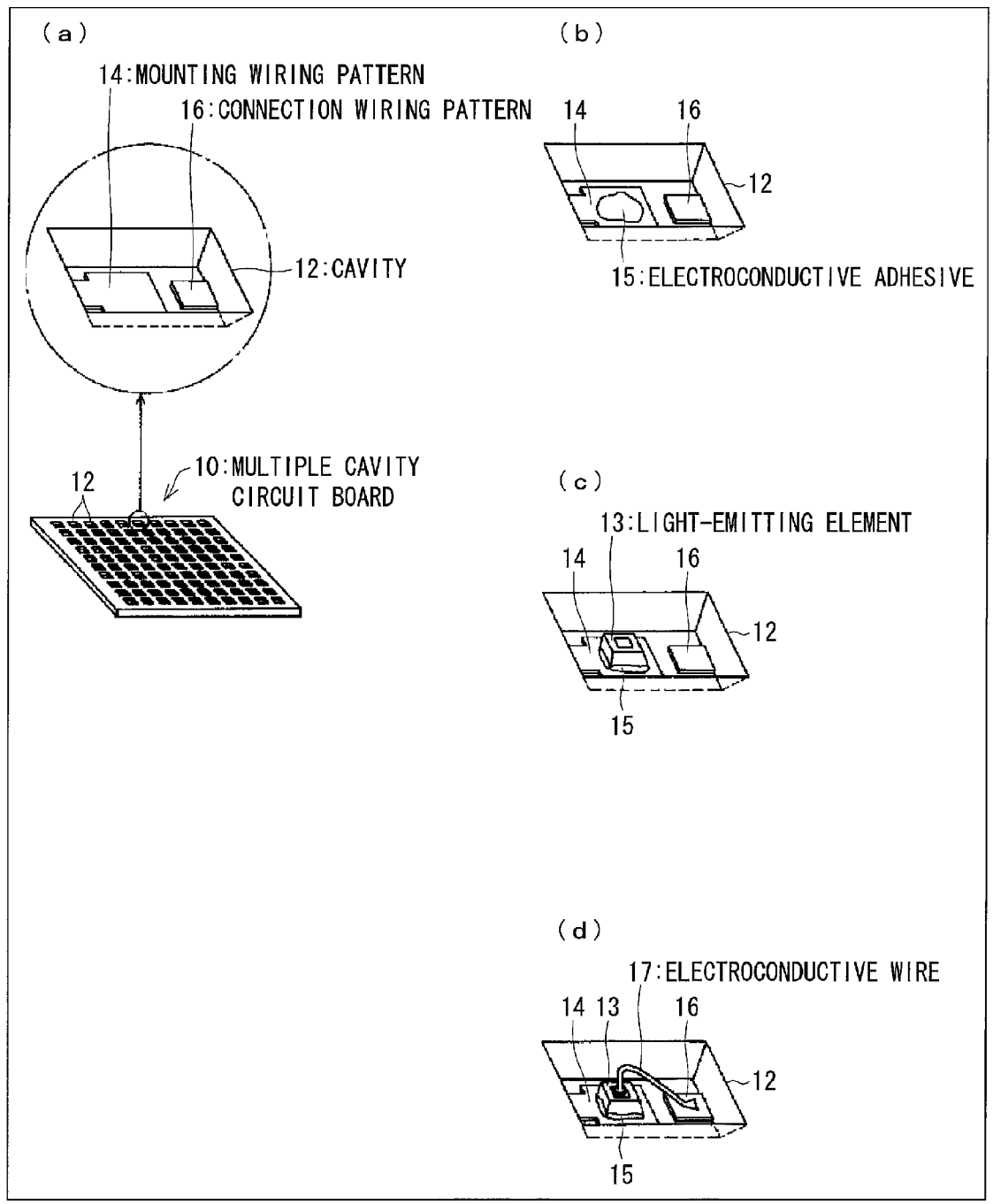
FIG. 2 is a set of views (a) through (d), schematically illustrating, of a production process of the light-emitting device illustrated in FIG. 1, steps of mounting a light-emitting element in a corresponding cavity 12.

(a) of FIG. 2 through (d) of FIG. 2 schematically illustrate a process in which light-emitting elements 13 are mounted in respective cavities 12 and which is included in a process for producing the light-emitting device 1a illustrated in FIG. 1.

The light-emitting device 1a is produced by use of a multiple cavity circuit board 10 (substrate) in which the cavities 12 are provided in large numbers vertically and horizontally in a matrix. Use of the multiple cavity circuit board 10 makes it possible to simultaneously produce light-emitting devices 1a in large numbers. For example, the multiple cavity circuit board 10 has a thickness of 1.0 mm, and the cavities 12 have a depth of 0.6 mm.

First, according to the light-emitting device production method in accordance with the present embodiment, the mounting wiring pattern 14 and the connection wiring pattern 16 are provided side by side at the bottom of each of the cavities 12 (see (a) of FIG. 2).

Next, the electroconductive adhesive 15 is applied to the mounting wiring pattern 14 provided at the bottom of each of the cavities 12 of the multiple cavity circuit board 10 (see (b) of FIG. 2).

Subsequently, the light-emitting element 13 is die-bonded to the electroconductive adhesive 15 applied to the mounting wiring pattern 14 (see (c) of FIG. 2). The upper surface of the light-emitting element 13 and the connection wiring pattern 16 provided at the bottom of each of the cavities 12 are wire-bonded via the electroconductive wire 17 made of, for example, a gold wire (see (d) of FIG. 2).

After the light-emitting element 13 is thus mounted in each of the cavities 12 of the multiple cavity circuit board 10 by die bonding and wire bonding, the cavities 12 are sealed with a fluorescent material-containing sealing resin 20.

Figure 3:
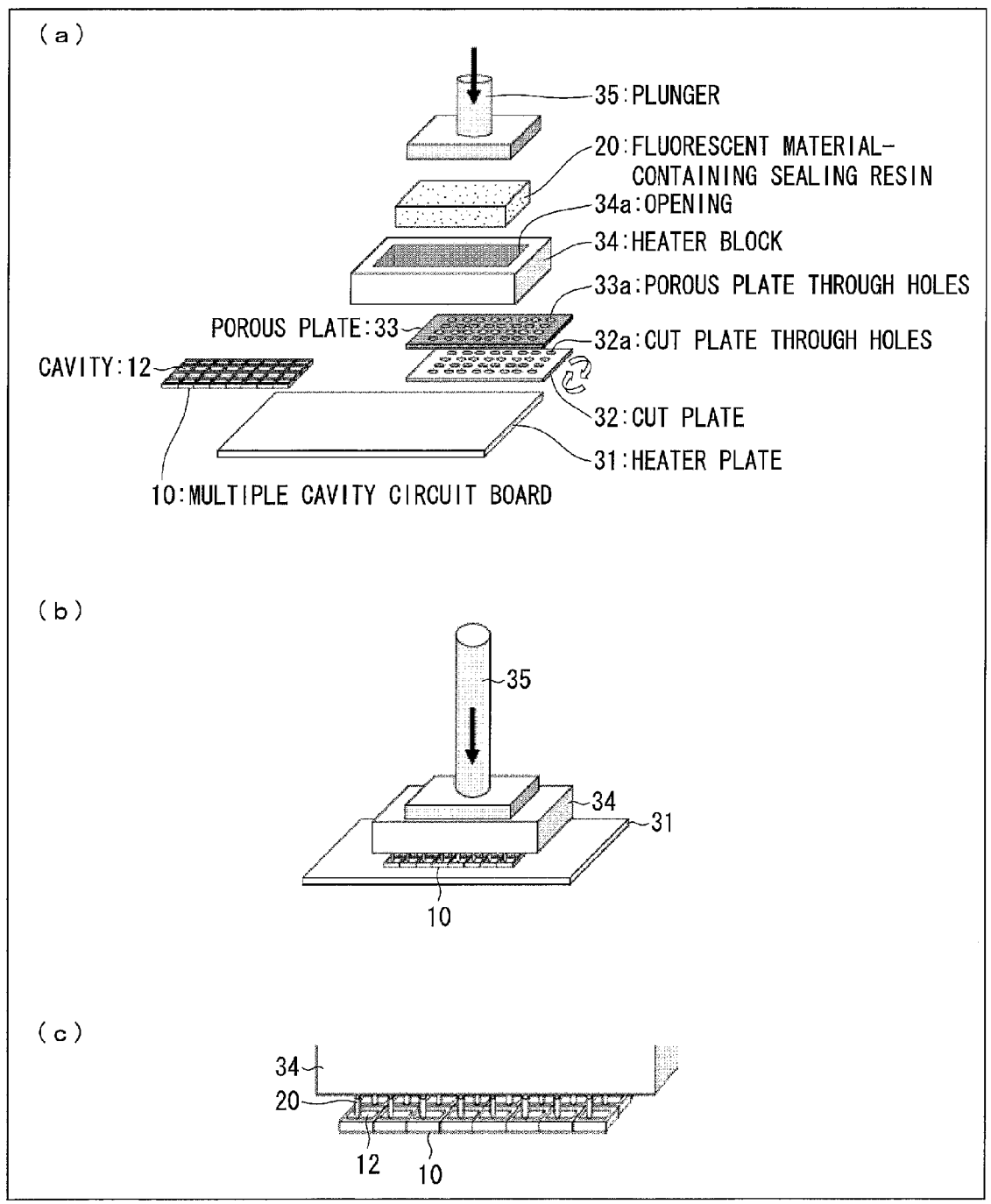
FIG. 3 is a set of views (a) through (c) schematically illustrating a step of filling cavities with a fluorescent material-containing sealing resin.
Figure 4:
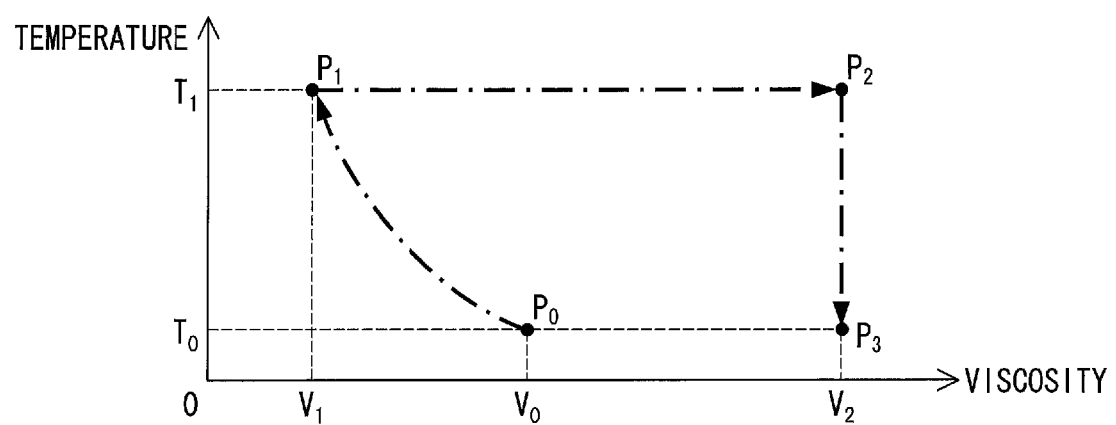
FIG. 4 is a graph schematically illustrating a viscosity characteristic of silicone resins contained in a fluorescent material-containing sealing resin illustrated in (a) of FIG. 3.
Figure 5:
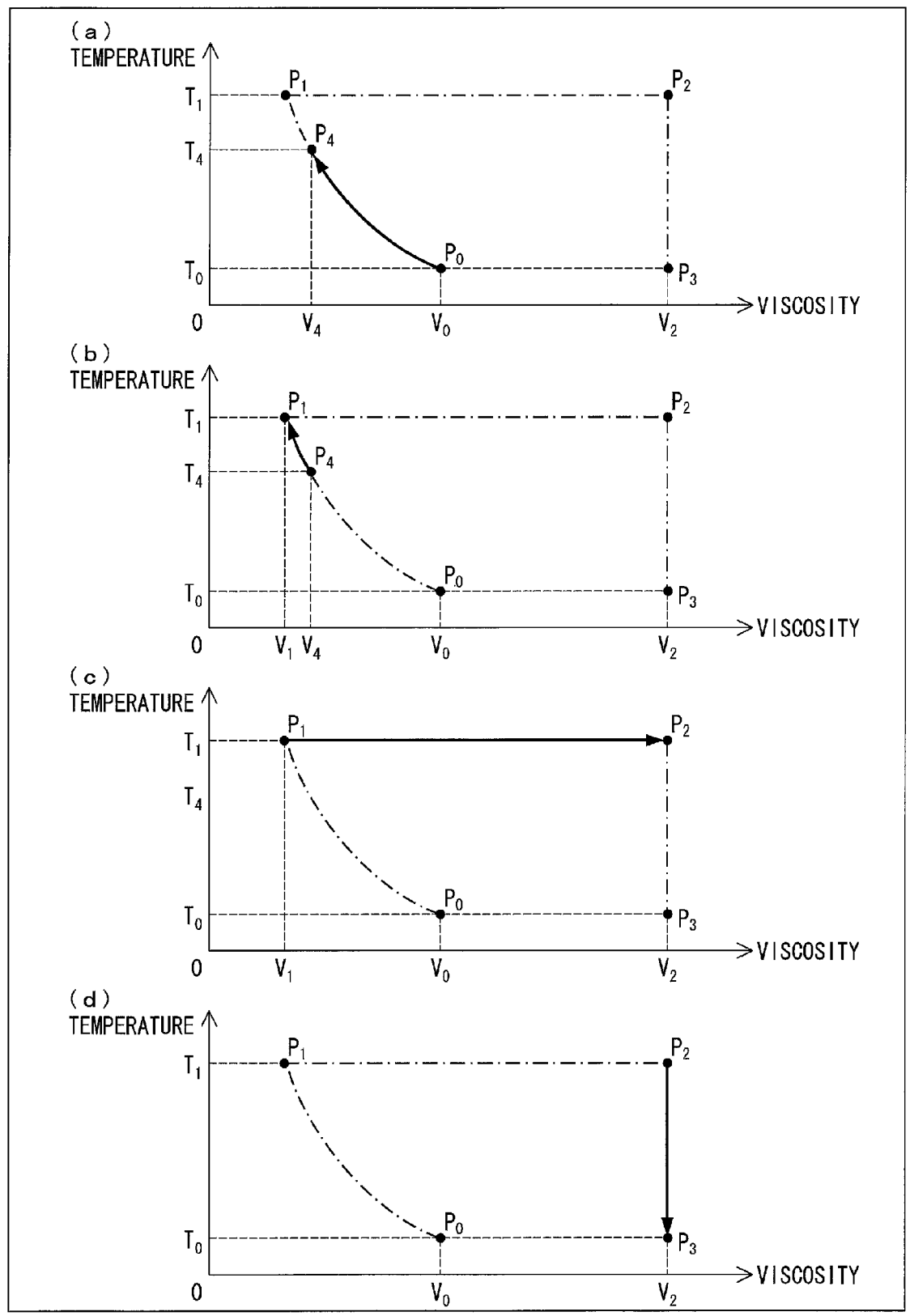
FIG. 5 is a set of graphs (a) through (d) schematically illustrating a change in viscosity of silicone resins during a series of steps from the step of filling the cavities with the fluorescent material-containing sealing resin to the step of curing the fluorescent material-containing sealing resin.

(a) through (c) of FIG. 3 are a set of views schematically illustrating steps of filling the cavity 12 with the fluorescent material-containing sealing resin 20. FIG. 4 is a graph schematically illustrating a viscosity characteristic of silicone resins contained in the fluorescent material-containing sealing resin 20 illustrated in (a) of FIG. 3. (a) through (d) of FIG. 5 are a set of graphs schematically illustrating a change in viscosity of the silicone resins during a series of steps from the step of filling the cavity 12 with the fluorescent material-containing sealing resin 20 to the step of curing the fluorescent material-containing sealing resin 20.

As illustrated in (a) of FIG. 3, the multiple cavity circuit board 10, on which the light-emitting elements 13 are mounted, is provided on a heater plate 31. Then, a cut plate 32, a porous plate 33, and a heater block 34 are stacked in this order above the multiple cavity circuit board 10 (placing step). Then, the fluorescent material-containing sealing resin 20 in the form of a block is situated (i) on the porous plate 33 and (ii) inside an opening 34a of the heater block 34 (situating step).

The fluorescent material-containing sealing resin 20 is obtained by evenly dispersing fluorescent materials in silicone resins. The silicone resins are subjected to primary crosslinking by applying, to the silicone resins for a period of time, a predetermined temperature which is lower than a secondary crosslinking temperature described later, so that the silicone resins (i) are maintained in a non-liquid state and (ii) has viscosity with which (a) even particles (such as fluorescent materials) larger in specific gravity than the silicone resins are not completely precipitated when contained in the silicone resins and (b) the silicone resins can be processed (100 Pa·S or more and 1E+5 Pa·S or less). Note that "primary crosslinking" refers to a state in which (i) the silicone resins have a crosslinking point, (ii) curing of the silicone resins can be further proceeded under predetermined curing conditions (application of a predetermined temperature for a period of time), and (iii) the silicone resins are not in a liquid state at room temperature.

As illustrated in FIG. 4, the silicone resins have a viscosity $V_0$ (see $P_0$ of FIG. 4) at room temperature $T_0$ (approximately 25° C.). The viscosity $V_0$ is a viscosity with which a form of the fluorescent material-containing sealing resin 20 can be maintained at the room temperature $T_0$.

In a case where the silicone resins are heated from the room temperature $T_0$ to a temperature in a vicinity of a secondary cross-linking temperature $T_1$ (approximately 125° C.) which is a temperature at which the silicone resins form secondary crosslinking, the viscosity of the silicone resins decreases, so that the silicone resins have a viscosity of $V_1$ immediately before a temperature of the silicone resins reaches a secondary cross-linking temperature $T_1$ (see $P_1$ of FIG. 4). The viscosity $V_1$ refers to a viscosity at which the silicone resins are melted to be flowable.

The change in viscosity of the silicone resins in a temperature region between the room temperature $T_0$ and a temperature lower than the secondary cross-linking temperature $T_1$ is a heat-reversible change. Accordingly, in a case where the temperature of the silicone resins is decreased from the temperature in the vicinity of the secondary cross-linking temperature $T_1$ to the room temperature $T_0$, the viscosity of the silicone resins increases, and returns to the original viscosity $V_0$ at the room temperature $T_0$. Therefore, it is possible to repeatedly adjust the viscosity of the silicone resins between the viscosity $V_0$ and the viscosity $V_1$ by changing the temperature of the silicone resins in the temperature region between the room temperature $T_0$ and the temperature lower than the secondary cross-linking temperature $T_1$.

On the other hand, in a case where the silicone resins are heated to the secondary crosslinking temperature $T_1$ or more, the silicone resins are subjected to secondary crosslinking and are consequently cured. Note that viscosity of the cured silicone resins cannot be numerically expressed. However, in a case where the viscosity of the cured silicone resins is conceptually defined as viscosity $V_2$, viscosity of the silicone resins increases from viscosity $V_1$ to the viscosity $V_2$ (see $P_2$ of FIG. 4). That is, the viscosity $V_2$ is conceptually defined viscosity of the silicone resins being subjected to secondary crosslinking at a secondary crosslinking temperature $T_1$.

In a case where the temperature of the silicone resins having been subjected to the secondary crosslinking is increased or decreased from the secondary crosslinking temperature $T_1$, properties such as viscosity and elasticity at the secondary crosslinking temperature $T_1$ change (polymeric property). Note, however, that viscosity and elastic modulus become higher overall in comparison with those of the silicone resins before being subjected to the secondary crosslinking. (For convenience, however, it is assumed that the viscosity $V_2$ is maintained at $P_3$ of FIG. 4).

Note that "secondary crosslinking" refers to, although not limited to, (i) further proceeding of curing due to a crosslinking reaction or the like by use of a catalyst which is different from that used during synthesis and (ii) a state in which a change in viscosity does not become reversed as described above due to the change in temperature.

Varying fluorescent materials depending on a necessary optical characteristic are kneaded with the fluorescent material-containing sealing resin 20 so that fluorescent material concentration (content) is adjusted. In a case where silicone resins are used, it is possible to repeatedly adjust viscosity of the silicone resins before secondary crosslinking. This makes it possible as described later to form a fluorescent material-containing sealing resin 20 in which fluorescent materials are evenly dispersed.

A method of producing a block-like fluorescent material-containing sealing resin 20 will be described later.

The heater block 34 is equipped with a temperature regulating function covering a temperature range from the room temperature $T_0$ to the temperature lower than the secondary crosslinking temperature $T_1$ at which the fluorescent material-containing sealing resin 20 can be melted by heat. The heater block 34 is a frame-like member having the opening 34a that is a through hole. The fluorescent material-containing sealing resin 20 is provided inside the opening 34a.

The porous plate 33 is provided with a plurality of porous plate through holes (through holes) 33a. The porous plate through holes 33a are provided so as to correspond to respective cavities 12. As described later, a pressure from a plunger 35 causes the fluorescent material-containing sealing resin 20 to be extruded through the porous plate through holes 33a out to the cavities 12.

The cut plate 32 is intended to cut, to a predetermined length, each of pieces of the fluorescent material-containing sealing resin 20 extruded through the porous plate through holes 33a. The cut plate 32 is provided with cut plate through holes 32a corresponding to the respective porous plate through holes 33a. When the cut plate 32 eccentrically moves in a direction indicated by an arrow illustrated in FIG. 3, blades 32b (see FIG. 7) provided on the respective cut plate through holes 32a cut the respective pieces of the fluorescent material-containing sealing resin 20 each to the predetermined length.

The heater plate 31 is intended to heat the multiple cavity circuit board 10 situated as describe above. The heater plate 31 heats the multiple cavity circuit board 10 at, for example, the secondary crosslinking temperature $T_1$ or less.

After such members are placed as describe above, the fluorescent material-containing sealing resin 20 situated on the porous plate 33 by the heater block 34 is melted by heat so that the viscosity of the fluorescent material-containing sealing resin 20 is lowered. In so doing, since the fluorescent material-containing sealing resin 20 is heated up from the room temperature $T_0$ to a temperature $T_4$ (e.g. 80° C. or higher and lower than 120° C.) close to the secondary crosslinking temperature $T_1$ (see (a) of FIG. 5), the viscosity of the silicone resins is reduced, while restricting precipitation of the fluorescent materials, to a viscosity $V_4$ with which the silicone resins are flowable (see $P_4$ of (a) of FIG. 5).

Next, the plunger 35 is used to pressurize, against the multiple cavity circuit board 10, the fluorescent material-containing sealing resin 20 which is situated on the porous plate 33 (see (b) of FIG. 3). This, as illustrated in (c) of FIG. 3, causes the fluorescent material-containing sealing resin 20 to be extruded in the form of strings through the porous plate through holes 33a out toward the cavities 12 (extruding step).

Figure 6:
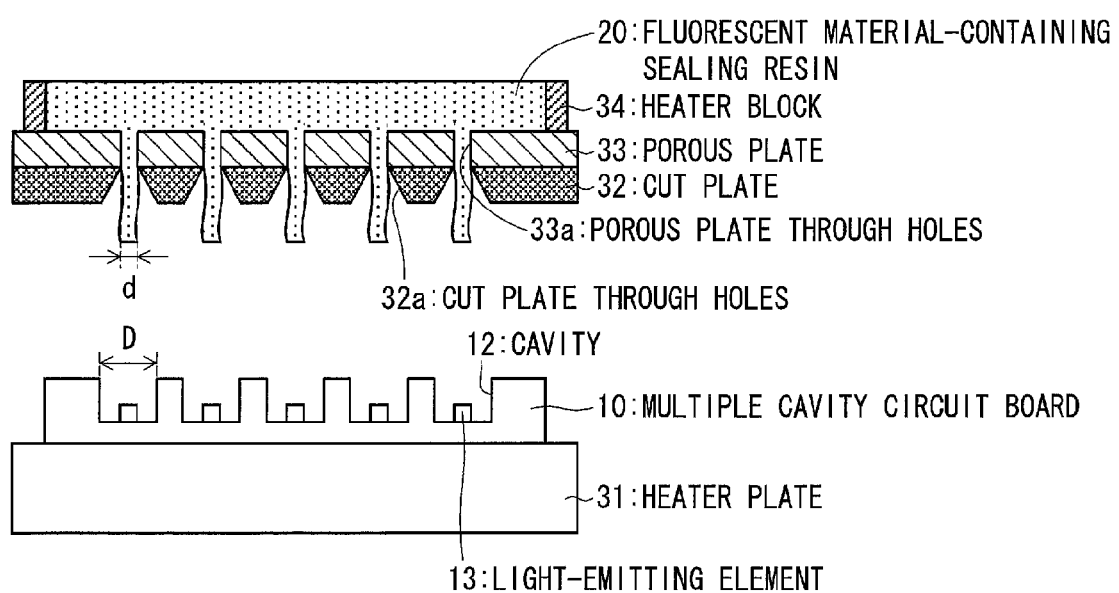
FIG. 6 is a cross-sectional view illustrating an extruding step illustrated in (c) of FIG. 3.

FIG. 6 is a cross-sectional view illustrating the extruding step in (c) of FIG. 3. As illustrated in FIG. 6, the pressure from the plunger 35 causes the fluorescent material-containing sealing resin 20 to be extruded in the form of strings through the porous plate through holes 33a of the porous plate 33. Then, when a length of each string of the fluorescent material-containing sealing resin 20 extruded through the porous plate through holes 33a reaches a predetermined length, said each string is cut to the predetermined length by eccentrically rotating the cut plate 32. This allows the cavities 12 to be simultaneously filled with respective fluorescent material-containing sealing resins 20 which are cut to the predetermined length and are identical in fluorescent material content (filling step).

Note that the cavities 12 can be easily filled with the respective fluorescent material-containing sealing resins 20 by causing a dimension d of each of the porous plate through holes 33a to be smaller than a dimension D of an opening of each of the cavities 12. Note also that since the length of each string of the fluorescent material-containing sealing resin 20 is adjusted, it is possible to easily fill the cavities 12 with respective fluorescent material-containing sealing resins 20 whose amounts are suitable for volumes of the cavities 12.

FIG. 7 is a cross-sectional view illustrating the cut plate 32 of FIG. 6. As illustrated in FIG. 7, an edge part on a porous-plate-33 side of each of the cut plate through holes 32a of the cut plate 32 is configured to be a blade 32b. This allows the fluorescent material-containing sealing resins 20 extruded in the form of strings to be cut with the blades 32b by eccentrically rotating the cut plate 32. In so doing, the heater plate 31 heats the multiple cavity circuit board 10 to soften the fluorescent material-containing sealing resins 20 so that the fluorescent material-containing sealing resins 20 provided in the respective cavities 12 are in close contact with inner walls of the respective cavities 12. A temperature of the multiple cavity circuit board 10 in the filling step does not need to reach the secondary crosslinking temperature $T_1$, but only needs to be a temperature for softening the fluorescent material-containing sealing resins 20 enough to be easily in close contact with the inner parts of the respective cavities 12.

After the cavities 12 are filled with the respective fluorescent material-containing sealing resins 20, the heater plate 31 is used to heat the fluorescent material-containing sealing resins 20 at the secondary crosslinking temperature $T_1$ (e.g. 125° C.) as illustrated in (b) of FIG. 5 (see $P_1$ of (b) of FIG. 5). This subjects the silicone resins to secondary crosslinking so as to be cured as illustrated in (c) of FIG. 5 (curing step: see $P_2$ of (c) of FIG. 5). In so doing, the fluorescent material-containing sealing resins 20, with which the respective cavities 12 are filled, start being cured from their parts corresponding to the bottoms of the respective cavities 12 because of the heater plate 31. Therefore, stress, which occurs due to cure shrinkage of each of the fluorescent material-containing sealing resins 20, can be distributed toward an upper part of the fluorescent material-containing sealing resin 20, that is, toward an opening side of the corresponding cavity 12. This restricts the occurrence of crack or the like, and therefore increases reliability of the light-emitting device 1a.

Then, the silicone resins are completely cured by heating, with the use of an oven or the like, the multiple cavity circuit board 10 at the secondary crosslinking temperature $T_1$ or higher (e.g. 125° C. or higher and 170° C. or lower). Then, the multiple cavity circuit board 10 is taken out from the oven or the like so that the temperature of the multiple cavity circuit board 10 is lowered to the room temperature $T_0$. In so doing, as illustrated in (d) of FIG. 5, the viscosity of the silicone resins having been subjected to the secondary crosslinking is $V_2$ even in a case where the temperature is lowered to the room temperature $T_0$ (see $P_3$ of (d) of FIG. 5).

FIG. 8 is a view schematically illustrating a step of dividing the multiple cavity circuit board 10. As illustrated in FIG. 8, after the light-emitting elements 13 mounted in the respective cavities 12 are sealed by the respective fluorescent material-containing sealing resins 20 having been subjected to secondary crosslinking, the multiple cavity circuit board 10 is divided into pieces corresponding to the respective cavities 12. This allows a plurality of light-emitting devices 1a, which are uniform in fluorescent material content, to be simultaneously produced.

A chromaticity distribution range of the light-emitting devices 1a thus produced can satisfy the chromaticity management standard of a 2-step MacAdam ellipse. The MacAdam ellipse refers to a standard deviation, shown in an xy chromaticity diagram, of how recognizability of colors from a particular color at a center part of the ellipse changes. The light-emitting devices 1a thus produced achieve a level at which a human eye cannot recognize variance in chromaticity.

With the light-emitting device production method of Embodiment 1, it is thus possible to cause variance in chromaticity (chromaticity distribution range) to be relatively small by equalizing fluorescent material contents of the light-emitting devices 1a.

Note that in the extruding step, the fluorescent material-containing sealing resins 20 are heated by the heater block 34. This causes, while restricting the precipitation of the fluorescent materials, the viscosity of the silicone resins to be lowered to the viscosity $V_4$ with which the silicone resins are flowable. However, it is possible, by increasing extruding force, to extrude the fluorescent material-containing sealing resins 20 at the room temperature $T_0$ without increasing the temperature of the heater block 34. Therefore, the heater block 34 can be kept at the room temperature $T_0$.

<Method of Producing Block-like Fluorescent Material-Containing Sealing Resin 20>

A method of producing a block-like fluorescent material-containing sealing resin 20 for use in the light-emitting device production method of Embodiment 1 will be described next with reference to FIGS. 9 and 10.

Figure 9:
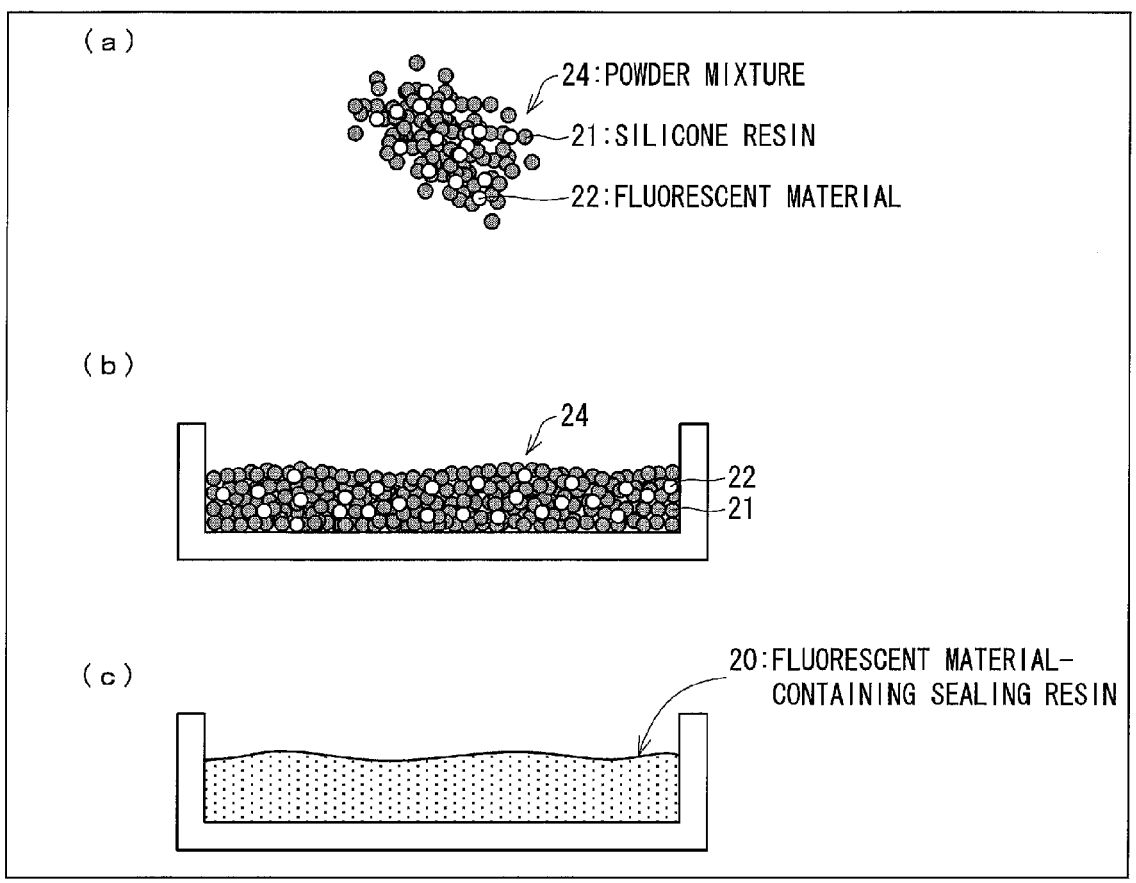
FIG. 9 is a set of views (a) through (c) schematically illustrating a block-like fluorescent material-containing sealing resin production method.

(a) through (c) of FIG. 9 are a set of views schematically illustrating the method of producing a block-like fluorescent material-containing sealing resin 20. (a) and (b) of FIG. 10 are a set of graphs for describing a change in viscosity of silicone resins in the steps illustrated in (a) through (c) of FIG. 9.

First, as illustrated in (a) of FIG. 9, a powder of silicone resins 21 having been subjected to primary crosslinking and a powder of fluorescent materials 22 are sufficiently dry-mixed until the powders are evenly mixed, so that a powder mixture 24 is obtained.

Next, as illustrated in (b) of FIG. 9, the powder mixture 24 is contained in a container. Then, as illustrated in (a) of FIG. 10, the powder mixture 24 is heated from a room temperature $T_0$ to a temperature $T_5$ (e.g. 40° C. or higher and lower than 60° C.), so that the silicone resins 21 are melted. Then, while precipitation of the fluorescent materials 22 is restricted, viscosity of the silicone resins 21 is lowered to a viscosity $V_5$ with which the silicone resins 21 can be kneaded with the fluorescent materials 22 (see $P_5$ of (a) of FIG. 10). Then, the silicone resins 21 are kneaded with the fluorescent materials 22.

In so doing, the silicone resins 21, which are melted by heat, are blended therewith, and mixed and kneaded with the fluorescent materials 22. As described above, the silicone resins 21 and fluorescent materials 22 are kneaded while (i) the precipitation of the fluorescent materials 22 is restricted and (ii) the viscosity of the silicone resins 21 is lowered to the viscosity $V_5$ with which the silicone resins 21 can be kneaded. This allows the fluorescent materials 22 in the silicone resins 21 to remain dispersed.

Figure 10:
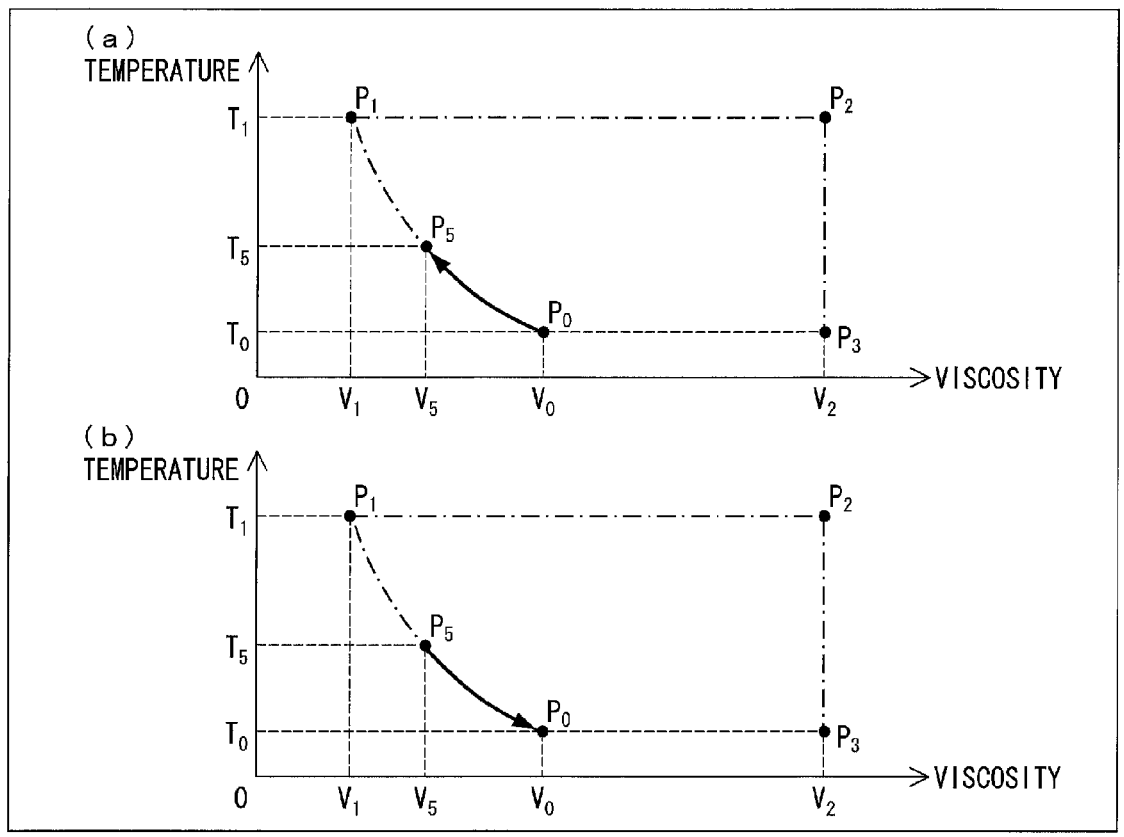
FIG. 10 is a set of graphs (a) and (b) for describing a change in viscosity of silicone resins during the steps illustrated in (a) through (c) of FIG. 9.

Then, as illustrated in (b) of FIG. 10, the temperature of the powder mixture 24 is lowered from the temperature $T_5$ to the room temperature $T_0$. This allows a block-like fluorescent material-containing sealing resin 20, in which the fluorescent materials 22 are evenly dispersed in the silicone resins 21, to be produced.

According to Embodiment 1, a single kind of fluorescent materials 22 are contained in the fluorescent material-containing sealing resin 20. Alternatively, it is also possible to use two or more kinds of fluorescent materials 22 differing in (i) color of light to emit, (ii) particle size, (iii) specific gravity, or (iv) the like. For example, it is possible to produce a fluorescent material-containing sealing resin 20 containing red-color light emitting fluorescent materials and green-color light emitting fluorescent materials in combination, and to apply the fluorescent material-containing sealing resin 20 to a blue-color LED chip (light-emitting element 13). Alternatively, it is possible to produce a fluorescent material-containing sealing resin 20 containing blue-color light emitting fluorescent materials and yellow-color light emitting fluorescent materials in combination, and to apply the fluorescent material-containing sealing resin 20 to a bluish-purple-color LED chip.

Even in such a case, a powder mixture 24 is obtained by dry-mixing (i) a powder of silicone resins 21 which have been subjected to primary crosslinking and (ii) two or more kinds of powders of fluorescent materials 22, until the powders are evenly mixed.

Then, the silicone resins 21 are melted by heat at a temperature lower than the secondary crosslinking temperature $T_1$, and the silicone resins 21 and the two or more kinds of fluorescent materials 22 are kneaded together while (i) the precipitation of the two or more kinds of fluorescent materials 22 is restricted and (ii) the viscosity of the silicone resins 21 is lowered to a viscosity with which the silicone resins 21 can be kneaded.

In so doing, the silicone resins 21, which are melted by heat, are blended therewith, and mixed and kneaded with the fluorescent materials 22. As described above, the silicone resins 21 and fluorescent materials 22 are kneaded while (i) the precipitation of the two or more kinds of fluorescent materials 22 is restricted and (ii) the viscosity of the silicone resins 21 is lowered to the viscosity with which the silicone resins 21 can be kneaded. This allows the two or more kinds of fluorescent materials 22 in the silicone resins 21 to remain dispersed.

Then, the temperature of the powder mixture 24 is lowered to the room temperature $T_0$. This allows a block-like fluorescent material-containing sealing resin 20, in which the two or more kinds of fluorescent materials 22 are evenly dispersed in the silicone resins 21, to be produced.

According to Embodiment 1, the fluorescent materials 22 are used as a wavelength conversion material. Alternatively, other wavelength conversion materials can be used. A wavelength conversion material refers to a material having a function to (i) convert a wavelength of light which has been emitted from the light-emitting element 13 and (ii) emit light which has a converted wavelength.

According to Embodiment 1, a multiple cavity circuit board 10, on which a large number of cavities 12 are provided, is used. Alternatively, it is possible to use, instead of the multiple cavity circuit board 10, a plane circuit board having a flat surface.

Summary of Embodiment 1

As has been described, the light-emitting device 1a production method in accordance with Embodiment 1 includes: a placing step of placing, above a multiple cavity circuit board 10 on which light-emitting elements 13 are mounted in respective cavities 12 facing upwards, a porous plate 33 having porous plate through holes 33a corresponding to the respective cavities 12, the placing being carried out so that the porous plate 33 is placed substantially parallel to the multiple cavity circuit board 10; a situating step of situating, on the porous plate 33, a fluorescent material-containing sealing resin 20 in which a powder of fluorescent materials is kneaded with silicone resins that have been semi-cured by primary crosslinking; an extruding step of extruding the fluorescent material-containing sealing resin 20 in a form of strings via the respective porous plate through holes 33a toward the multiple cavity circuit board 10 while melting the fluorescent material-containing sealing resin 20 by heat at (i) room temperature $T_0$ or (ii) a temperature lower than a secondary crosslinking temperature $T_1$ at which the silicone resins form secondary crosslinking; a filling step of filling the cavities 12 with the respective strings of fluorescent material-containing sealing resin 20 by cutting, to a predetermined length, each of the strings of fluorescent material-containing sealing resin 20 thus extruded; and a curing step of curing the fluorescent material-containing sealing resin 20 with which the cavities 12 are filled, the curing being carried out by heating the fluorescent material-containing sealing resin 20 at the secondary crosslinking temperature $T_1$ or higher, the silicone resins being configured to (i) reversibly change in viscosity in a temperature region between the room temperature $T_0$ and the temperature lower than the secondary crosslinking temperature $T_1$ and (ii) be completely cured in a temperature region encompassing the secondary crosslinking temperature $T_1$ or higher.

According to the light-emitting device 1a production method according to Embodiment 1, silicone resins having the characteristics described above are used. This makes it possible to repeatedly adjust the viscosity of the silicone resins by changing a temperature of the silicone resins in a region between a room temperature $T_0$ and a temperature lower than a secondary crosslinking temperature $T_1$.

Therefore, when the melted silicone resins 21 and the powder of fluorescent materials 22 are kneaded together, the precipitation of the fluorescent materials 22, which are kneaded with the silicone resins 21, can be restricted by adjusting the viscosity of the silicone resins 21 to a viscosity with which a dispersed state of the fluorescent materials 22 can be maintained. This allows a fluorescent material-containing sealing resin 20, in which the fluorescent materials 22 are evenly dispersed in the silicone resins 21, to be obtained.

Then, it is possible to simultaneously fill (potting) each of the cavities 12 with an identical amount of fluorescent material-containing sealing resin 20 by (i) extruding, in the form of strings, the fluorescent material-containing sealing resin 20 from the porous plate through holes 33a toward the multiple cavity circuit board 10 while melting the fluorescent material-containing sealing resin 20 by heat at a temperature lower than a secondary crosslinking temperature $T_1$ and (ii) cutting each of the strings of fluorescent material-containing sealing resins 20 into a predetermined length. Note that the predetermined length of fluorescent material-containing sealing resins 20, with which the cavities 12 are filled, have uniform fluorescent material content. Therefore, in a case where the fluorescent material-containing sealing resins 20 are heated at a secondary crosslinking temperature or higher so that silicone resins are completely cured, it is possible to seal the light-emitting elements 13 with the respective fluorescent material-containing sealing resins 20 having the uniform fluorescent material content.

Therefore, according to Embodiment 1, it is possible to equalize fluorescent material contents of light-emitting devices 1a, and therefore to realize a light-emitting device production method capable of reducing variance in chromaticity.

Furthermore, according to the light-emitting device 1a production method of Embodiment 1, the porous plate through holes 33a is formed on the porous plate 33 in accordance with the number, dimensions, and the like of the cavities 12 provided on the multiple cavity circuit board 10. This makes it easy to handle production of various light-emitting devices 1a, and therefore allows a reduction in production costs of the light-emitting devices 1a.

MODIFICATIONS (Modification 1)

Figure 11:
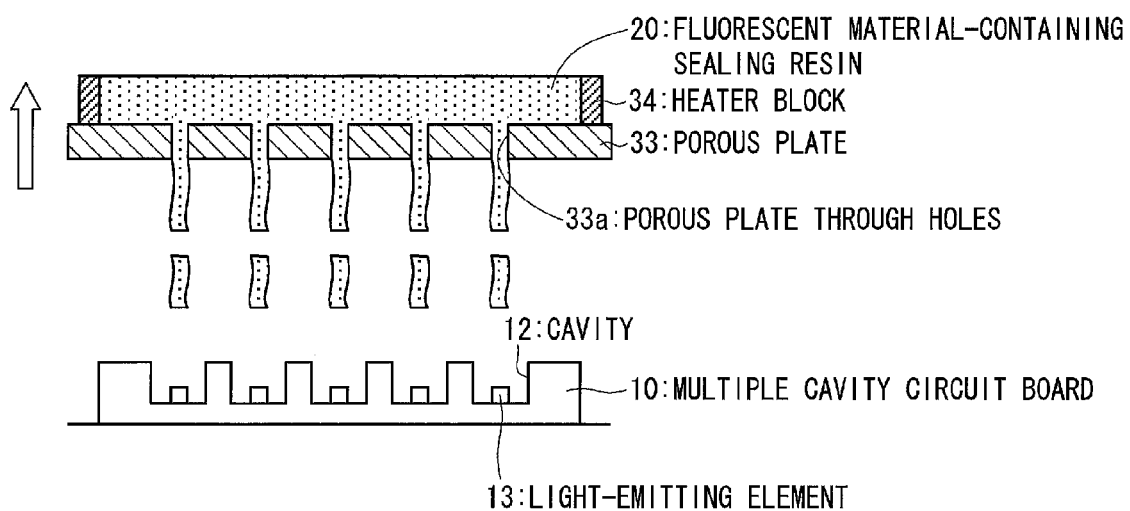
FIG. 11 is a cross-sectional view illustrating a modification of a filling step.

FIG. 11 is a cross-sectional view illustrating a modification of the filling step. As illustrated in FIG. 11, fluorescent material-containing sealing resins 20, which are extruded in the form of strings from porous plate through holes 33a, can be cut by moving a porous plate 33 away from a multiple cavity circuit board 10 in a direction perpendicular to the multiple cavity circuit board 10.

In such a case, the multiple cavity circuit board 10 is preferably pre-heated. This allows lower end parts of the fluorescent material-containing sealing resins 20, which have been extruded in the form of strings and have reached the multiple cavity circuit board 10, to be attached to corresponding bottom parts of the respective cavities 12 by the heat. Therefore, in a case where the porous plate 33 is lifted with a timing with which the lower end parts of the fluorescent material-containing sealing resins 20 in the form of strings reach the respective cavities 12, it is possible to fill the cavities 12 with the respective fluorescent material-containing sealing resins 20 by cutting the fluorescent material-containing sealing resins 20 having the form of strings. Alternatively, it is possible to cut the fluorescent material-containing sealing resins 20 by lowering the multiple cavity circuit board 10 instead of lifting the porous plate 33.

With such a cutting method, it is possible to cut the fluorescent material-containing sealing resins 20 without using (i) a cut plate 32 and (ii) a drive device or the like for causing an eccentric rotation of the cut plate 32.

Alternatively, it is also possible to cut the fluorescent material-containing sealing resins 20 by injecting compressed air between the porous plate 33 and the multiple cavity circuit board 10.

Even in such a case, (i) the multiple cavity circuit board 10 is pre-heated and (ii) the compressed air is injected between the porous plate 33 and the multiple cavity circuit board 10 with a timing with which the lower end parts of the fluorescent material-containing sealing resin 20, which have been extruded in the form of strings, reach the respective cavities 12. This makes it possible to fill the cavities 12 with the fluorescent material-containing sealing resin 20 by cutting the fluorescent material-containing sealing resins 20 having the form of strings.

(Modification 2)

FIG. 12 is a cross-sectional view illustrating a step of filling, by use of a dispenser 36, cavities 12 with a fluorescent material-containing sealing resin 20. As illustrated in FIG. 12, it is possible to fill the cavities 12 with the fluorescent material-containing sealing resin 20 by use of the dispenser 36 including a syringe 36a.

The dispenser 36 is designed to (i) re-process, into such a shape that can be contained in the syringe 36a, a fluorescent material-containing sealing resin 20 in which silicone resins semi-cured by primary crosslinking are kneaded with a powder of fluorescent materials and then (ii) discharge, in the form of strings toward a light-emitting element 13 mounted on a multiple cavity circuit board 10, the fluorescent material-containing sealing resin 20 contained in the syringe 36a.

The dispenser 36 includes the syringe (containing section) 36a for containing a fluorescent material-containing sealing resin 20. The dispenser 36 discharges a fluorescent material-containing sealing resin 20 contained in the syringe 36a by pressurizing the syringe 36a by air or a piston, so that a cavity 12 is filled with a fluorescent material-containing sealing resin 20 (discharging step). Note that in a case where the syringe 36a is pressurized by air or a piston, it is possible to discharge the fluorescent material-containing sealing resin 20 (i) while melting, by heat, the fluorescent material-containing sealing resin 20 at a temperature lower than a secondary crosslinking temperature for silicone resins or (ii) while keeping the fluorescent material-containing sealing resin 20 at a room temperature $T_0$.

In a case where the fluorescent material-containing sealing resin 20 is discharged while being melted by heat at the temperature lower than the secondary crosslinking temperature for the silicone resins, a temperature of the heating by the syringe 36a is to be controlled so that viscosity of the fluorescent material-containing sealing resin 20 contained in the syringe 36a does not cause precipitation of fluorescent materials. This makes it possible to restrict the precipitation of the fluorescent materials in the syringe 36a, which precipitation occurs, as is the case of the conventional technology, by a difference in specific gravity between the silicone resins and the fluorescent materials. It is therefore possible to keep the fluorescent materials substantially evenly dispersed.

Therefore, it is possible to fill each of the cavities 12 with a fluorescent material-containing sealing resin 20 while causing a fluorescent material concentration in the fluorescent material-containing sealing resin 20 to hardly change from the beginning to the end of the discharging step carried out by use of the dispenser 36. In addition, in a case where the fluorescent material-containing sealing resin 20 is discharged while being maintained at the room temperature $T_0$, a decrease in viscosity of the fluorescent material-containing sealing resin 20 does not occur. Therefore, as is the case of melting the fluorescent material-containing sealing resin 20 by heat, it is possible to fill each of the cavities 12 with a fluorescent material-containing sealing resin 20 while causing a fluorescent material concentration in the fluorescent material-containing sealing resin 20 to hardly change from the beginning to the end of the discharging step carried out by use of the dispenser 36.

Then, the fluorescent material-containing sealing resins 20, with which the respective cavities 12 are filled, are heated by a heater plate 31 and an oven or the like at the secondary crosslinking temperature or higher so that the silicone resins contained in the fluorescent material-containing sealing resins 20 are completely cured. This makes it possible to seal light-emitting elements 13 with the respective fluorescent material-containing sealing resins 20 having the uniform fluorescent material content.

Even in a case where the dispenser 36 is used, it is thus possible to equalize fluorescent material contents of light-emitting devices 1a, and therefore to realize a light-emitting device production method capable of reducing variance in chromaticity.

Alternatively, it is possible to discharge, by use of a dispenser 36, fluorescent material-containing sealing resins 20 toward a plurality of light-emitting elements 13 which are mounted on a flat-surface circuit board on which no cavity 12 is provided, such that a single light-emitting element 13 is sealed at a time or several light-emitting elements 13 are sealed at a time.

In such a case also, the fluorescent material-containing sealing resins 20 are heated by the heater plate 31 and an oven or the like at the secondary crosslinking temperature or higher while the fluorescent material-containing sealing resins 20 are in close contact with surfaces of the light-emitting elements 13 so that the silicone resins contained in the fluorescent material-containing sealing resins 20 are completely cured. This makes it possible to seal light-emitting elements 13 with the respective fluorescent material-containing sealing resins 20 having the uniform fluorescent material content.

Embodiment 2

Figure 13:
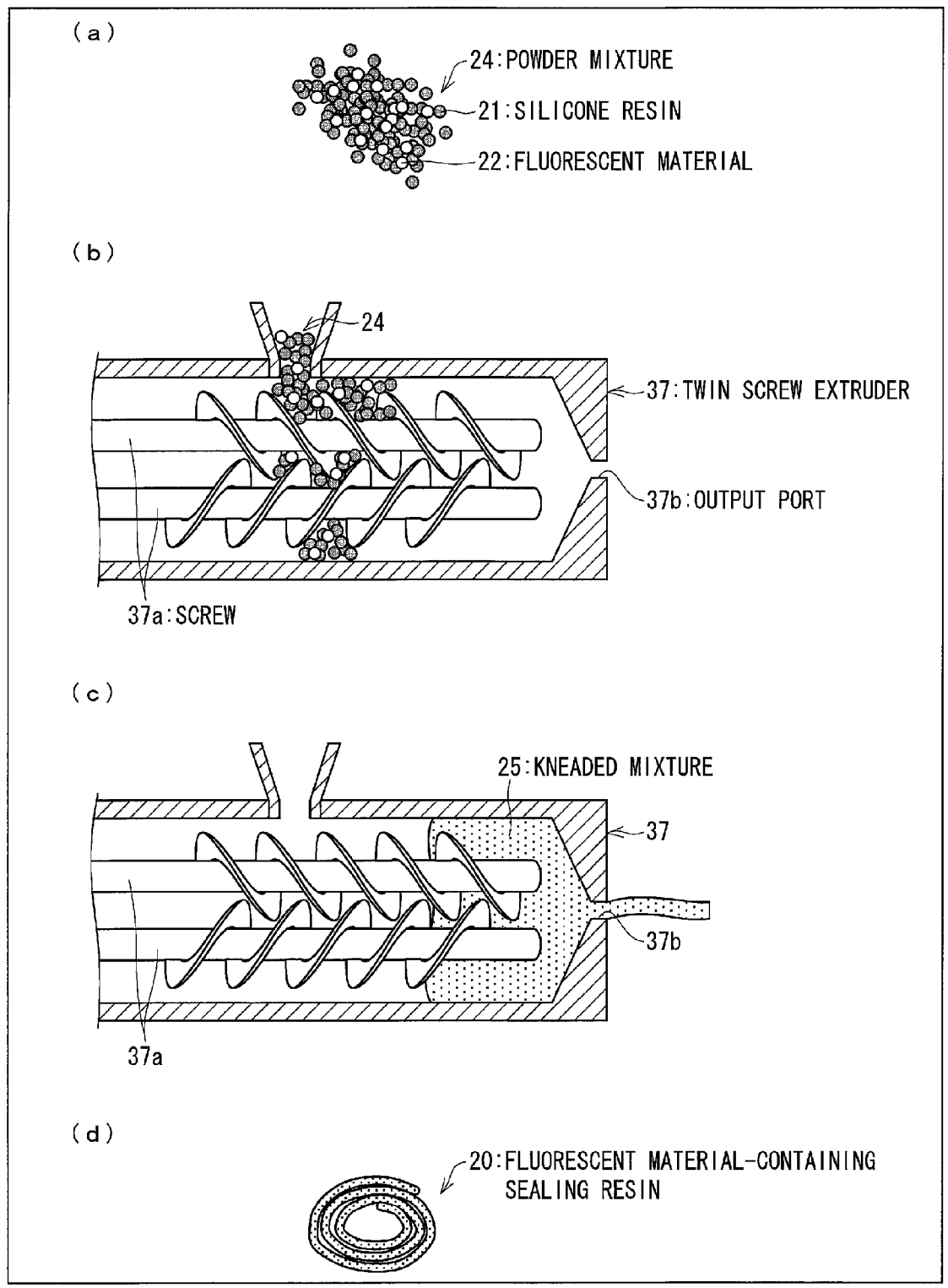
FIG. 13 is a set of views (a) through (d) schematically illustrating a cord-like fluorescent material-containing sealing resin production method of Embodiment 2.
Figure 14:
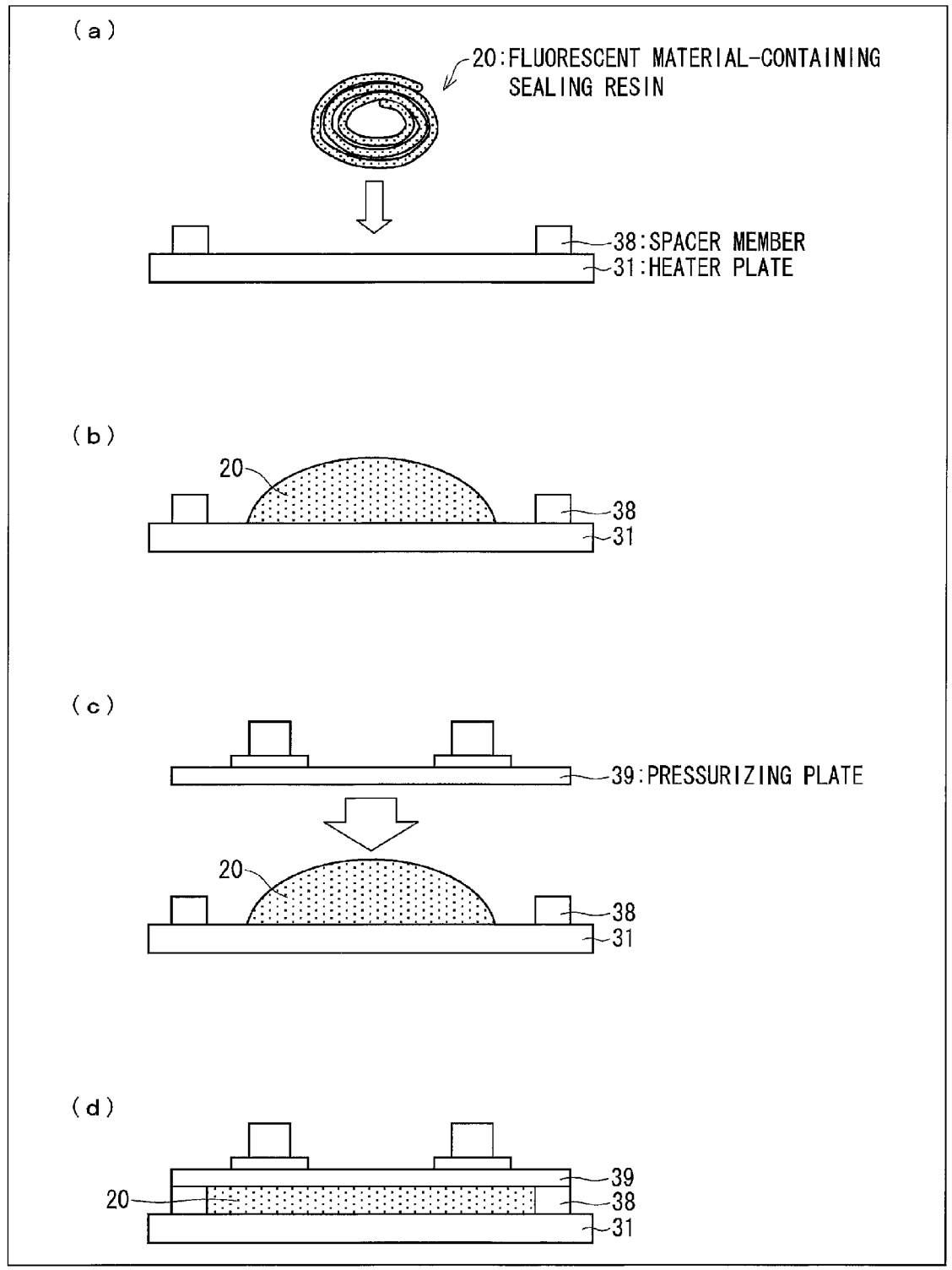
FIG. 14 is a set of views (a) through (d) schematically illustrating a method of processing a cord-like fluorescent material-containing sealing resin into the form of a sheet.
Figure 15:
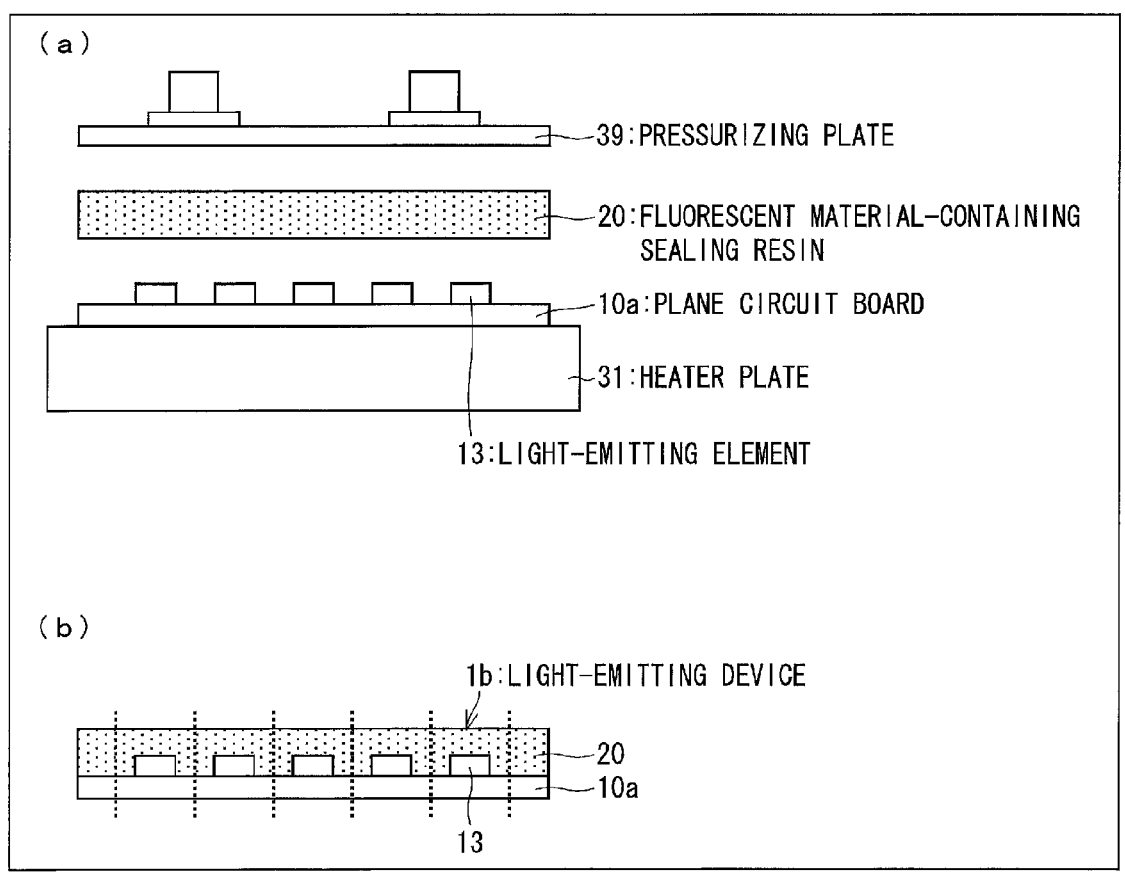
FIG. 15 is a set of cross-sectional views (a) and (b) illustrating a light-emitting device production method by use of a sheet-like fluorescent material-containing sealing resin.

The following description will discuss, with reference to FIGS. 13 through 15, a second embodiment of the light-emitting device production method in accordance with the present invention. For convenience, members similar in function to the members described in Embodiment 1 are given the same reference signs accordingly, and the descriptions of such members are omitted.

The light-emitting device production method of Embodiment 2 differs from that of Embodiment 1 in that (i) a fluorescent material-containing sealing resin 20 in the form of a cord is first produced and then (ii) a product obtained by processing the fluorescent material-containing sealing resin 20 in the form of a cord is used to seal light-emitting elements 13.

<Method of Producing Cord-Like Fluorescent Material-Containing Sealing Resin 20>

A method of producing a cord-like fluorescent material-containing sealing resin 20 will be described first with reference to FIG. 13.

(a) through (d) of FIG. 13 are a set of views schematically illustrating the method of producing the cord-like fluorescent material-containing sealing resin 20.

First, as illustrated in (a) of FIG. 13, a powder of silicone resins 21 having been subjected to primary crosslinking and a powder of fluorescent materials 22 are dry-mixed until the powders are evenly mixed, so that a powder mixture 24 is obtained (mixing step).

Next, as illustrated in (b) of FIG. 13, the powder mixture 24 is introduced into a twin screw extruder (kneading extruding device) 37, and is then kneaded while being melted by heat at a temperature lower than a secondary crosslinking temperature $T_1$ (kneading step).

The twin screw extruder 37 includes two screws 37a provided parallel to each other. By causing the two screws 37a to rotate in opposite directions, the powder mixture 24 is kneaded while silicone resins are melted by heat.

By the heating and the kneading, as illustrated in (c) of FIG. 13, the powder mixture 24 becomes a kneaded mixture 25 in which fluorescent materials are evenly dispersed in the melted silicone resins. By extruding the kneaded mixture 25 in the form of a cord from an output port (through hole) 37b of the twin screw extruder 37, it is possible to produce a cord-like fluorescent material-containing sealing resin 20 in which fluorescent materials are evenly dispersed in silicone resins (see (d) of FIG. 13).

The fluorescent material-containing sealing resin 20, in which fluorescent materials are evenly dispersed in silicone resins, is thus formed (molded) in the form of a cord. This allows a plurality of fluorescent material-containing sealing resins 20, which have equal fluorescent material contents, to be easily obtained by, for example, cutting the cord-like fluorescent material-containing sealing resin 20 into pieces of the same length. Hence, by sealing the light-emitting elements 13 with the fluorescent material-containing sealing resins 20, it is possible to equalize fluorescent material contents of light-emitting devices, and therefore to reduce variance in chromaticity.

Furthermore, by configuring the fluorescent material-containing sealing resin 20 to have the form of a cord, it is possible to increase melting efficiency of silicone resins during heating in comparison with, for example, the case of a bulk fluorescent material-containing sealing resin 20. Therefore, by melting the cord-like fluorescent material-containing sealing resin 20 by heat at the temperature lower than the secondary crosslinking temperature $T_1$ to prevent the precipitation of fluorescent materials, it is possible to easily process the cord-like fluorescent material-containing sealing resin 20 into a desired form while keeping the fluorescent materials evenly dispersed in the silicone resins.

In Embodiment 2, the twin screw extruder 37 including the two screws 37a is used. Alternatively, it is possible to use, instead of the twin screw extruder 37, a single screw extruder including a single screw 37a. Alternatively, it is possible to use, instead of the twin screw extruder 37, a multi-screw extruder including three or more screws 37a. This allows for an increase in kneading efficiency of the powder mixture 24 and for an increase in extruding efficiency of the kneaded mixture 25.

The output port 37b of the twin screw extruder 37 is not particularly limited in number, dimension, and shape, but can be changed as needed.

According to Embodiment 2, a single kind of fluorescent materials 22 are contained in the fluorescent material-containing sealing resin 20. Alternatively, it is also possible to use two or more kinds of fluorescent materials 22 differing in (i) color of light to emit, (ii) particle size, (iii) specific gravity, or (iv) the like. For example, it is possible to produce a fluorescent material-containing sealing resin 20 containing red-color light emitting fluorescent materials and green-color light emitting fluorescent materials in combination, and to apply the fluorescent material-containing sealing resin 20 to a blue-color LED chip (light-emitting element 13). Alternatively, it is possible to produce a fluorescent material-containing sealing resin 20 containing blue-color light emitting fluorescent materials and yellow-color light emitting fluorescent materials in combination, and to apply the fluorescent material-containing sealing resin 20 to a bluish-purple-color LED chip.

Even in such a case, a powder mixture 24 is obtained by dry-mixing (i) a powder of silicone resins 21 which have been subjected to primary crosslinking and (ii) two or more kinds of powders of fluorescent materials 22, until the powders are evenly mixed.

Then, the powder mixture 24 is introduced into the twin screw extruder (kneading extruding device) 37, and is then kneaded while being melted by heat at the temperature lower than the secondary crosslinking temperature $T_1$. The twin screw extruder 37 includes two screws 37a provided parallel to each other. By causing the two screws 37a to rotate in opposite directions, the powder mixture 24 is kneaded while silicone resins 21 are melted by heat.

The powder mixture 24 becomes a kneaded mixture 25 in which two or more kinds of fluorescent materials 22 are evenly dispersed in the melted silicone resins 21. By extruding the kneaded mixture 25 in the form of a cord from an output port 37b of the twin screw extruder 37, it is possible to produce a cord-like fluorescent material-containing sealing resin 20 in which two or more kinds of fluorescent materials 22 are evenly dispersed in silicone resins 21.

According to Embodiment 2, the fluorescent materials 22 are used as a wavelength conversion material. Alternatively, other wavelength conversion materials can be used. A wavelength conversion material refers to a material having a function to (i) convert a wavelength of light which has been emitted from the light-emitting element 13 and (ii) emit light which has a converted wavelength.

<Method of Forming Sheet-Like Fluorescent Material-Containing Sealing Resin 20>

A method of forming the cord-like fluorescent material-containing sealing resin 20 into the form of a sheet (processing step) will be described next with reference to FIG. 14.

(a) through (d) of FIG. 14 are a set of views schematically illustrating the method of processing a cord-like fluorescent material-containing sealing resin 20 into the form of a sheet. The following description will discuss a method of processing a cord-like fluorescent material-containing sealing resin 20 into the form of a sheet by use of a heat press.

First, as illustrated in (a) of FIG. 14, a cord-like fluorescent material-containing sealing resin 20 is placed on a heater plate 31. Then, as illustrated in (b) of FIG. 14, the cord-like fluorescent material-containing sealing resin 20 is melted by heat at a temperature lower than a secondary crosslinking temperature $T_1$, so that viscosity of silicone resins is lowered while preventing precipitation of fluorescent materials 22.

Then, as illustrated in (c) of FIG. 14, the fluorescent material-containing sealing resin 20 is pressurized by use of a pressurizing plate 39 which has been heated at the temperature lower than the secondary crosslinking temperature $T_1$. In so doing, a thickness of the fluorescent material-containing sealing resin 20 is adjusted by a spacer member 38 provided between the heater plate 31 and the pressurizing plate 39. Then, a temperature of the fluorescent material-containing sealing resin 20 is lowered to a room temperature $T_0$ so that a sheet-like fluorescent material-containing sealing resin 20, in which fluorescent materials are evenly dispersed, can be obtained (see (d) of FIG. 14).

<Light-Emitting Device 1b Production Method>

A light-emitting device (light-emitting device) 1b production method using a sheet-like fluorescent material-containing sealing resin 20 will be described next with reference to FIG. 15.

(a) and (b) of FIG. 15 are a set of cross-sectional views illustrating the light-emitting device 1b production method using a sheet-like fluorescent material-containing sealing resin 20. A light-emitting device 1b is produced by use of a plane circuit board 10a having a flat surface on which light-emitting elements 13 are vertically and horizontally mounted in a matrix. By using such a plane circuit board 10a, it is possible to simultaneously produce a large number of light-emitting devices 1b.

As illustrated in (a) of FIG. 15, the plane circuit board 10a, on which the light-emitting elements 13 are mounted, and the sheet-like fluorescent material-containing sealing resin 20 are stacked in this order on a heater plate 31. Then, the plane circuit board 10a is heated by the heater plate 31 so that the sheet-like fluorescent material-containing sealing resin 20 is melted by the heat at a temperature lower than a secondary crosslinking temperature $T_1$. Then, (i) viscosity of silicone resins is lowered while precipitation of fluorescent materials 22 contained in the fluorescent material-containing sealing resin 20 is prevented and (ii) the sheet-like fluorescent material-containing sealing resin 20 is pressurized against the plane circuit board 10a by use of a pressurizing plate 39 which has been heated at the temperature lower than the secondary crosslinking temperature $T_1$. This allows the sheet-like fluorescent material-containing sealing resin 20 to be in close contact with upper surfaces and side surfaces of the light-emitting elements 13.

In so doing, the sheet-like fluorescent material-containing sealing resin 20 is heated by use of the heater plate 31 at the secondary crosslinking temperature $T_1$. This subjects the silicone resins to secondary crosslinking, and therefore causes the silicone resins to be completely cured. In addition, the plane circuit board 10a is heated by use of an oven or the like at the secondary crosslinking temperature $T_1$ or higher, so that the silicone resins are completely cured. Then, the plane circuit board 10a is taken out of the oven or the like, and is cooled to a room temperature $T_0$.

As illustrated in (b) of FIG. 15, the plane circuit board 10a is divided into pieces corresponding to the respective light-emitting elements 13, so that it is possible to produce a plurality of light-emitting device 1b having uniform fluorescent material content.

The method of Embodiment 2 (sheet method) using a sheet-like fluorescent material-containing sealing resin 20 is applied to sealing of light-emitting elements 13 on a plurality of combined light-emitting devices before the division. On the other hand, the method of Embodiment 1 (plunger method), in which the fluorescent material-containing sealing resin 20 is extruded in the form of strings by use of the plunger 35, is applicable not only to sealing of light-emitting elements 13 on light-emitting devices before the division, but also to sealing of light-emitting elements 13 on respective light-emitting devices after the division.

Summary of Embodiment 2

As has been described, the cord-like fluorescent material-containing sealing resin 20 production method of Embodiment 2 includes: a mixing step of mixing (i) a powder of silicone resins 21 which have been semi-cured by primary crosslinking and (ii) a powder of fluorescent materials 22, so that a powder mixture 24 is obtained; and an extruding step of extruding the powder mixture 24 in a form of a cord from an output port 37b of a twin screw extruder 37, the silicone resins 21 being configured to (i) reversibly change in viscosity in a temperature region between a room temperature $T_0$ and a temperature lower than a secondary crosslinking temperature $T_1$ and (ii) be completely cured in a temperature region encompassing the secondary crosslinking temperature $T_1$ or higher.

According to the cord-like fluorescent material-containing sealing resin 20 production method of Embodiment 2, silicone resins having the characteristics described above are used. This makes it possible to repeatedly adjust the viscosity of the silicone resins by changing a temperature of the silicone resins in a region between a room temperature $T_0$ and a temperature lower than a secondary crosslinking temperature $T_1$.

Therefore, when powder mixture 24 is kneaded while being melted by heat with the use of the twin screw extruder 37, precipitation of the fluorescent materials 22 in the kneaded mixture 25 can be restricted by adjusting viscosity of the silicone resins 21 while a dispersed state of the kneaded fluorescent materials 22 is maintained. Therefore, by extruding the kneaded mixture 25 in the form of a cord from at least one through hole or output port 37b, it is possible to produce a cord-like fluorescent material-containing sealing resin 20 in which the fluorescent materials 22 are evenly dispersed in the silicone resins 21.

The cord-like fluorescent material-containing sealing resin 20 thus produced allows a plurality of fluorescent material-containing sealing resins 20, which have equal fluorescent material contents, to be easily obtained by, for example, cutting the fluorescent material-containing sealing resin 20 into pieces of the same length. Hence, by sealing the light-emitting elements 13 with the fluorescent material-containing sealing resins 20, it is possible to equalize fluorescent material contents of light-emitting devices.

With the cord-like fluorescent material-containing sealing resin 20 production method, it is possible to increase, by configuring the fluorescent material-containing sealing resin 20 to have the form of a cord, melting efficiency of silicone resins during heating in comparison with, for example, the case of a bulk fluorescent material-containing sealing resin 20. Therefore, the fluorescent material-containing sealing resin 20 can be processed into a desired form according to its use, by efficiently melting the cord-like fluorescent material-containing sealing resin 20 by heat at a temperature lower than the secondary crosslinking temperature $T_1$ as well as adjusting the viscosity of the silicone resins 21 while preventing the precipitation of the fluorescent materials. For example, it is possible to equalize the fluorescent material contents of light-emitting devices 1b by (i) processing a fluorescent material-containing sealing resin 20 into a sheet-like fluorescent material-containing sealing resin 20 in which fluorescent materials 22 are evenly dispersed in silicone resins 21 and then (ii) sealing light-emitting elements 13 with the sheet-like fluorescent material-containing sealing resin 20.

Therefore, with the cord-like fluorescent material-containing sealing resin 20 production method of Embodiment 2, it is possible to produce a fluorescent material-containing sealing resin 20 capable of reducing variance in chromaticity by equalizing the fluorescent material contents of the light-emitting devices 1b.

Embodiment 3

The following description will discuss, with reference to FIGS. 16 through 23, a third embodiment of the light-emitting device production method in accordance with the present invention. For convenience, members similar in function to the members described in Embodiments 1 and 2 are given the same reference signs accordingly, and the descriptions of such members are omitted.

The light-emitting device production method of Embodiment 3 differs from those of Embodiments 1 and 2 in terms of a fluorescent material-containing sealing resin 20 production method.

<Configuration of Light-Emitting Device 1c>

Figure 16:
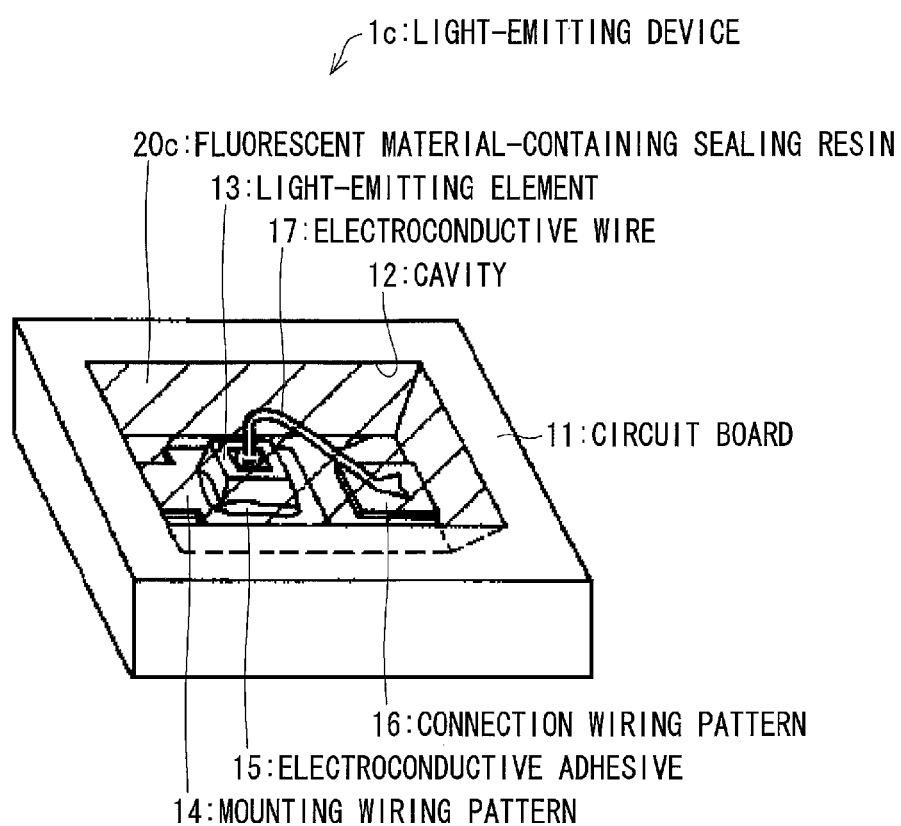
FIG. 16 is a perspective view illustrating an external appearance of a light-emitting device produced by a light-emitting device production method in accordance with Embodiment 3.

FIG. 16 is a perspective view illustrating an external appearance of a light-emitting device 1c produced by the light-emitting device production method of Embodiment 3.

The light-emitting device 1c illustrated in FIG. 16 is configured to include a fluorescent material-containing sealing resin (fluorescent material-containing sealant) 20c instead of including the fluorescent material-containing sealing resin 20 as is the case of the light-emitting device 1a illustrated in FIG. 1. The fluorescent material-containing sealing resin 20c differs from the fluorescent material-containing sealing resin 20 in that, as described later, the fluorescent material-containing sealing resin 20c contains a plasticizer for lowering an elastic modulus after secondary crosslinking of silicone resins.

Other than the fact of including the fluorescent material-containing sealing resin 20c, the light-emitting device 1c is similar in configuration to the light-emitting device 1a.

The inside of a cavity 12 of a circuit board 11 is sealed by a fluorescent material-containing sealing resin 20c made of light-transmissive silicone resin.

<Light-Emitting Device 1c Production Method>

A light-emitting device 1c production method illustrated in FIG. 16 will be described mainly with reference to FIGS. 17 and 18.

In the light-emitting device 1c production process illustrated in FIG. 16, light-emitting elements 13 are mounted inside the respective cavities 12 first. The step of mounting the light-emitting elements 13 inside the respective cavities 12 in the light-emitting device 1c production method is similar to that described with reference to (a) through (d) of FIG. 2, and therefore will not be described.

After the light-emitting elements 13 are mounted inside the respective cavities 12 of a multiple cavity circuit board 10 by die bonding and wire bonding in accordance with the method described with reference to (a) through (d) of FIG. 2, the cavities 12 are sealed with a fluorescent material-containing sealing resin 20c.

Figure 17:
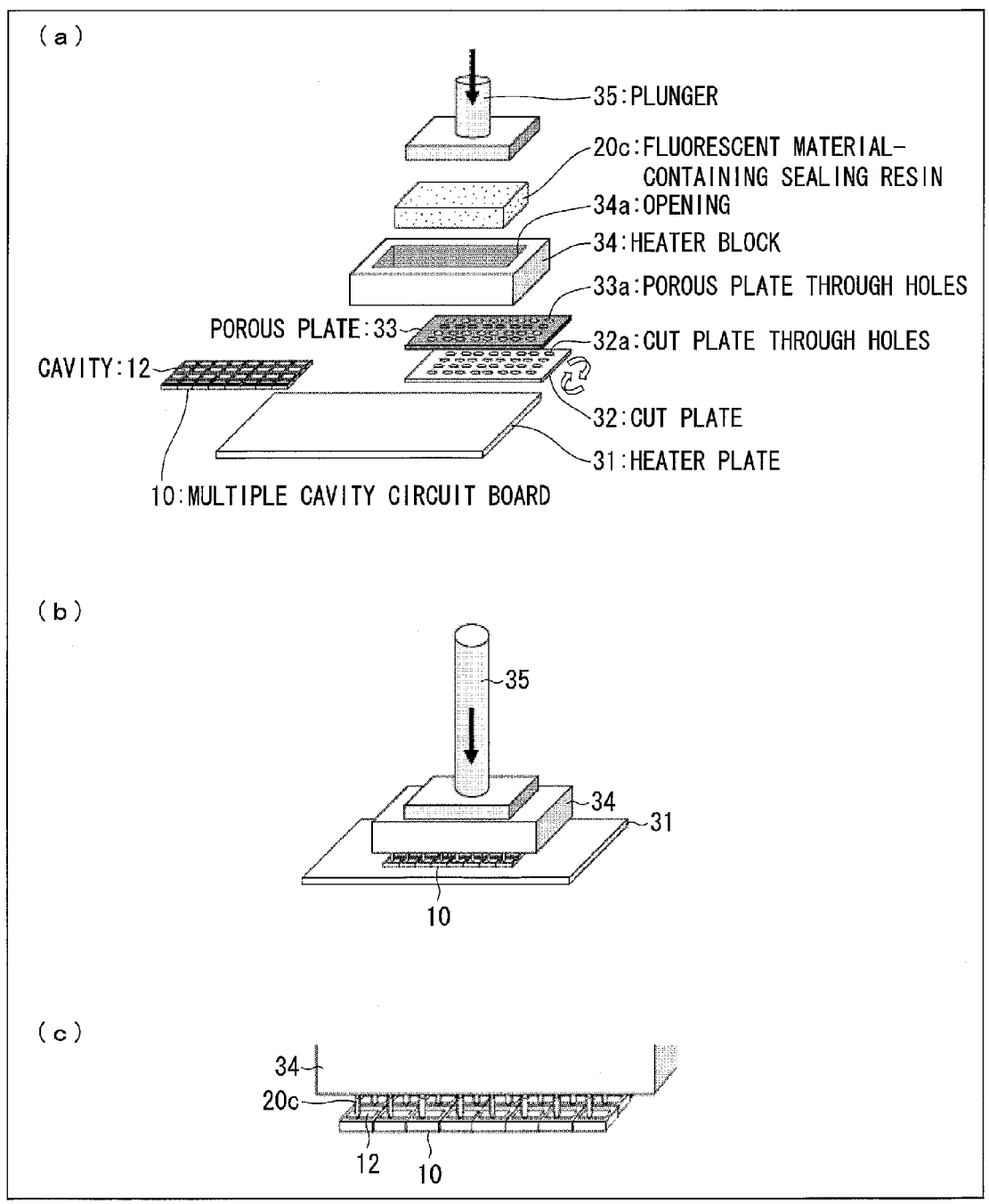
FIG. 17 is a set of views (a) through (c) schematically illustrating a step of filling cavities with a fluorescent material-containing sealing resin.

(a) through (c) of FIG. 17 are a set of views schematically illustrating a step of filling the cavities 12 with the respective fluorescent material-containing sealing resin 20c.

Silicone resins and fluorescent materials contained in the fluorescent material-containing sealing resin 20c are similar to those contained in the fluorescent material-containing sealing resin 20.

In other words, as is the case of the fluorescent material-containing sealing resin 20, a viscosity characteristic of the silicone resins contained in the fluorescent material-containing sealing resin 20c is also shown in the graph of FIG. 4.

Similarly, a change in viscosity of the silicone resins during a series of steps from the step of filling the cavities 12 with the fluorescent material-containing sealing resin 20 to the step of curing the fluorescent material-containing sealing resin 20 is shown in the graph of (a) through (d) of FIG. 5.

As illustrated in (a) of FIG. 17, the multiple cavity circuit board 10, on which the light-emitting elements 13 are mounted, is provided on a heater plate 31. Then, a cut plate 32, a porous plate 33, and a heater block 34 are stacked in this order above the multiple cavity circuit board 10 (placing step). Then, the fluorescent material-containing sealing resin 20 in the form of a block is situated (i) on the porous plate 33 and (ii) inside an opening 34a of the heater block 34 (situating step).

The fluorescent material-containing sealing resin 20 is obtained by evenly dispersing fluorescent materials in silicone resins. The silicone resins are subjected to primary crosslinking by applying, to the silicone resins for a period of time, a predetermined temperature which is lower than a secondary crosslinking temperature described later, so that the silicone resins (i) are maintained in a non-liquid state and (ii) have viscosity with which (a) even particles (such as fluorescent materials) larger in specific gravity than the silicone resins are not completely precipitated when contained in the silicone resins and (b) the silicone resins can be processed (100 Pa·S or more and 1E+5 Pa·S or less).

Varying fluorescent materials depending on a necessary optical characteristic are kneaded with the fluorescent material-containing sealing resin 20c so that fluorescent material concentration (content) is adjusted. In a case where silicone resins are used, it is possible to repeatedly adjust viscosity of the silicone resins before secondary crosslinking. This makes it possible as described later to form a fluorescent material-containing sealing resin 20c in which fluorescent materials are evenly dispersed.

A method of producing a block-like fluorescent material-containing sealing resin 20c will be described later.

The heater block 34 is equipped with a temperature regulating function covering a temperature range from the room temperature $T_0$ to the temperature lower than the secondary crosslinking temperature $T_1$ at which the fluorescent material-containing sealing resin 20c can be melted by heat. The heater block 34 is a frame-like member having the opening 34a that is a through hole. The fluorescent material-containing sealing resin 20c is provided inside the opening 34a.

The porous plate 33 is provided with a plurality of porous plate through holes (through holes) 33a. The porous plate through holes 33a are provided so as to correspond to respective cavities 12. As described later, a pressure from a plunger 35 causes the fluorescent material-containing sealing resin 20c to be extruded through the porous plate through holes 33a out to the cavities 12.

The cut plate 32 is intended to cut, to a predetermined length, each of pieces of the fluorescent material-containing sealing resin 20c extruded through the porous plate through holes 33a. The cut plate 32 is provided with cut plate through holes 32a corresponding to the respective porous plate through holes 33a. When the cut plate 32 eccentrically moves in a direction indicated by an arrow illustrated in FIG. 17, blades 32b (see FIG. 7) provided on the respective cut plate through holes 32a cut the respective pieces of the fluorescent material-containing sealing resin 20c each to the predetermined length.

The heater plate 31 is intended to heat the multiple cavity circuit board 10 situated as describe above. The heater plate 31 heats the multiple cavity circuit board 10 at the secondary crosslinking temperature $T_1$.

After such members are placed as describe above, the fluorescent material-containing sealing resin 20c situated on the porous plate 33 by the heater block 34 is melted by heat so that the viscosity of the fluorescent material-containing sealing resin 20c is lowered.

In so doing, since the fluorescent material-containing sealing resin 20c is heated up from the room temperature $T_0$ to a temperature $T_4$ (e.g. 80° C. or higher and lower than 120° C.) close to the secondary crosslinking temperature $T_1$ (see (a) of FIG. 5), the viscosity of the silicone resins is reduced, while restricting precipitation of the fluorescent materials, to a viscosity $V_4$ with which the silicone resins are flowable (see $P_4$ of (a) of FIG. 5).

Next, the plunger 35 is used to pressurize, against the multiple cavity circuit board 10, the fluorescent material-containing sealing resin 20c which is situated on the porous plate 33 (see (b) of FIG. 17). This, as illustrated in (c) of FIG. 17, causes the fluorescent material-containing sealing resin 20c to be extruded in the form of strings through the porous plate through holes 33a out toward the cavities 12 (extruding step).

FIG. 18 is a cross-sectional view illustrating the extruding step in (c) of FIG. 17. As illustrated in FIG. 18, the pressure from the plunger 35 causes the fluorescent material-containing sealing resin 20c to be extruded in the form of strings through the porous plate through holes 33a of the porous plate 33. Then, when a length of each string of the fluorescent material-containing sealing resin 20c extruded through the porous plate through holes 33a reaches a predetermined length, said each string is cut to the predetermined length by eccentrically rotating the cut plate 32. This allows the cavities 12 to be simultaneously filled with respective fluorescent material-containing sealing resins 20c which are cut to the predetermined length and are identical in fluorescent material content (filling step).

Note that the cavities 12 can be easily filled with the respective fluorescent material-containing sealing resins 20c by causing a dimension d of each of the porous plate through hole 33a to be smaller than a dimension D of an opening of each of the cavities 12. Note also that since the length of each string of the fluorescent material-containing sealing resin 20c is adjusted, it is possible to easily fill the cavities 12 with respective fluorescent material-containing sealing resins 20c whose amounts are suitable for volumes of the cavities 12.

After the cavities 12 are filled with the respective fluorescent material-containing sealing resins 20c, the heater plate 31 is used to heat the fluorescent material-containing sealing resins 20c at the secondary crosslinking temperature $T_1$ (e.g. 125° C.) as illustrated in (b) of FIG. 5 (see $P_1$ of (b) of FIG. 5). This subjects the silicone resins to secondary crosslinking so as to be cured as illustrated in (c) of FIG. 5 (curing step: see $P_2$ of (c) of FIG. 5). In so doing, the fluorescent material-containing sealing resins 20c, with which the respective cavities 12 are filled, start being cured from their parts corresponding to the bottoms of the respective cavities 12 because of the heater plate 31. Therefore, stress, which occurs due to cure shrinkage of each of the fluorescent material-containing sealing resins 20c, can be distributed toward an upper part of the fluorescent material-containing sealing resin 20c, that is, toward an opening side of the corresponding cavity 12. This restricts the occurrence of crack or the like, and therefore increases reliability of the light-emitting device 1c.

Then, the silicone resins are completely cured by heating, with the use of an oven or the like, the multiple cavity circuit board 10 at the secondary crosslinking temperature $T_1$ or higher (e.g. 125° C. or higher and 170° C. or lower). Then, the multiple cavity circuit board 10 is taken out from the oven or the like so that the temperature of the multiple cavity circuit board 10 is lowered to the room temperature $T_0$. In so doing, as illustrated in (d) of FIG. 5, the viscosity of the silicone resins having been subjected to the secondary crosslinking is $V_2$ even in a case where the temperature becomes lower than the room temperature $T_0$ (see $P_3$ of (d) of FIG. 5).

Then, the step of dividing the multiple cavity circuit board 10 is carried out as described with reference to FIG. 8.

Specifically, after the light-emitting elements 13 mounted in the respective cavities 12 are sealed by the respective fluorescent material-containing sealing resins 20c having been subjected to secondary crosslinking, the multiple cavity circuit board 10 is divided into pieces corresponding to the respective cavities 12. This allows a plurality of light-emitting devices 1c, which are uniform in fluorescent material content, to be simultaneously produced.

A chromaticity distribution range of the light-emitting devices 1c thus produced can satisfy the chromaticity management standard of a 2-step MacAdam ellipse. The MacAdam ellipse refers to a standard deviation, shown in an xy chromaticity diagram, of how recognizability of colors from a particular color at a center part of the ellipse changes. The light-emitting devices 1c thus produced achieve a level at which a human eye cannot recognize variance in chromaticity.

With the light-emitting device production method of Embodiment 3, it is thus possible to cause variance in chromaticity (chromaticity distribution range) to be relatively small by equalizing fluorescent material contents of the light-emitting devices 1c.

Note that in the extruding step, the fluorescent material-containing sealing resins 20c are heated by the heater block 34. This causes, while restricting the precipitation of the fluorescent materials, the viscosity of the silicone resins to be lowered to the viscosity $V_4$ with which the silicone resins are flowable. However, it is possible, by increasing extruding force, to extrude the fluorescent material-containing sealing resins 20c at the room temperature $T_0$ without increasing the temperature of the heater block 34. Therefore, the heater block 34 can be kept at the room temperature $T_0$.

<Method of Producing Block-like Fluorescent Material-Containing Sealing Resin 20c>

A method of producing a block-like fluorescent material-containing sealing resin 20c for use in the light-emitting device production method of Embodiment 3 will be described next with reference to FIGS. 19 through 21.

Figure 19:
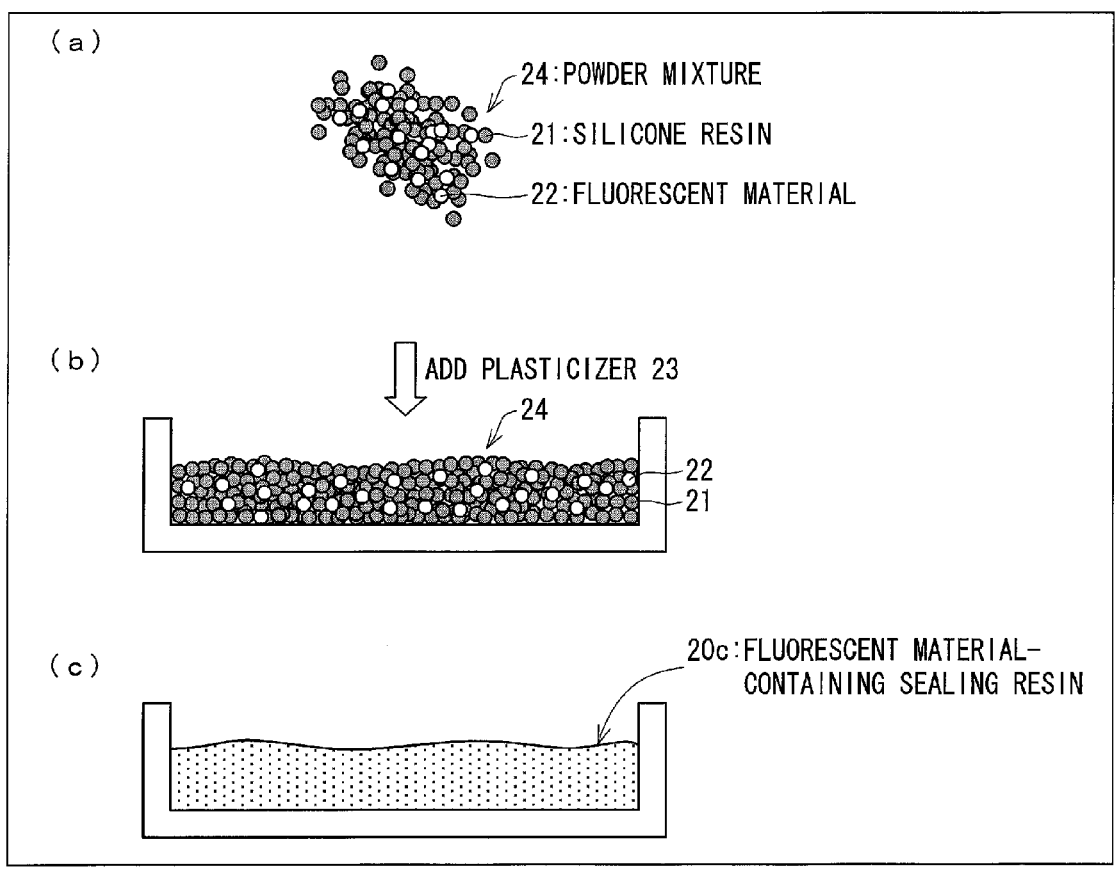
FIG. 19 is a set of views (a) through (c) schematically illustrating a block-like fluorescent material-containing sealing resin production method.

(a) through (c) of FIG. 19 are a set of views schematically illustrating the method of producing a block-like fluorescent material-containing sealing resin 20c. (a) and (b) of FIG. 20 are a set of graphs for describing a change in viscosity of silicone resins in the steps illustrated in (a) through (c) of FIG. 19.

First, as illustrated in (a) of FIG. 19, a powder of silicone resins 21 having been subjected to primary crosslinking and a powder of fluorescent materials 22 are sufficiently dry-mixed until the powders are evenly mixed, so that a powder mixture 24 is obtained.

Then, as illustrated in (b) of FIG. 19, a plasticizer 23 for lowering an elastic modulus (secondarily lowering viscosity) of the silicone resins 21, which has been subjected to secondary crosslinking, is added to the powder mixture 24. The plasticizer 23 will be described in detail later. Then, as illustrated in (a) of FIG. 20, the powder mixture 24 is heated from a room temperature $T_0$ to a temperature $T_5$ (e.g. 40° C. or higher and lower than 60° C.), so that the silicone resins 21 are melted. Then, while precipitation of the fluorescent materials 22 is restricted, viscosity of the silicone resins 21 is lowered to a viscosity $V_5$ with which the silicone resins 21 can be kneaded with the fluorescent materials 22 (see $P_5$ of (a) of FIG. 20). Then, the silicone resins 21 are kneaded with the fluorescent materials 22.

In so doing, the silicone resins 21, which are melted by heat, are blended therewith, and mixed and kneaded with the fluorescent materials 22. As described above, the silicone resins 21 and fluorescent materials 22 are kneaded while (i) the precipitation of the fluorescent materials 22 is restricted and (ii) the viscosity of the silicone resins 21 is lowered to the viscosity $V_5$ with which the silicone resins 21 can be kneaded. This allows the fluorescent materials 22 in the silicone resins 21 to remain dispersed.

Figure 20:
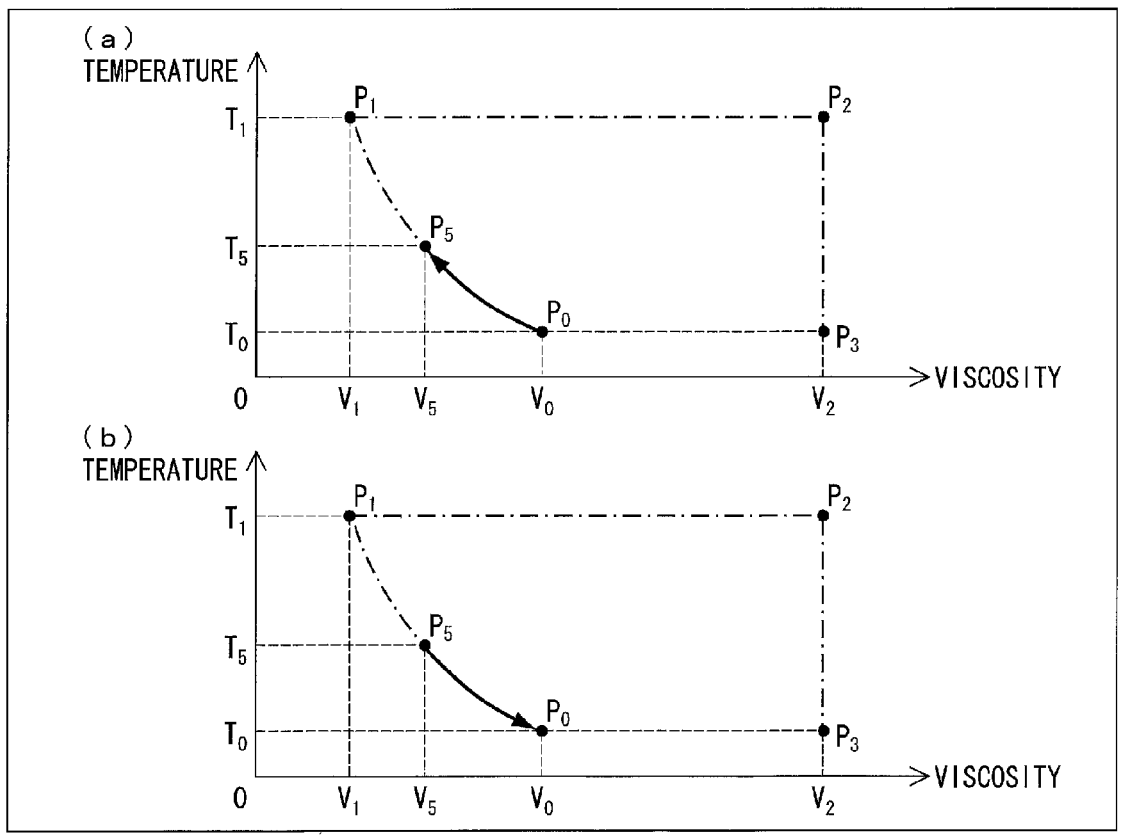
FIG. 20 is a set of graphs (a) and (b) for describing a change in viscosity of silicone resins during the steps illustrated in (a) through (c) of FIG. 19.

Then, as illustrated in (b) of FIG. 20, the temperature of the powder mixture 24 is lowered from the temperature $T_5$ to the room temperature $T_0$. This allows a block-like fluorescent material-containing sealing resin 20c, in which the fluorescent materials 22 are evenly dispersed in the silicone resins 21, to be produced.

Note that the silicone resins 21, which have been subjected to the primary crosslinking, (i) have relatively high viscosity at the room temperature $T_0$, (ii) are not easily melted by heat, and (iii) have low tackiness (adherence) and low wettability. This prevents the silicone resins 21 from sufficiently bonding to each other during heating, and therefore results in a large amount of spaces between the silicone resins 21. In a case where the silicone resins 21 in such a state is subjected to the secondary crosslinking so as to be completely cured, cracking or the like can easily occur in the fluorescent material-containing sealing resin 20c. In order to restrict the occurrence of cracking, the elastic modulus of the silicone resins 21 having been subjected to the secondary crosslinking is preferably lowered.

Therefore, the small amount of plasticizer 23 for lowering the elastic modulus of the silicone resins 21, which has been subjected to the secondary crosslinking, is added to the powder mixture 24 which is obtained by dry-mixing a powder of silicone resins 21 and a powder of fluorescent materials 22.

The plasticizer 23 can be configured to lower a crosslinking density of the silicone resins 21. This suitably lowers the elastic modulus of the silicone resins 21 having been subjected to the secondary crosslinking, and therefore makes it possible to restrict the occurrence of cracking or the like in the fluorescent material-containing sealing resin 20c by which the light-emitting elements 13 are sealed.

Alternatively, the plasticizer 23 can be configured to lower viscosity of the silicone resins at the time of primary crosslinking. This makes processing and the like of the fluorescent material-containing sealing resin easy. In addition, since the powder mixture 24 is provided with compatibility, the silicone resins 21 can be easily made put together without spaces.

Suitable examples of such a plasticizer 23, particularly those containing silicone resins as a main component, encompass non-functional silicone oil and monofunctional silicone oil. The non-functional silicone oil and the monofunctional silicone oil may or may not react with matrix silicone. The plasticizer 23 is to be properly selected according to characteristics of the light-emitting device 1c.

FIG. 21 is a table showing how viscosity and elastic modulus of the silicone resins 21 vary, depending on whether or not the plasticizer 23 is added. FIG. 21 shows (i) the viscosity of the silicone resins 21 before secondary crosslinking (having been subjected to primary crosslinking) and (ii) the elastic modulus of the silicone resins 21 after the secondary crosslinking.

As illustrated in FIG. 21, by adding the plasticizer 23 to the silicone resins 21 (see the example of adding 11 wt % of plasticizer 23), it is possible to lower, to approximately ⅓ of its value, the viscosity of the silicone resins 21 at 25° C. before the secondary crosslinking. In addition, it is possible to lower, to approximately ¹⁄₁₀₀ of its value, the viscosity of the silicone resins 21 at 120° C. before the secondary crosslinking.

Although the value of the viscosity of the silicone resins 21 changes depending on the amount of plasticizer 23 added, the value is (i) approximately $1\times10^4$ Pa·s to $1\times10^5$ Pa·s at 25° C. and (ii) approximately $1\times10^2$ Pa·s to $1\times10^4$ Pa·s at 120° C. Note that the amount of plasticizer 23 to be added in terms of weight ratio of the plasticizer 23 to the silicone resins 21 is preferably 5 wt % to 20 wt %, more preferably 8 wt % to 15 wt %, and even more preferably approximately 11 wt %.

Furthermore, by adding the plasticizer 23 to the silicone resins 21, it is possible to lower, from $-5\times10^7$ Pa to $-1\times10^7$ Pa, the elastic modulus of the silicone resins 21 at 25° C. after formation of secondary crosslinking. In addition, it is possible to lower, from $-1\times10^7$ Pa to $-2\times10^6$ Pa, the elastic modulus of the silicone resins 21 at 125° C. after the formation of the secondary crosslinking.

It is thus possible to lower the viscosity of the silicone resins 21 before secondary crosslinking by adding the plasticizer 23. This makes it easy to process the fluorescent material-containing sealing resin 20c which has been subjected to primary crosslinking.

In addition, since crosslinking density of the silicone resins is lowered by the addition of the plasticizer 23, it is possible to lower the respective elastic moduli of the silicone resins 21 at 25° C. and 125° C. after the formation of the secondary crosslinking. This makes it possible to restrict the occurrence of cracking or the like in the fluorescent material-containing sealing resin 20c.

According to Embodiment 3, a single kind of fluorescent materials 22 are contained in the fluorescent material-containing sealing resin 20c. Alternatively, it is also possible to use two or more kinds of fluorescent materials 22 differing in (i) color of light to emit, (ii) particle size, (iii) specific gravity, or (iv) the like. For example, it is possible to produce a fluorescent material-containing sealing resin 20c containing red-color light emitting fluorescent materials and green-color light emitting fluorescent materials in combination, and to apply the fluorescent material-containing sealing resin 20c to a blue-color LED chip (light-emitting element 13). Alternatively, it is possible to produce a fluorescent material-containing sealing resin 20c containing blue-color light emitting fluorescent materials and yellow-color light emitting fluorescent materials in combination, and to apply the fluorescent material-containing sealing resin 20c to a bluish-purple-color LED chip.

Even in such a case, a powder mixture 24 is obtained by dry-mixing (i) a powder of silicone resins 21 which have been subjected to primary crosslinking and (ii) two or more kinds of powders of fluorescent materials 22, until the powders are evenly mixed.

Then, the plasticizer 23 for lowering the elastic modulus (secondarily lowering viscosity) of the silicone resins 21 having been subjected to secondary crosslinking is added to the powder mixture 24.

Next, the silicone resins 21 are melted by heat at a temperature lower than the secondary crosslinking temperature $T_1$, and the silicone resins 21 and the two or more kinds of fluorescent materials 22 are kneaded together while (i) the precipitation of the two or more kinds of fluorescent materials 22 is restricted and (ii) the viscosity of the silicone resins 21 is lowered to a viscosity with which the silicone resins 21 can be kneaded.

In so doing, the silicone resins 21, which are melted by heat, are blended therewith, and mixed and kneaded with the fluorescent materials 22. As described above, the silicone resins 21 and fluorescent materials 22 are kneaded while (i) the precipitation of the two or more kinds of fluorescent materials 22 is restricted and (ii) the viscosity of the silicone resins 21 is lowered to the viscosity with which the silicone resins 21 can be kneaded. This allows the two or more kinds of fluorescent materials 22 in the silicone resins 21 to remain dispersed.

Then, the temperature of the powder mixture 24 is lowered to the room temperature $T_0$. This allows a block-like fluorescent material-containing sealing resin 20c, in which the two or more kinds of fluorescent materials 22 are evenly dispersed in the silicone resins 21, to be produced.

According to Embodiment 3, the fluorescent materials 22 are used as a wavelength conversion material. Alternatively, other wavelength conversion materials can be used. A wavelength conversion material refers to a material having a function to (i) convert a wavelength of light which has been emitted from the light-emitting element 13 and (ii) emit light which has a converted wavelength.

According to Embodiment 3, a multiple cavity circuit board 10, on which a large number of cavities 12 are provided, is used. Alternatively, it is possible to use, instead of the multiple cavity circuit board 10a, a plane circuit board having a flat surface.

Summary of Embodiment 3

As has been described, the light-emitting device 1c production method in accordance with Embodiment 3 includes: a placing step of placing, above a multiple cavity circuit board 10 on which light-emitting elements 13 are mounted in respective cavities 12 facing upwards, a porous plate 33 having porous plate through holes 33a corresponding to the respective cavities 12, the placing being carried out so that the porous plate 33 is placed substantially parallel to the multiple cavity circuit board 10; a situating step of situating, on the porous plate 33, a fluorescent material-containing sealing resin 20c obtained by (i) kneading a powder mixture 24, in which a powder of fluorescent materials is mixed with a powder of silicone resins that have been semi-cured by primary crosslinking, with a plasticizer for lowering an elastic modulus of the silicone resins 21 which have been subjected to secondary crosslinking and (ii) being formed (molded); an extruding step of extruding the fluorescent material-containing sealing resin 20c in a form of strings via the respective porous plate through holes 33a toward the multiple cavity circuit board 10 while melting the fluorescent material-containing sealing resin 20c by heat at (i) room temperature $T_0$ or (ii) a temperature lower than a secondary crosslinking temperature $T_1$ at which the silicone resins form secondary crosslinking; a filling step of filling the cavities 12 with the respective strings of fluorescent material-containing sealing resin 20c by cutting, to a predetermined length, each of the strings of fluorescent material-containing sealing resin 20c thus extruded; and a curing step of curing the fluorescent material-containing sealing resin 20c with which the cavities 12 are filled, the curing being carried out by heating the fluorescent material-containing sealing resin 20c at the secondary crosslinking temperature $T_1$ or higher, the silicone resins being configured to (i) reversibly change in viscosity in a temperature region between the room temperature $T_0$ and the temperature lower than the secondary crosslinking temperature $T_1$ and (ii) be completely cured in a temperature region encompassing the secondary crosslinking temperature $T_1$ or higher.

According to the light-emitting device 1c production method according to Embodiment 3, silicone resins having the characteristics described above are used. This makes it possible to repeatedly adjust the viscosity of the silicone resins by changing a temperature of the silicone resins in a region between a room temperature $T_0$ and a temperature lower than a secondary crosslinking temperature $T_1$.

Therefore, when the melted silicone resins 21 and the powder of fluorescent materials 22 are kneaded together, the precipitation of the fluorescent materials 22, which are kneaded with the silicone resins 21, can be restricted by adjusting the viscosity of the silicone resins 21 to a viscosity with which a dispersed state of the fluorescent materials 22 can be maintained. This allows a fluorescent material-containing sealing resin 20c, in which the fluorescent materials 22 are evenly dispersed in the silicone resins 21, to be obtained.

Then, it is possible to simultaneously fill (potting) each of the cavities 12 with an identical amount of fluorescent material-containing sealing resin 20c by (i) extruding, in the form of strings, the fluorescent material-containing sealing resin 20c from the porous plate through holes 33a toward the multiple cavity circuit board 10 while melting the fluorescent material-containing sealing resin 20c by heat at a temperature lower than a secondary crosslinking temperature $T_1$ and (ii) cutting each of the strings of fluorescent material-containing sealing resins 20c to a predetermined length. Note that the predetermined length of fluorescent material-containing sealing resins 20c, with which the cavities 12 are filled, have uniform fluorescent material content. Therefore, in a case where the fluorescent material-containing sealing resins 20c are heated at a secondary crosslinking temperature or higher so that silicone resins are completely cured, it is possible to seal the light-emitting elements 13 with the respective fluorescent material-containing sealing resins 20c having the uniform fluorescent material content.

Therefore, according to Embodiment 3, it is possible to realize a light-emitting device production method capable of reducing variance in chromaticity by equalizing fluorescent material contents of light-emitting devices 1c.

In addition, according to the light-emitting device 1c production method of Embodiment 3, the porous plate through holes 33a is formed on the porous plate 33 in accordance with the number, dimensions, and the like of the cavities 12 provided on the multiple cavity circuit board 10.

This makes it easy to handle production of various light-emitting devices 1c, and therefore allows a reduction in production costs of the light-emitting devices 1c.

Furthermore, according to the light-emitting device 1c production method of Embodiment 3, the plasticizer 23 is added to the powder mixture 24 to lower the elastic modulus of the silicone resins having been subjected to secondary crosslinking. This makes it possible to restrict the occurrence of cracking or the like in the fluorescent material-containing sealing resin 20c by which the light-emitting elements 13 are sealed, and therefore increases reliability of the light-emitting device 1c.

<Modifications>

(Modification 1)

Figure 22:
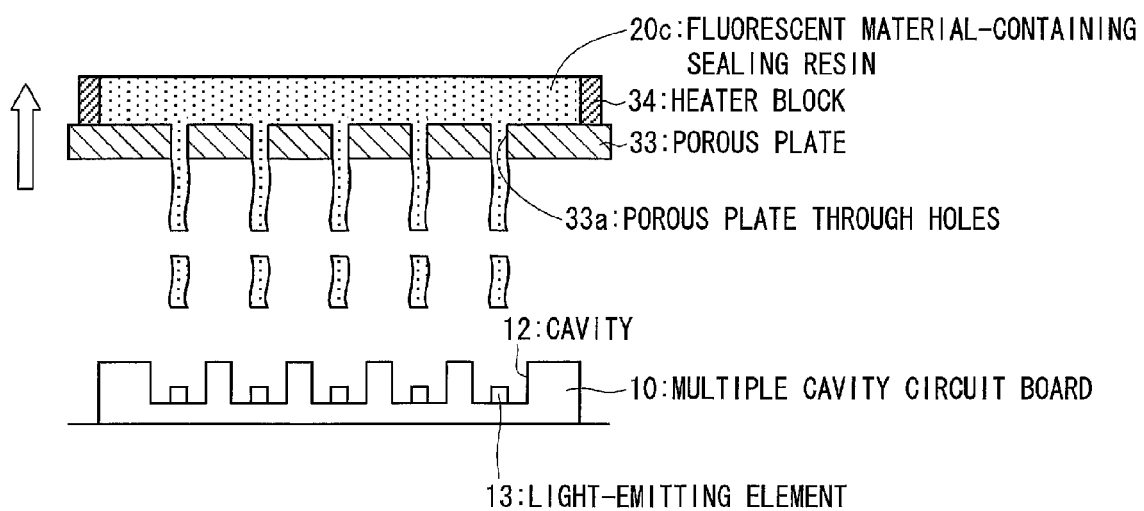
FIG. 22 is a cross-sectional view illustrating a modification of a filling step.

FIG. 22 is a cross-sectional view illustrating a modification of the filling step. As illustrated in FIG. 22, fluorescent material-containing sealing resins 20c, which are extruded in the form of strings from porous plate through holes 33a, can be cut by moving a porous plate 33 away from a multiple cavity circuit board 10 in a direction perpendicular to the multiple cavity circuit board 10.

In such a case, the multiple cavity circuit board 10 is preferably pre-heated. This allows lower end parts of the fluorescent material-containing sealing resins 20c, which have been extruded in the form of strings and have reached the multiple cavity circuit board 10, to be attached to corresponding bottom parts of the respective cavities 12 by the heat. Therefore, in a case where the porous plate 33 is lifted with a timing with which the lower end parts of the fluorescent material-containing sealing resins 20c in the form of strings reach the respective cavities 12, it is possible to fill the cavities 12 with the respective fluorescent material-containing sealing resins 20c by cutting the fluorescent material-containing sealing resins 20c having the form of strings. Alternatively, it is possible to cut the fluorescent material-containing sealing resins 20c by lowering the multiple cavity circuit board 10 instead of lifting the porous plate 33.

With such a cutting method, it is possible to cut the fluorescent material-containing sealing resins 20c without using (i) a cut plate 32 and (ii) a drive device or the like for causing an eccentric rotation of the cut plate 32.

Alternatively, it is also possible to cut the fluorescent material-containing sealing resins 20c by injecting compressed air between the porous plate 33 and the multiple cavity circuit board 10.

Even in such a case, (i) the multiple cavity circuit board 10 is pre-heated and (ii) the compressed air is injected between the porous plate 33 and the multiple cavity circuit board 10 with a timing with which the lower end parts of the fluorescent material-containing sealing resin 20c, which have been extruded in the form of strings, reach the respective cavities 12. This makes it possible to fill the cavities 12 with the fluorescent material-containing sealing resin 20c by cutting the fluorescent material-containing sealing resins 20c having the form of strings.

(Modification 2)

FIG. 23 is a cross-sectional view illustrating a step of filling, by use of a dispenser 36, cavities 12 with a fluorescent material-containing sealing resin 20c. As illustrated in FIG. 23, it is possible to fill the cavities 12 with the fluorescent material-containing sealing resin 20c by use of the dispenser 36 including a syringe 36a.

The dispenser 36 is designed to (i) re-process, into such a shape that can be contained in the syringe 36a, a fluorescent material-containing sealing resin 20c in which silicone resins semi-cured by primary crosslinking are kneaded with a powder of fluorescent materials and then (ii) discharge, in the form of strings toward a light-emitting element 13 mounted on a multiple cavity circuit board 10, the fluorescent material-containing sealing resin 20c contained in the syringe 36a.

The dispenser 36 includes the syringe (containing section) 36a for containing a fluorescent material-containing sealing resin 20c. The dispenser 36 discharges a fluorescent material-containing sealing resin 20c contained in the syringe 36a by pressurizing the syringe 36a by air or a piston, so that a cavity 12 is filled with a fluorescent material-containing sealing resin 20c (discharging step). Note that in a case where the syringe 36a is pressurized by air or a piston, it is possible to discharge the fluorescent material-containing sealing resin 20c (i) while melting, by heat, the fluorescent material-containing sealing resin 20c at a temperature lower than a secondary crosslinking temperature for silicone resins or (ii) while keeping the fluorescent material-containing sealing resin 20c at a room temperature $T_0$.

In a case where the fluorescent material-containing sealing resin 20c is discharged while being melted by heat at the temperature lower than the secondary crosslinking temperature for the silicone resins, a temperature of the heating by the syringe 36a is to be controlled so that viscosity of the fluorescent material-containing sealing resin 20c contained in the syringe 36a does not cause precipitation of fluorescent materials. This makes it possible to restrict the precipitation of the fluorescent materials in the syringe 36a, which precipitation occurs, as is the case of the conventional technology, by a difference in specific gravity between the silicone resins and the fluorescent materials. It is therefore possible to keep the fluorescent materials substantially evenly dispersed.

Therefore, it is possible to fill each of the cavities 12 with a fluorescent material-containing sealing resin 20c while causing a fluorescent material concentration in the fluorescent material-containing sealing resin 20c to hardly change from the beginning to the end of the discharging step carried out by use of the dispenser 36. In addition, in a case where the fluorescent material-containing sealing resin 20c is discharged while being maintained at the room temperature $T_0$, a decrease in viscosity of the fluorescent material-containing sealing resin 20c does not occur. Therefore, as is the case of melting the fluorescent material-containing sealing resin 20c by heat, it is possible to fill each of the cavities 12 with a fluorescent material-containing sealing resin 20c while causing a fluorescent material concentration in the fluorescent material-containing sealing resin 20c to hardly change from the beginning to the end of the discharging step carried out by use of the dispenser 36.

Then, the fluorescent material-containing sealing resins 20c, with which the respective cavities 12 are filled, are heated by a heater plate 31 and an oven or the like at the secondary crosslinking temperature or higher so that the silicone resins contained in the fluorescent material-containing sealing resins 20c are completely cured. This makes it possible to seal light-emitting elements 13 with the respective fluorescent material-containing sealing resins 20c having the uniform fluorescent material content.

Even in a case where the dispenser 36 is used, it is thus possible to realize a light-emitting device production method capable of reducing variance in chromaticity by equalizing fluorescent material contents of light-emitting devices 1c.

Alternatively, it is possible to discharge, by use of a dispenser 36, fluorescent material-containing sealing resins 20c toward a plurality of light-emitting elements 13 which are mounted on a flat-surface circuit board on which no cavity 12 is provided, such that a single light-emitting element 13 is sealed at a time or several light-emitting elements 13 are sealed at a time.

In such a case also, the fluorescent material-containing sealing resins 20c are heated by the heater plate 31 and an oven or the like at the secondary crosslinking temperature or higher while the fluorescent material-containing sealing resins 20c are in close contact with surfaces of the light-emitting elements 13 so that the silicone resins contained in the fluorescent material-containing sealing resins 20c are completely cured. This makes it possible to seal light-emitting elements 13 with the respective fluorescent material-containing sealing resins 20c having the uniform fluorescent material content.

Embodiment 4

Figure 24:
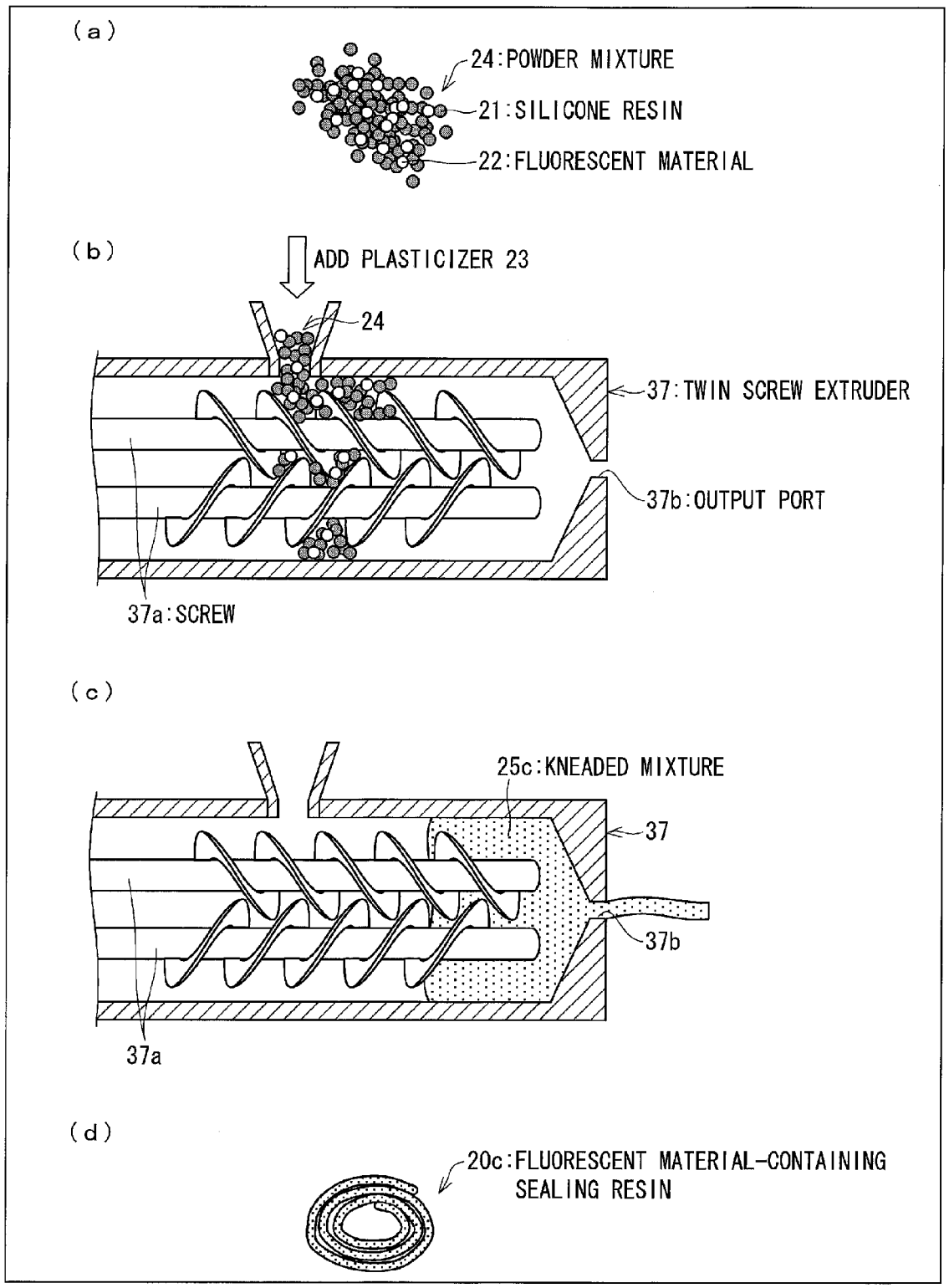
FIG. 24 is a set of views (a) through (d) schematically illustrating a cord-like fluorescent material-containing sealing resin production method in accordance with Embodiment 4.
Figure 25:
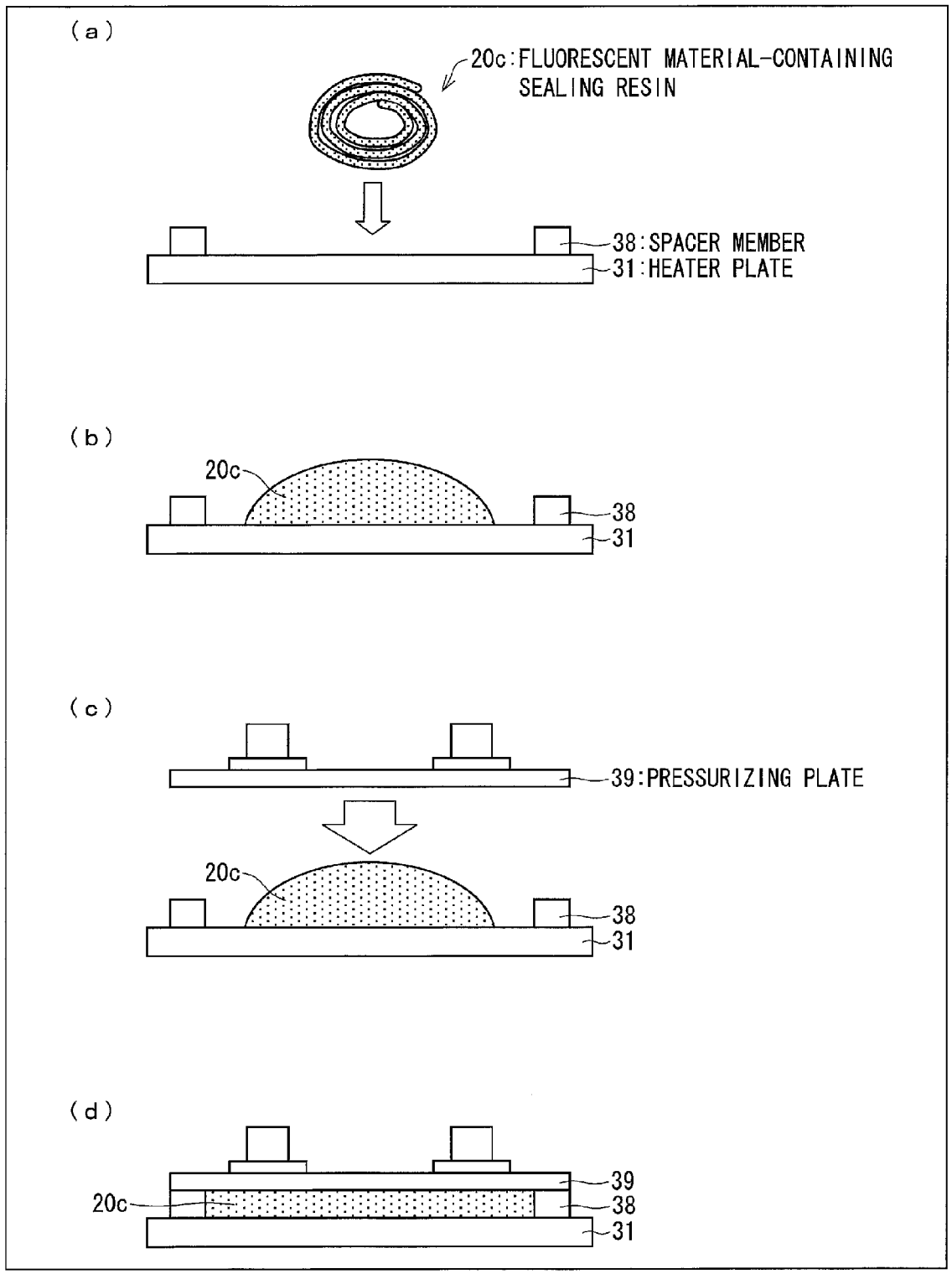
FIG. 25 is a set of views (a) through (d) schematically illustrating a method of processing a cord-like fluorescent material-containing sealing resin into the form of a sheet.
Figure 26:
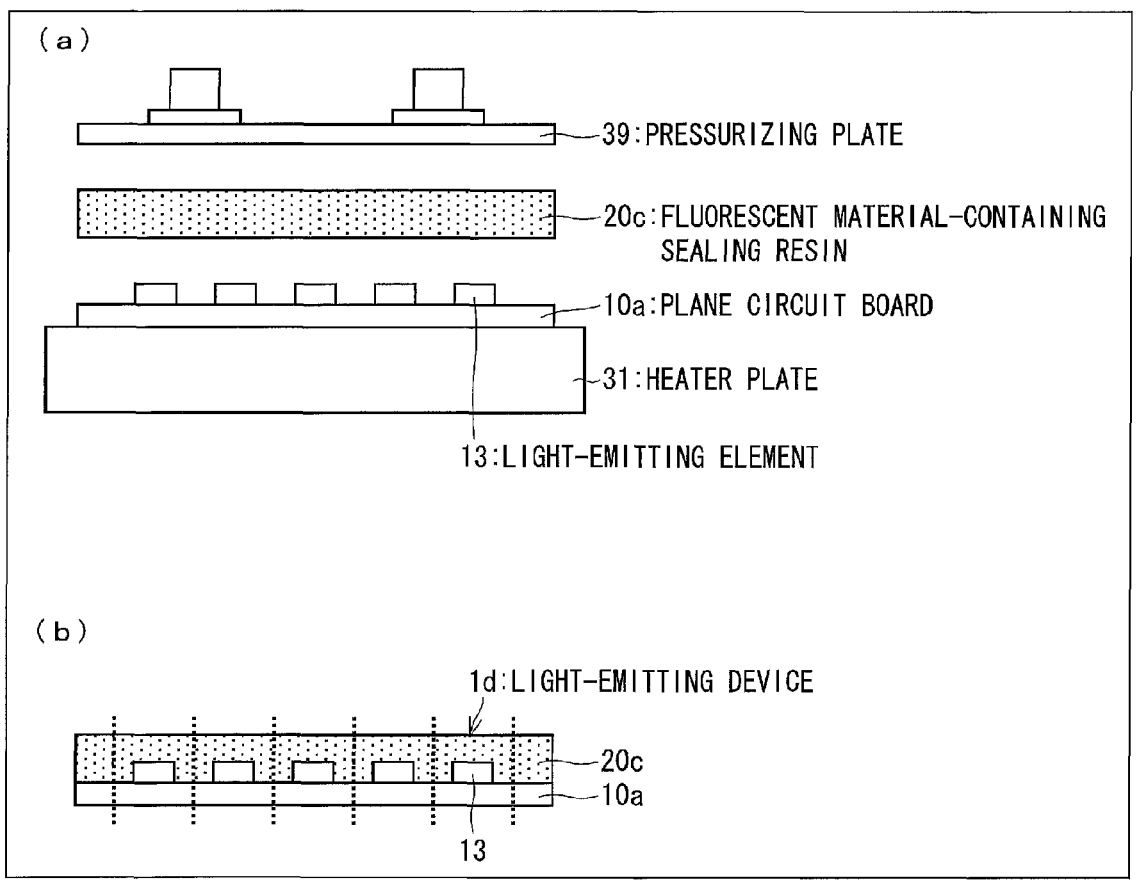
FIG. 26 is a set of cross-sectional views (a) and (b) illustrating a light-emitting device production method by use of a sheet-like fluorescent material-containing sealing resin.

The following description will discuss, with reference to FIGS. 24 through 26, another embodiment of the light-emitting device production method in accordance with the present invention. For convenience, members similar in function to the members described in the above embodiments are given the same reference signs accordingly, and the descriptions of such members are omitted.

The light-emitting device production method of Embodiment 4 differs from that of Embodiment 3 in that (i) a cord-like fluorescent material-containing sealing resin 20c is first produced and then (ii) a product obtained by processing the cord-like fluorescent material-containing sealing resin 20c is used to seal light-emitting elements 13.

<Method of Producing Cord-Like Fluorescent Material-Containing Sealing Resin 20c>

A method of producing a cord-like fluorescent material-containing sealing resin 20c will be described first with reference to FIG. 24.

(a) through (d) of FIG. 24 are a set of views schematically illustrating the method of producing the cord-like fluorescent material-containing sealing resin 20c.

First, as illustrated in (a) of FIG. 24, a powder of silicone resins 21 having been subjected to primary crosslinking and a powder of fluorescent materials 22 are dry-mixed until the powders are evenly mixed, so that a powder mixture 24 is obtained (mixing step).

Next, as illustrated in (b) of FIG. 24, a plasticizer 23 is added to the powder mixture 24 (adding step). Then, the powder mixture 24, to which the plasticizer 23 has been added, is introduced into a twin screw extruder (kneading extruding device) 37, and is then kneaded while being melted by heat at a temperature lower than a secondary crosslinking temperature $T_1$ (kneading step).

The twin screw extruder 37 includes two screws 37a provided parallel to each other. By causing the two screws 37a to rotate in opposite directions, the powder mixture 24 is kneaded while silicone resins are melted by heat.

By the heating and the kneading, as illustrated in (c) of FIG. 24, the powder mixture 24 becomes a kneaded mixture 25 in which fluorescent materials are evenly dispersed in the melted silicone resins. By extruding the kneaded mixture 25 in the form of a cord from an output port (through hole) 37b of the twin screw extruder 37, it is possible to produce a cord-like fluorescent material-containing sealing resin 20c in which fluorescent materials are evenly dispersed in silicone resins (see (d) of FIG. 24).

The fluorescent material-containing sealing resin 20c, in which fluorescent materials are evenly dispersed in silicone resins, is thus formed in the form of a cord. This allows a plurality of fluorescent material-containing sealing resins 20c, which have equal fluorescent material contents, to be easily obtained by, for example, cutting the fluorescent material-containing sealing resin 20c into pieces of the same length. Hence, by sealing the light-emitting elements 13 with the fluorescent material-containing sealing resins 20c, it is possible to equalize fluorescent material contents of light-emitting devices, and therefore to reduce variance in chromaticity.

Furthermore, by configuring the fluorescent material-containing sealing resin 20c to have the form of a cord, it is possible to increase melting efficiency of silicone resins during heating in comparison with, for example, the case of a bulk fluorescent material-containing sealing resin 20c. Therefore, by melting the cord-like fluorescent material-containing sealing resin 20c by heat at the temperature lower than the secondary crosslinking temperature $T_1$ to prevent the precipitation of fluorescent materials, it is possible to easily process the cord-like fluorescent material-containing sealing resin 20c into a desired form while keeping the fluorescent materials evenly dispersed in the silicone resins.

The output port 37b of the twin screw extruder 37 is not particularly limited in number, dimension, and shape, but can be changed as needed.

According to Embodiment 4, a single kind of fluorescent materials 22 are contained in the fluorescent material-containing sealing resin 20c. Alternatively, it is also possible to use two or more kinds of fluorescent materials 22 differing in (i) color of light to emit, (ii) particle size, (iii) specific gravity, or (iv) the like. For example, it is possible to produce a fluorescent material-containing sealing resin 20c containing red-color light emitting fluorescent materials and green-color light emitting fluorescent materials in combination, and to apply the fluorescent material-containing sealing resin 20c to a blue-color LED chip (light-emitting element 13). Alternatively, it is possible to produce a fluorescent material-containing sealing resin 20c containing blue-color light emitting fluorescent materials and yellow-color light emitting fluorescent materials in combination, and to apply the fluorescent material-containing sealing resin 20c to a bluish-purple-color LED chip.

Even in such a case, a powder mixture 24 is obtained by dry-mixing (i) a powder of silicone resins 21 which have been subjected to primary crosslinking and (ii) two or more kinds of powders of fluorescent materials 22, until the powders are evenly mixed.

Then, the plasticizer 23 for lowering the elastic modulus (secondarily lowering viscosity) of the silicone resins 21 having been subjected to secondary crosslinking is added to the powder mixture 24.

Next, the powder mixture 24 is introduced into a twin screw extruder (kneading extruding device) 37, and is then kneaded while being melted by heat at the temperature lower than a secondary crosslinking temperature $T_1$. The twin screw extruder 37 includes two screws 37a provided parallel to each other. By causing the two screws 37a to rotate in opposite directions, the powder mixture 24 is kneaded while silicone resins 21 are melted by heat.

By the heating and the kneading, the powder mixture 24 becomes a kneaded mixture 25 in which two or more kinds of fluorescent materials 22 are evenly dispersed in the melted silicone resins 21. By extruding the kneaded mixture 25 in the form of a cord from an output port 37b of the twin screw extruder 37, it is possible to produce a cord-like fluorescent material-containing sealing resin 20c in which two or more kinds of fluorescent materials 22 are evenly dispersed in silicone resins 21.

According to Embodiment 4, the fluorescent materials 22 are used as a wavelength conversion material. Alternatively, other wavelength conversion materials can be used. A wavelength conversion material refers to a material having a function to (i) convert a wavelength of light which has been emitted from the light-emitting element 13 and (ii) emit light which has a converted wavelength.

In Embodiment 4, the twin screw extruder 37 including the two screws 37a is used. Alternatively, it is possible to use, instead of the twin screw extruder 37, a single screw extruder including a single screw 37a. Alternatively, it is possible to use, instead of the twin screw extruder 37, a multi-screw extruder including three or more screws 37a. This allows for an increase in kneading efficiency of the powder mixture 24 and for an increase in extruding efficiency of the kneaded mixture 25.

Note that in order to evenly knead a constant amount of liquid plasticizer 23 with the powder mixture 24, it is preferable to employ a batch method. Among kneaders using the batch method, for example, a high-speed shear stirring device of internal feedback system is particularly preferable as an extruder.

Specifically, in a case where an internal feedback system high-speed shear stirring device including a single screw is used, a plasticizer 23 and a powder mixture 24 introduced into a cylinder from a rear end of a screw are moved in the cylinder toward a front end of the screw. Then, shearing force is applied to the powder mixture 24 between the front end of the screw and an inner wall of the cylinder, and the powder mixture 24 is therefore stirred. In so doing, the powder mixture 24 in the cylinder is heated at a temperature lower than a secondary crosslinking temperature $T_1$, and a rotation speed of the screw is maintained at 2500 rpm or more and 3000 rpm or less. The plasticizer 23 and the powder mixture 24, which are thus stirred, are moved toward the rear end of the screw through a feedback path.

By repeating such circulation for a period of time, the plasticizer 23 and the powder mixture 24 are sufficiently stirred so as to be a kneaded mixture 25c. Then, by extruding the kneaded mixture 25c in the form of a cord from an output port of the cylinder, it is possible to obtain a cord-like fluorescent material-containing sealing resin 20c in which fluorescent materials are evenly dispersed in silicone resins.

<Method of Forming Sheet-Like Fluorescent Material-Containing Sealing Resin 20c>

A method of forming the cord-like fluorescent material-containing sealing resin 20c into the form of a sheet (processing step) will be described next with reference to FIG. 25.

(a) through (d) of FIG. 25 are a set of views schematically illustrating the method of processing a cord-like fluorescent material-containing sealing resin 20c into the form of a sheet. The following description will discuss a method of processing a cord-like fluorescent material-containing sealing resin 20c into the form of a sheet by use of a heat press.

First, as illustrated in (a) of FIG. 25, a cord-like fluorescent material-containing sealing resin 20c is placed on a heater plate 31. Then, as illustrated in (b) of FIG. 25, the cord-like fluorescent material-containing sealing resin 20c is melted by heat at a temperature lower than a secondary crosslinking temperature $T_1$, so that viscosity of silicone resins is lowered while preventing precipitation of fluorescent materials 22 which are contained in the fluorescent material-containing sealing resin 20c.

Then, as illustrated in (c) of FIG. 25, the fluorescent material-containing sealing resin 20c is pressurized by use of a pressurizing plate 39 which has been heated at the temperature lower than the secondary crosslinking temperature $T_1$. In so doing, a thickness of the fluorescent material-containing sealing resin 20c is adjusted by a spacer member 38 provided between the heater plate 31 and the pressurizing plate 39. Then, a temperature of the fluorescent material-containing sealing resin 20c is lowered to a room temperature $T_0$ so that a sheet-like fluorescent material-containing sealing resin 20c, in which fluorescent materials are evenly dispersed, can be obtained (see (d) of FIG. 25).

<Light-Emitting Device 1d Production Method>

A light-emitting device (light-emitting device) 1d production method using a sheet-like fluorescent material-containing sealing resin 20c will be described next with reference to FIG. 26.

(a) and (b) of FIG. 26 are a set of cross-sectional views illustrating the light-emitting device 1d production method using a sheet-like fluorescent material-containing sealing resin 20c. A light-emitting device 1d is produced by use of a plane circuit board 10a having a flat surface on which light-emitting elements 13 are vertically and horizontally mounted in a matrix. By using such a plane circuit board 10a, it is possible to simultaneously produce a large number of light-emitting devices 1d.

As illustrated in (a) of FIG. 26, the plane circuit board 10a, on which the light-emitting elements 13 are mounted, and the sheet-like fluorescent material-containing sealing resin 20c are stacked in this order on a heater plate 31. Then, the plane circuit board 10a is heated by the heater plate 31 so that the sheet-like fluorescent material-containing sealing resin 20c is melted by the heat at a temperature lower than a secondary crosslinking temperature $T_1$. Then, (i) viscosity of silicone resins is lowered while precipitation of fluorescent materials 22 is prevented and (ii) the sheet-like fluorescent material-containing sealing resin 20c is pressurized against the plane circuit board 10a by use of a pressurizing plate 39 which has been heated at the temperature lower than the secondary crosslinking temperature $T_1$. This allows the sheet-like fluorescent material-containing sealing resin 20c to be in close contact with upper surfaces and side surfaces of the light-emitting elements 13.

In so doing, the sheet-like fluorescent material-containing sealing resin 20c is heated by use of the heater plate 31 at the secondary crosslinking temperature $T_1$. This subjects the silicone resins to secondary crosslinking, and therefore causes the silicone resins to be completely cured. In addition, the plane circuit board 10a is heated by use of an oven or the like at the secondary crosslinking temperature $T_1$ or higher, so that the silicone resins are completely cured. Then, the plane circuit board 10a is taken out of the oven or the like, and is cooled to a room temperature $T_0$.

As illustrated in (b) of FIG. 26, the plane circuit board 10a is divided into pieces corresponding to the respective light-emitting elements 13, so that it is possible to produce a plurality of light-emitting device 1d having uniform fluorescent material content.

Summary of Embodiment 4

As has been described, the cord-like fluorescent material-containing sealing resin 20c production method of Embodiment 4 includes: a mixing step of mixing (i) a powder of silicone resins 21 which have been semi-cured by primary crosslinking and (ii) a powder of fluorescent materials 22, so that a powder mixture 24 is obtained; an adding step of adding, to the powder mixture 24, a plasticizer 23 for lowering an elastic modulus of the silicone resins 21 which have been subjected to the secondary crosslinking; a kneading step of kneading, by use of a twin screw extruder 37, the powder mixture 24 (to which the plasticizer 23 has been added) while melting the powder mixture 24 by heat at a temperature lower than a secondary crosslinking temperature $T_1$, so that a kneaded mixture 25c is obtained, the secondary crosslinking temperature $T_1$ being a temperature at which the silicone resins 21 form secondary crosslinking; and an extruding step of extruding the kneaded mixture 25c in a form of a cord from an output port 37b of a twin screw extruder 37, the silicone resins 21 being configured to (i) reversibly change in viscosity in a temperature region between a room temperature $T_0$ and a temperature lower than a secondary crosslinking temperature $T_1$ and (ii) be completely cured in a temperature region encompassing the secondary crosslinking temperature $T_1$ or higher.

According to the cord-like fluorescent material-containing sealing resin 20c production method of Embodiment 4, silicone resins having the characteristics described above are used. This makes it possible to repeatedly adjust the viscosity of the silicone resins by changing a temperature of the silicone resins in a region between a room temperature $T_0$ and a temperature lower than a secondary crosslinking temperature $T_1$.

Therefore, when powder mixture 24 is kneaded while being melted by heat with the use of the twin screw extruder 37, precipitation of the fluorescent materials 22 in the kneaded mixture 25c can be restricted by adjusting viscosity of the silicone resins 21 while a dispersed state of the kneaded fluorescent materials 22 is maintained. Therefore, by extruding the kneaded mixture 25c in the form of a cord from at least one through hole or output port 37b, it is possible to produce a cord-like fluorescent material-containing sealing resin 20c in which the fluorescent materials 22 are evenly dispersed in the silicone resins 21.

The cord-like fluorescent material-containing sealing resin 20c thus produced allows a plurality of fluorescent material-containing sealing resins 20c, which have equal fluorescent material contents, to be easily obtained by, for example, cutting the fluorescent material-containing sealing resin 20c into pieces of the same length. Hence, by sealing the light-emitting elements 13 with the fluorescent material-containing sealing resins 20c, it is possible to equalize fluorescent material contents of light-emitting devices.

With the cord-like fluorescent material-containing sealing resin 20c production method, it is possible to increase, by configuring the fluorescent material-containing sealing resin 20c to have the form of a cord, melting efficiency of silicone resins during heating in comparison with, for example, the case of a bulk fluorescent material-containing sealing resin 20c. Therefore, the fluorescent material-containing sealing resin 20c can be processed into a desired form according to its use, by efficiently melting the cord-like fluorescent material-containing sealing resin 20c by heat at a temperature lower than the secondary crosslinking temperature $T_1$ as well as adjusting the viscosity of the silicone resins 21 while preventing the precipitation of the fluorescent materials. For example, it is possible to equalize the fluorescent material contents of light-emitting devices 1d by (i) processing a fluorescent material-containing sealing resin 20c into a sheet-like fluorescent material-containing sealing resin 20c in which fluorescent materials 22 are evenly dispersed in silicone resins 21 and then (ii) sealing light-emitting elements 13 with the sheet-like fluorescent material-containing sealing resin 20c.

Therefore, with the cord-like fluorescent material-containing sealing resin 20c production method of Embodiment 4, it is possible to produce a fluorescent material-containing sealing resin 20c capable of reducing variance in chromaticity by equalizing the fluorescent material contents of the light-emitting devices 1d.

Furthermore, according to the cord-like fluorescent material-containing sealing resin 20c production method of Embodiment 4, the plasticizer 23 for lowering the elastic modulus of the silicone resins having been subjected to secondary crosslinking is added to the powder mixture 24.

That is, the cord-like fluorescent material-containing sealing resin 20c production method of Embodiment 4 further includes: an adding step of adding, to the powder mixture 24, a plasticizer 23 for lowering an elastic modulus of the silicone resins 21 which have been subjected to the secondary crosslinking, in the kneading step, the powder mixture 24, to which the plasticizer 23 has been added, being melted by heat at the temperature lower than the secondary crosslinking temperature while being kneaded by the twin screw extruder 37.

It is therefore possible to restrict the occurrence of cracking or the like in the fluorescent material-containing sealing resin 20c by which the light-emitting elements 13 are sealed, and therefore increases reliability of the light-emitting device 1d.

[Summary]

A fluorescent material-containing sealant production method in accordance with an embodiment of the present invention includes: a mixing step of mixing (i) a powder of silicone resins which have been semi-cured by primary crosslinking and (ii) a powder of fluorescent materials, so that a powder mixture is obtained; a kneading step of kneading, by use of a kneading extruding device (twin screw extruder 37) including at least one screw, the powder mixture while melting the powder mixture by heat at a temperature lower than a secondary crosslinking temperature, so that a kneaded mixture is obtained, the secondary crosslinking temperature being a temperature at which the silicone resins form secondary crosslinking; and an extruding step of extruding the kneaded mixture in a form of a cord from an output port of the kneading extruding device, which output port has at least one through hole, the silicone resins being configured to (i) reversibly change in viscosity in a temperature region between room temperature and the temperature lower than the secondary crosslinking temperature and (ii) be completely cured in a temperature region encompassing the secondary crosslinking temperature or higher.

According to the production method, silicone resins having the characteristics described above are used. This makes it possible to repeatedly adjust the viscosity of the silicone resins by changing a temperature of the silicone resins in a region between room temperature and a temperature lower than a secondary crosslinking temperature.

Therefore, when powder mixture is kneaded while being melted by heat with the use of the kneading extruding device, precipitation of the fluorescent materials in the kneaded mixture can be restricted by adjusting viscosity of the silicone resins while a dispersed state of the kneaded fluorescent materials is maintained. Therefore, by extruding the kneaded mixture in the form of a cord from an output port, it is possible to produce a cord-like fluorescent material-containing sealing resin in which the fluorescent materials are evenly dispersed in the silicone resins.

The cord-like fluorescent material-containing sealing resin thus produced allows a plurality of fluorescent material-containing sealing resins, which have equal fluorescent material contents, to be easily obtained by, for example, cutting the fluorescent material-containing sealing resin into pieces of the same length. Hence, by sealing the light-emitting elements with the fluorescent material-containing sealing resins, it is possible to equalize fluorescent material contents of light-emitting devices.

Furthermore, with the production method, it is possible, by configuring the fluorescent material-containing sealing resin to have the form of a cord, to increase melting efficiency of silicone resins during heating in comparison with, for example, the case of a bulk fluorescent material-containing sealing resin. Therefore, by melting the cord-like fluorescent material-containing sealing resin 20 by heat at the temperature lower than the secondary crosslinking temperature $T_1$ to prevent the precipitation of fluorescent materials 22, it is possible to easily process the cord-like fluorescent material-containing sealing resin into a desired form while keeping the fluorescent materials evenly dispersed in the silicone resins.

Therefore, with the production method, it is possible to equalize fluorescent material contents of light-emitting devices by sealing light-emitting elements with a fluorescent material-containing sealing resin (i) in which fluorescent materials are evenly dispersed in silicone resins and (ii) which have a desired form.

Therefore, with the production method, it is possible to realize a fluorescent material-containing sealing resin production method that reduces variance in chromaticity by equalizing fluorescent material contents of light-emitting devices.

The fluorescent material-containing sealant production method in accordance with the embodiment of the present invention further includes an adding step of adding, to the powder mixture, a plasticizer for lowering an elastic modulus of the silicone resins which have been subjected to the secondary crosslinking, in the kneading step, the powder mixture, to which the plasticizer has been added, being melted by heat at the temperature lower than the secondary crosslinking temperature while being kneaded by the kneading extruding device.

According to the production method, the plasticizer for lowering the elastic modulus of the silicone resins, which have been subjected to the secondary crosslinking, is added to the powder mixture. This makes it possible to restrict the occurrence of cracking or the like in the fluorescent material-containing sealing resin by which the light-emitting elements are sealed, and therefore increases reliability of the light-emitting device.

The fluorescent material-containing sealant production method in accordance with the embodiment of the present invention can be configured such that the plasticizer lowers a crosslinking density of the silicone resins.

According to the production method, the plasticizer lowers the secondary crosslinking density of the silicone resins. This suitably lowers the elastic modulus of the silicone resins 21 after the secondary crosslinking, and therefore makes it possible to effectively restrict the occurrence of cracking or the like in the fluorescent material-containing sealing resin by which the light-emitting elements are sealed.

The fluorescent material-containing sealant production method in accordance with the embodiment of the present invention can be configured such that the plasticizer lowers a viscosity of the silicone resins which have been semi-cured by the primary crosslinking.

According to the production method, the plasticizer lowers the viscosity of the silicone resins which have been semi-cured by the primary crosslinking. This makes processing and the like of the fluorescent material-containing sealing resin easy. In addition, since the powder mixture is provided with compatibility, the silicone resins can be easily put together without spaces.

The fluorescent material-containing sealant production method in accordance with the embodiment of the present invention can be configured such that the plasticizer contains silicone resins as a main component.

According to the production method, the plasticizer contains silicone resins as a main component. This causes a stable effect of the plasticizer on the silicone resins, and therefore makes it possible to lower the elastic modulus and the viscosity.

The fluorescent material-containing sealant production method in accordance with the embodiment of the present invention can further includes: a processing step of processing, into a plate-like form or a sheet-like form, the kneaded mixture which has been extruded in the form of a cord in the extruding step, the processing being carried out by (i) melting the kneaded mixture by heat at the temperature lower than the secondary crosslinking temperature and then (ii) pressurizing the kneaded mixture thus melted.

The production method further includes the processing step of processing, into a plate-like form or a sheet-like form, the kneaded mixture which has been extruded in the form of a cord in the extruding step, the processing being carried out by (i) melting the kneaded mixture by heat at the temperature lower than the secondary crosslinking temperature and then (ii) pressurizing the kneaded mixture thus melted. Therefore, by adjusting the viscosity of the silicone resins so as not to cause the precipitation of the fluorescent materials, it is possible to process the kneaded mixture into the form of a plate or the form of a sheet while keeping the fluorescent materials evenly dispersed in the silicone resins.

Therefore, with the production method, it is possible to equalize the fluorescent material contents of the light-emitting devices by sealing the light-emitting elements with the use of the plate-like or sheet-like fluorescent material-containing sealing resin in which the fluorescent materials are evenly dispersed in the silicone resins.

The fluorescent material-containing sealant production method in accordance with the embodiment of the present invention can further includes: a processing step of processing, into a plate-like form or a sheet-like form, the kneaded mixture which has been extruded in the form of a cord in the extruding step, the processing being carried out by (i) melting the kneaded mixture by heat at the temperature lower than the secondary crosslinking temperature and then (ii) pressurizing the kneaded mixture thus melted.

The production method further includes the processing step of processing, into a plate-like form or a sheet-like form, the kneaded mixture which has been extruded in the form of a cord in the extruding step, the processing being carried out by (i) melting the kneaded mixture by heat at the temperature lower than the secondary crosslinking temperature and then (ii) pressurizing the kneaded mixture thus melted. Therefore, by adjusting the viscosity of the silicone resins so as not to cause the precipitation of the fluorescent materials, it is possible to process the kneaded mixture into the form of a plate or the form of a sheet while keeping the fluorescent materials evenly dispersed in the silicone resins.

Therefore, with the production method, it is possible to equalize the fluorescent material contents of the light-emitting devices by sealing the light-emitting elements with the use of the plate-like or sheet-like fluorescent material-containing sealing resin in which the fluorescent materials are evenly dispersed in the silicone resins.

A fluorescent material-containing sealant in accordance with an embodiment of the present invention is a fluorescent material-containing sealant in which a powder of fluorescent materials is dispersed in silicone resins which have been semi-cured by primary crosslinking, the silicone resins (i) having a form of a cord and (ii) being configured to (a) reversibly change in viscosity in a temperature region between room temperature and a temperature lower than a secondary crosslinking temperature at which the silicone resins form secondary crosslinking and (b) be completely cured in a temperature region encompassing the secondary crosslinking temperature or higher.

According to the configuration, the silicone resins having the characteristics described above are used. This makes it possible to repeatedly adjust the viscosity of the silicone resins by changing the temperature of the silicone resins in a region between room temperature and the temperature lower than the secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a cord-like fluorescent material-containing sealing resin, in which the fluorescent materials are evenly dispersed in the silicone resins, to be obtained.

With such a cord-like fluorescent material-containing sealing resin, it is possible to cause a plurality of fluorescent material-containing sealing resins, which have equal fluorescent material contents, to be easily obtained by, for example, cutting the fluorescent material-containing sealing resin into pieces of the same length. Hence, by sealing the light-emitting elements with the fluorescent material-containing sealing resins, it is possible to equalize fluorescent material contents of light-emitting devices.

Therefore, with the configuration, it is possible to realize a fluorescent material-containing sealing resin capable of reducing variance in chromaticity by equalizing fluorescent material contents of light-emitting devices.

A light-emitting device production method in accordance with an embodiment of the present invention includes: a placing step of placing, above a substrate (multiple cavity circuit board 10) on which light-emitting elements are mounted in respective cavities facing upwards, a porous plate (porous plate 33) having through holes (porous plate through holes 33a) corresponding to the respective cavities, the placing being carried out so that the porous plate is placed substantially parallel to the substrate; a situating step of situating, on the porous plate, a fluorescent material-containing sealant in which fluorescent materials are kneaded with silicone resins that have been semi-cured by primary crosslinking; an extruding step of extruding the fluorescent material-containing sealant in a form of strings via the respective through holes toward the substrate while melting the fluorescent material-containing sealant by heat at (i) room temperature or (ii) a temperature lower than a secondary crosslinking temperature at which the silicone resins form secondary crosslinking; a filling step of filling the cavities with the respective strings of fluorescent material-containing sealant by cutting, to a predetermined length, each of the strings of fluorescent material-containing sealant thus extruded; and a curing step of curing the fluorescent material-containing sealant with which the cavities are filled, the curing being carried out by heating the fluorescent material-containing sealant at the secondary crosslinking temperature or higher, the silicone resins being configured to (i) reversibly change in viscosity in a temperature region between the room temperature and the temperature lower than the secondary crosslinking temperature and (ii) be completely cured in a temperature region encompassing the secondary crosslinking temperature or higher.

According to the production method, silicone resins having the characteristics described above are used. This makes it possible to repeatedly adjust the viscosity of the silicone resins by changing a temperature of the silicone resins in a region between a room temperature and a temperature lower than a secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a fluorescent material-containing sealing resin, in which the fluorescent materials are evenly dispersed in the silicone resins, to be obtained.

Then, it is possible to simultaneously fill (potting) each of the cavities with an identical amount of fluorescent material-containing sealing resin 20 by (i) extruding, in the form of strings, the fluorescent material-containing sealing resin from the through holes toward the substrate while melting the fluorescent material-containing sealing resin by heat at room temperature or at a temperature lower than a secondary crosslinking temperature and (ii) cutting each of the strings of fluorescent material-containing sealing resins to a predetermined length. Note that the predetermined length of fluorescent material-containing sealing resins, with which the cavities are filled, have uniform fluorescent material content. Therefore, in a case where the fluorescent material-containing sealing resins are heated at a secondary crosslinking temperature or higher so that silicone resins are completely cured, it is possible to seal the light-emitting elements with the respective fluorescent material-containing sealing resins having the uniform fluorescent material content.

Therefore, with the production method, it is possible to realize a light-emitting device production method capable of reducing variance in chromaticity by equalizing fluorescent material contents of light-emitting devices.

According to the production method, the through holes are formed on the porous plate in accordance with the number, dimensions, and the like of the cavities provided on the substrate. This makes it easy to handle production of various light-emitting devices, and therefore allows a reduction in production costs of the light-emitting devices.

The light-emitting device production method in accordance with the embodiment of the present invention can be configured such that the fluorescent material-containing sealant, which is situated on the porous plate in the situating step, further contains a plasticizer for lowering an elastic modulus of the silicone resins which have been subjected to the secondary crosslinking.

According to the production method, the plasticizer for lowering the elastic modulus of the silicone resins, which have been subjected to the secondary crosslinking, is added to the powder mixture. This makes it possible to restrict the occurrence of cracking or the like in the fluorescent material-containing sealing resin by which the light-emitting elements are sealed, and therefore increases reliability of the light-emitting device.

The light-emitting device production method in accordance with the embodiment of the present invention can be configured such that a dimension of each of the through holes is smaller than an opening dimension of each of the cavities.

According to the configuration, the dimension of each of the through holes is smaller than the opening dimension of the cavities. This makes it easy to fill the cavities with the fluorescent material-containing sealing resins. Therefore, it is possible to fill, by adjusting the length of the fluorescent material-containing sealing resin which has been extruded in the form of strings, the cavities with respective fluorescent material-containing sealing resins whose amounts are suitable for volumes of the cavities.

The light-emitting device production method in accordance with the embodiment of the present invention can be configured such that, in the filling step and in the curing step, the substrate is heated from a direction toward which a bottom surface of the substrate faces.

According to the production method, the substrate is heated, in the filling step and in the curing step, from the direction toward which the bottom surface of the substrate faces. This causes the fluorescent material-containing sealing resins, with which the respective cavities are filled, to start being cured from their parts corresponding to the bottoms of the respective cavities.

Therefore, with the production method, stress, which occurs due to cure shrinkage of each of the fluorescent material-containing sealing resins, can be distributed toward an upper part of the fluorescent material-containing sealing resin, that is, toward an opening side of the corresponding cavity. This reduces stress loading on the light-emitting elements, and therefore increases reliability of the light-emitting device.

The light-emitting device production method in accordance with the embodiment of the present invention can be configured such that, in the filling step, the fluorescent material-containing sealant is cut by moving, in a direction parallel to a direction in which the substrate extends, a cut plate (cut plate 32) which (i) is provided between and substantially parallel to the porous plate and the substrate and (ii) has blades (blades 32b) corresponding to the respective through holes.

According to the production method, the cut plate, which has blades corresponding to the respective through holes, is moved in the direction parallel to the direction in which the substrate extends. This allows the fluorescent material-containing sealants to be simultaneously cut by the respective blades.

The light-emitting device production method in accordance with the embodiment of the present invention can be configured such that, in the filling step, the fluorescent material-containing sealant is cut by moving, after lower end parts of the strings of fluorescent material-containing sealant thus extruded have reached the respective cavities, the porous plate or the substrate so that the porous plate and the substrate are separated in a direction perpendicular to the substrate.

According to the production method, the substrate is heated. This allows lower end parts of the fluorescent material-containing sealing resins, which have been extruded in the form of strings and have reached the substrate, to be attached to corresponding bottom parts of the respective cavities by the heat.

Therefore, according to the production method, it is possible to fill the cavities with the respective strings of fluorescent material-containing sealing resin by cutting, after the lower end parts of the strings of fluorescent material-containing sealing resin have reached the respective the cavities, the strings of fluorescent material-containing sealant through moving the porous plate or the substrate so that the porous plate or the substrate are separated.

The light-emitting device production method in accordance with the embodiment of the present invention can be configured such that, in the filling step, the fluorescent material-containing sealant is cut by injecting compressed air between the porous plate and the substrate after lower end parts of the strings of fluorescent material-containing sealant thus extruded have reached the respective cavities.

According to the production method, the substrate is heated. This allows lower end parts of the fluorescent material-containing sealing resins, which have been extruded in the form of strings and have reached the substrate, to be attached to corresponding bottom parts of the respective cavities by the heat.

Therefore, according to the production method, it is possible to fill the cavities with the respective strings of fluorescent material-containing sealing resin by cutting, after the lower end parts of the strings of fluorescent material-containing sealing resin have reached the respective cavities, the strings of fluorescent material-containing sealant through injecting compressed air between the porous plate and the substrate.

A dispenser in accordance with an embodiment of the present invention is a dispenser configured to discharge, toward light-emitting elements mounted on a substrate, respective strings of fluorescent material-containing sealant in which a powder of fluorescent materials is dispersed in silicone resins which have been semi-cured by primary crosslinking, said dispenser including: a containing section (syringe 36a) for containing the fluorescent material-containing sealant, the containing section having a heating mechanism capable of heating the fluorescent material-containing sealant thus contained, and the silicone resins being configured to (i) reversibly change in viscosity in a temperature region between room temperature and a temperature lower than a secondary crosslinking temperature at which the silicone resins form secondary crosslinking and (ii) be completely cured in a temperature region encompassing the secondary crosslinking temperature or higher.

According to the configuration, silicone resins having the characteristics described above are used. This makes it possible to repeatedly adjust the viscosity of the silicone resins by changing a temperature of the silicone resins in a region between room temperature and a temperature lower than a secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a fluorescent material-containing sealing resin, in which the fluorescent materials are evenly dispersed in the silicone resins, to be obtained.

In addition, the dispenser includes the heating mechanism capable of heating the fluorescent material-containing sealant contained. This makes it possible to melt the contained fluorescent material-containing sealant by heat at a temperature lower than the secondary crosslinking temperature at which the silicone resins form secondary crosslinking. Therefore, the precipitation of the fluorescent materials dispersed in the silicone resins in the containing section can be restricted by adjusting the viscosity of the silicone resins to a viscosity with which a dispersed state of the fluorescent materials can be maintained. Hence, it is possible, by use of the dispenser, to fill the cavities with a fluorescent material-containing sealing resin in which a dispersed state of the fluorescent materials is maintained.

Therefore, with the configuration, it is possible to realize a dispenser capable of reducing variance in chromaticity by equalizing fluorescent material contents of light-emitting devices.

A light-emitting device production method in accordance with an embodiment of the present invention includes: a discharging step of discharging, by use of the above described dispenser, the fluorescent material-containing sealant toward the light-emitting elements so as to cause the fluorescent material-containing sealant to be in close contact with surfaces of the light-emitting elements while melting the fluorescent material-containing sealant by heat at (i) the room temperature or (ii) the temperature lower than the secondary crosslinking temperature; and a curing step of curing the fluorescent material-containing sealant, which is in close contact with the surfaces of the light-emitting elements, by heating the fluorescent material-containing sealant at the secondary crosslinking temperature or higher.

With the production method, it is possible to use the dispenser to discharge, toward the light-emitting elements, the fluorescent material-containing sealing resin in which a dispersed state of the fluorescent materials is maintained. This makes it possible to realize a light-emitting device production method capable of reducing variance in chromaticity by equalizing fluorescent material contents of light-emitting devices.

[Summary 2]

A fluorescent material-containing sealant production method in accordance with an embodiment of the present invention includes: a mixing step of mixing (i) a powder of silicone resins which have been semi-cured by primary crosslinking and (ii) a powder of fluorescent materials, so that a powder mixture is obtained; an adding step of adding, to the powder mixture, a plasticizer for lowering an elastic modulus of the silicone resins which have been subjected to the secondary crosslinking; a kneading step of kneading, by use of a kneading extruding device (biaxial screw extruder 37) including at least one screw, the powder mixture, to which the plasticizer has been added, while melting the powder mixture by heat at a temperature lower than a secondary crosslinking temperature, so that a kneaded mixture is obtained, the secondary crosslinking temperature being a temperature at which the silicone resins form secondary crosslinking; and an extruding step of extruding the kneaded mixture in a form of a cord from an output port of the kneading extruding device, which output port has at least one through hole, the silicone resins being configured to (i) reversibly change in viscosity in a temperature region between room temperature and the temperature lower than the secondary crosslinking temperature and (ii) be completely cured in a temperature region encompassing the secondary crosslinking temperature or higher.

According to the production method, silicone resins having the characteristics described above are used. This makes it possible to repeatedly adjust the viscosity of the silicone resins by changing a temperature of the silicone resins in a region between room temperature and a temperature lower than a secondary crosslinking temperature.

Therefore, when powder mixture is kneaded while being melted by heat with the use of the kneading extruding device, precipitation of the fluorescent materials in the kneaded mixture can be restricted by adjusting viscosity of the silicone resins while a dispersed state of the kneaded fluorescent materials is maintained. Therefore, by extruding the kneaded mixture in the form of a cord from a output port, it is possible to produce a cord-like fluorescent material-containing sealing resin in which the fluorescent materials are evenly dispersed in the silicone resins.

The cord-like fluorescent material-containing sealing resin thus produced allows a plurality of fluorescent material-containing sealing resins, which have equal fluorescent material contents, to be easily obtained by, for example, cutting the fluorescent material-containing sealing resin into pieces of the same length. Hence, by sealing the light-emitting elements with the fluorescent material-containing sealing resins, it is possible to equalize fluorescent material contents of light-emitting devices.

Furthermore, with the production method, it is possible, by configuring the fluorescent material-containing sealing resin to have the form of a cord, to increase melting efficiency of silicone resins during heating in comparison with, for example, the case of a bulk fluorescent material-containing sealing resin. Therefore, by melting the cord-like fluorescent material-containing sealing resin $20c$ by heat at the temperature lower than the secondary crosslinking temperature $T_1$ to prevent the precipitation of fluorescent materials 22, it is possible to easily process the cord-like fluorescent material-containing sealing resin into a desired form while keeping the fluorescent materials evenly dispersed in the silicone resins.

Therefore, with the production method, it is possible to equalize fluorescent material contents of light-emitting devices by sealing light-emitting elements with a fluorescent material-containing sealing resin (i) in which fluorescent materials are evenly dispersed in silicone resins and (ii) which have a desired form.

Therefore, with the production method, it is possible to realize a fluorescent material-containing sealing resin production method that reduces variance in chromaticity by equalizing fluorescent material contents of light-emitting devices.

Furthermore, According to the present invention, the plasticizer for lowering the elastic modulus of the silicone resins, which have been subjected to the secondary crosslinking, is added to the powder mixture. This makes it possible to restrict the occurrence of cracking or the like in the fluorescent material-containing sealing resin by which the light-emitting elements are sealed, and therefore increases reliability of the light-emitting device.

A fluorescent material-containing sealant in accordance with an embodiment of the present invention is a fluorescent material-containing sealant in which a powder of fluorescent materials is dispersed in silicone resins which have been semi-cured by primary crosslinking, the silicone resins (i) having a form of a cord and (ii) being configured to (a) reversibly change in viscosity in a temperature region between room temperature and a temperature lower than a secondary crosslinking temperature at which the silicone resins form secondary crosslinking and (b) be completely cured in a temperature region encompassing the secondary crosslinking temperature or higher.

According to the configuration, the silicone resins having the characteristics described above are used. This makes it possible to repeatedly adjust the viscosity of the silicone resins by changing the temperature of the silicone resins in a region between room temperature and the temperature lower than the secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a cord-like fluorescent material-containing sealing resin, in which the fluorescent materials are evenly dispersed in the silicone resins, to be obtained.

With such a cord-like fluorescent material-containing sealing resin, it is possible to cause a plurality of fluorescent material-containing sealing resins, which have equal fluorescent material contents, to be easily obtained by, for example, cutting the fluorescent material-containing sealing resin into pieces of the same length. Hence, by sealing the light-emitting elements with the fluorescent material-containing sealing resins, it is possible to equalize fluorescent material contents of light-emitting devices.

Therefore, with the configuration, it is possible to realize a fluorescent material-containing sealing resin capable of reducing variance in chromaticity by equalizing fluorescent material contents of light-emitting devices.

A light-emitting device production method in accordance with an embodiment of the present invention includes: a placing step of placing, above a substrate (multiple cavity circuit board 10) on which light-emitting elements are mounted in respective cavities facing upwards, a porous plate (porous plate 33) having through holes (porous plate through holes 33a) corresponding to the respective cavities, the placing being carried out so that the porous plate is placed substantially parallel to the substrate; a situating step of situating, on the porous plate, a fluorescent material-containing sealant in which fluorescent materials and a plasticizer for lowering an elastic modulus of the silicone resins which have been subjected to the secondary crosslinking are kneaded with silicone resins that have been semi-cured by primary crosslinking; an extruding step of extruding the fluorescent material-containing sealant in a form of strings via the respective through holes toward the substrate while melting the fluorescent material-containing sealant by heat at (i) room temperature or (ii) a temperature lower than a secondary crosslinking temperature at which the silicone resins form secondary crosslinking; a filling step of filling the cavities with the respective strings of fluorescent material-containing sealant by cutting, to a predetermined length, each of the strings of fluorescent material-containing sealant thus extruded; and a curing step of curing the fluorescent material-containing sealant with which the cavities are filled, the curing being carried out by heating the fluorescent material-containing sealant at the secondary crosslinking temperature or higher, the silicone resins being configured to (i) reversibly change in viscosity in a temperature region between the room temperature and the temperature lower than the secondary crosslinking temperature and (ii) be completely cured in a temperature region encompassing the secondary crosslinking temperature or higher.

According to the production method, silicone resins having the characteristics described above are used. This makes it possible to repeatedly adjust the viscosity of the silicone resins by changing a temperature of the silicone resins in a region between room temperature and a temperature lower than a secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a fluorescent material-containing sealing resin, in which the fluorescent materials are evenly dispersed in the silicone resins, to be obtained.

Then, it is possible to simultaneously fill (potting) each of the cavities with an identical amount of fluorescent material-containing sealing resin 20c by (i) extruding, in the form of strings, the fluorescent material-containing sealing resin from the through holes toward the substrate while melting the fluorescent material-containing sealing resin by heat at room temperature or at a temperature lower than a secondary crosslinking temperature and (ii) cutting each of the strings of fluorescent material-containing sealing resins to a predetermined length. Note that the predetermined length of fluorescent material-containing sealing resins, with which the cavities are filled, have uniform fluorescent material content. Therefore, in a case where the fluorescent material-containing sealing resins are heated at a secondary crosslinking temperature or higher so that silicone resins are completely cured, it is possible to seal the light-emitting elements with the respective fluorescent material-containing sealing resins having the uniform fluorescent material content.

Therefore, with the production method, it is possible to realize a light-emitting device production method capable of reducing variance in chromaticity by equalizing fluorescent material contents of light-emitting elements.

According to the production method, the through holes are formed on the porous plate in accordance with the number, dimensions, and the like of the cavities provided on the substrate. This makes it easy to handle production of various light-emitting devices, and therefore allows a reduction in production costs of the light-emitting devices.

According to the present invention, the plasticizer for lowering the elastic modulus of the silicone resins, which have been subjected to the secondary crosslinking, is added to the powder mixture. This makes it possible to restrict the occurrence of cracking or the like in the fluorescent material-containing sealing resin by which the light-emitting elements are sealed, and therefore increases reliability of the light-emitting device.

The light-emitting device production method in accordance with the embodiment of the present invention can be configured such that a dimension of each of the through holes is smaller than an opening dimension of each of the cavities.

According to the present invention, the dimension of each of the through holes is smaller than the opening dimension of the cavities. This makes it easy to fill the cavities with the fluorescent material-containing sealing resins. Therefore, it is possible to fill, by adjusting the length of the fluorescent material-containing sealing resin having been extruded in the form of strings, the cavities with respective fluorescent material-containing sealing resins whose amounts are suitable for volumes of the cavities.

The light-emitting device production method in accordance with the embodiment of the present invention can be configured such that, in the filling step and in the curing step, the substrate is heated from a direction toward which a bottom surface of the substrate faces.

According to the production method, the substrate is heated, in the filling step and in the curing step, from the direction toward which the bottom surface of the substrate faces. This causes the fluorescent material-containing sealing resins, with which the respective cavities are filled, to start being cured from their parts corresponding to the bottoms of the respective cavities.

Therefore, with the production method, stress, which occurs due to cure shrinkage of each of the fluorescent material-containing sealing resins, can be distributed toward an upper part of the fluorescent material-containing sealing resin, that is, toward an opening side of the corresponding cavity. This reduces stress loading on the light-emitting elements, and therefore increases reliability of the light-emitting device.

The light-emitting device production method in accordance with the embodiment of the present invention can be configured such that, in the filling step, the fluorescent material-containing sealant is cut by moving, in a direction parallel to a direction in which the substrate extends, a cut plate (cut plate 32) which (i) is provided between and substantially parallel to the porous plate and the substrate and (ii) has blades (blades 32b) corresponding to the respective through holes.

According to the production method, the cut plate, which has blades corresponding to the respective through holes, is moved in the direction parallel to the direction in which the substrate extends. This allows the fluorescent material-containing sealants to be simultaneously cut by the respective blades.

The light-emitting device production method in accordance with the embodiment of the present invention can be configured such that, in the filling step, the fluorescent material-containing sealant is cut by moving, after lower end parts of the strings of fluorescent material-containing sealant thus extruded have reached the respective cavities, the porous plate or the substrate so that the porous plate and the substrate are separated in a direction perpendicular to the substrate.

According to the production method, the substrate is heated. This allows lower end parts of the fluorescent material-containing sealing resins, which have been extruded in the form of strings and have reached the substrate, to be attached to corresponding bottom parts of the respective cavities by the heat.

Therefore, according to the production method, it is possible to fill the cavities with the respective strings of fluorescent material-containing sealing resin by cutting, after the lower end parts of the strings of fluorescent material-containing sealing resin have reached the respective cavities, the strings of fluorescent material-containing sealant through moving the porous plate or the substrate so that the porous plate or the substrate are separated.

The light-emitting device production method in accordance with the embodiment of the present invention can be configured such that, in the filling step, the fluorescent material-containing sealant is cut by injecting compressed air between the porous plate and the substrate after lower end parts of the strings of fluorescent material-containing sealant thus extruded have reached the respective cavities.

According to the production method, the substrate is heated. This allows lower end parts of the fluorescent material-containing sealing resins, which have been extruded in the form of strings and have reached the substrate, to be attached to corresponding bottom parts of the respective cavities by the heat.

Therefore, according to the production method, it is possible to fill the cavities with the respective strings of fluorescent material-containing sealing resin by cutting, after the lower end parts of the strings of fluorescent material-containing sealing resin have reached the respective cavities, the strings of fluorescent material-containing sealant through injecting compressed air between the porous plate and the substrate.

A dispenser in accordance with an embodiment of the present invention is a dispenser configured to discharge, toward light-emitting elements mounted on a substrate, respective strings of fluorescent material-containing sealant in which a powder of fluorescent materials is dispersed in silicone resins which have been semi-cured by primary crosslinking, said dispenser including: a containing section (syringe 36a) for containing the fluorescent material-containing sealant, the containing section having a heating mechanism capable of heating the fluorescent material-containing sealant thus contained, and the silicone resins being configured to (i) reversibly change in viscosity in a temperature region between room temperature and a temperature lower than a secondary crosslinking temperature and (ii) be completely cured in a temperature region encompassing the secondary crosslinking temperature or higher.

According to the configuration, silicone resins having the characteristics described above are used. This makes it possible to repeatedly adjust the viscosity of the silicone resins by changing a temperature of the silicone resins in a region between room temperature and a temperature lower than a secondary crosslinking temperature.

Therefore, when the melted silicone resins and the powder of fluorescent materials are kneaded together, the precipitation of the fluorescent materials, which are kneaded with the silicone resins, can be restricted by adjusting the viscosity of the silicone resins to a viscosity with which a dispersed state of the fluorescent materials can be maintained. This allows a fluorescent material-containing sealing resin, in which the fluorescent materials are evenly dispersed in the silicone resins, to be obtained.

In addition, the dispenser includes the heating mechanism capable of heating the fluorescent material-containing sealant contained. This makes it possible to melt the contained fluorescent material-containing sealant by heat at a temperature lower than the secondary crosslinking temperature at which the silicone resins form secondary crosslinking. Therefore, the precipitation of the fluorescent materials dispersed in the silicone resins in the containing section can be restricted by adjusting the viscosity of the silicone resins to a viscosity with which a dispersed state of the fluorescent materials can be maintained. Hence, it is possible, by use of the dispenser, to fill the cavities with a fluorescent material-containing sealing resin in which a dispersed state of the fluorescent materials is maintained.

Therefore, with the configuration, it is possible to realize a dispenser capable of reducing variance in chromaticity by equalizing fluorescent material contents of light-emitting devices.

A light-emitting device production method in accordance with an embodiment of the present invention includes: a discharging step of discharging, by use of the above described dispenser, the fluorescent material-containing sealant toward the light-emitting elements so as to cause the fluorescent material-containing sealant to be in close contact with surfaces of the light-emitting elements while melting the fluorescent material-containing sealant by heat at (i) the room temperature or (ii) the temperature lower than the secondary crosslinking temperature; and a curing step of curing the fluorescent material-containing sealant, which is in close contact with the surfaces of the light-emitting elements, by heating the fluorescent material-containing sealant at the secondary crosslinking temperature or higher.

With the production method, it is possible to use the dispenser to discharge, toward the light-emitting elements, the fluorescent material-containing sealing resin in which a dispersed state of the fluorescent materials is maintained. This makes it possible to realize a light-emitting device production method capable of reducing variance in chromaticity by equalizing fluorescent material contents of light-emitting devices.

As has been described, a fluorescent material-containing sealant production method in accordance with an embodiment of the present invention includes: a mixing step of mixing (i) a powder of silicone resins which have been semi-cured by primary crosslinking and (ii) a powder of fluorescent materials, so that a powder mixture is obtained; an adding step of adding, to the powder mixture, a plasticizer for lowering an elastic modulus of the silicone resins which have been subjected to the secondary crosslinking; a kneading step of kneading, by use of a kneading extruding device including at least one screw, the powder mixture, to which the plasticizer has been added, while melting the powder mixture by heat at a temperature lower than a secondary crosslinking temperature, so that a kneaded mixture is obtained, the secondary crosslinking temperature being a temperature at which the silicone resins form secondary crosslinking; and an extruding step of extruding the kneaded mixture in a form of a cord from an output port of the kneading extruding device, which output port has at least one through hole, the silicone resins being configured to (i) reversibly change in viscosity in a temperature region between room temperature and the temperature lower than the secondary crosslinking temperature and (ii) be completely cured in a temperature region encompassing the secondary crosslinking temperature or higher.

The fluorescent material-containing sealant production method in accordance with the embodiment of the present invention can be configured such that the plasticizer lowers a crosslinking density of the silicone resins.

The fluorescent material-containing sealant production method in accordance with the embodiment of the present invention can be configured such that the plasticizer lowers a viscosity of the silicone resins which have been semi-cured by the primary crosslinking.

The fluorescent material-containing sealant production method in accordance with the embodiment of the present invention can be configured such that the plasticizer contains silicone resins as a main component.

The fluorescent material-containing sealant production method in accordance with the embodiment of the present invention can further include: a processing step of processing, into a plate-like form or a sheet-like form, the kneaded mixture which has been extruded in the form of a cord in the extruding step, the processing being carried out by (i) melting the kneaded mixture by heat at the temperature lower than the secondary crosslinking temperature and then (ii) pressurizing the kneaded mixture thus melted.

As has been described, a light-emitting device production method in accordance with an embodiment of the present invention includes: a placing step of placing, above a substrate on which light-emitting elements are mounted in respective cavities facing upwards, a porous plate having through holes corresponding to the respective cavities, the placing being carried out so that the porous plate is placed substantially parallel to the substrate; a situating step of situating, on the porous plate, a fluorescent material-containing sealant in which a powder of fluorescent materials and a plasticizer for lowering an elastic modulus of the silicone resins which have been subjected to the secondary crosslinking are kneaded with silicone resins that have been semi-cured by primary crosslinking; an extruding step of extruding the fluorescent material-containing sealant in a form of strings via the respective through holes toward the substrate while melting the fluorescent material-containing sealant by heat at (i) room temperature or (ii) a temperature lower than a secondary crosslinking temperature at which the silicone resins form secondary crosslinking; a filling step of filling the cavities with the respective strings of fluorescent material-containing sealant by cutting, to a predetermined length, each of the strings of fluorescent material-containing sealant thus extruded; and a curing step of curing the fluorescent material-containing sealant with which the cavities are filled, the curing being carried out by heating the fluorescent material-containing sealant at the secondary crosslinking temperature or higher, the silicone resins being configured to (i) reversibly change in viscosity in a temperature region between the room temperature and the temperature lower than the secondary crosslinking temperature and (ii) be completely cured in a temperature region encompassing the secondary crosslinking temperature or higher.

The light-emitting device production method in accordance with the embodiment of the present invention can be configured such that a dimension of each of the through holes is smaller than an opening dimension of each of the cavities.

The light-emitting device production method in accordance with the embodiment of the present invention can be configured such that, in the filling step and in the curing step, the substrate is heated from a direction toward which a bottom surface of the substrate faces.

The light-emitting device production method in accordance with the embodiment of the present invention can be configured such that, in the filling step, the fluorescent material-containing sealant is cut by moving, in a direction parallel to a direction in which the substrate extends, a cut plate which (i) is provided between and substantially parallel to the porous plate and the substrate and (ii) has blades corresponding to the respective through holes.

The light-emitting device production method in accordance with the embodiment of the present invention can be configured such that, in the filling step, the fluorescent material-containing sealant is cut by moving, after lower end parts of the strings of fluorescent material-containing sealant thus extruded have reached the respective cavities, the porous plate or the substrate so that the porous plate and the substrate are separated in a direction perpendicular to the substrate.

The light-emitting device production method in accordance with the embodiment of the present invention can be configured such that, in the filling step, the fluorescent material-containing sealant is cut by injecting compressed air between the porous plate and the substrate after lower end parts of the strings of fluorescent material-containing sealant thus extruded have reached the respective cavities.

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

INDUSTRIAL APPLICABILITY

The present invention is suitable for production of a light-emitting device for use in (i) a display device and illumination equipment each using an LED(s) as a light source(s), (ii) a backlight such as a display, (iii) a signal, (iv) a large display and an advertising sign each used outside, and (v) the like.

REFERENCE SIGNS LIST

1a Light-emitting device (light-emitting device)
1b Light-emitting device (light-emitting device)
1c Light-emitting device (light-emitting device)
1d Light-emitting device (light-emitting device)
10 Multiple cavity circuit board (substrate)
10a Plane circuit board (substrate)
11 Circuit board (substrate)
12 Cavity
13 Light-emitting element
20 Fluorescent material-containing sealing resin (fluorescent material-containing sealant)
20c Fluorescent material-containing sealing resin (fluorescent material-containing sealant)
21 Silicone resin
22 Fluorescent material
23 Plasticizer
24 Powder mixture
25 Kneaded mixture
25c Kneaded mixture
32 Cut plate
32a Cut plate through hole (through hole)
32b Blade)
33 Porous plate
33a Porous plate through hole (through hole)
36 Dispenser
36a Syringe (containing section)
37 Twin screw extruder (kneading extruding device)
37b Output port (through hole)
$T_0$ Room temperature
$T_1$ Secondary crosslinking temperature
d Dimension
D Dimension (opening dimension)

The invention claimed is:

1. A method of producing a light-emitting device, comprising:
   a placing step of placing, above a substrate on which light-emitting elements are mounted in respective cavities facing upwards, a porous plate having through holes corresponding to the respective cavities, the placing being carried out so that the porous plate is placed substantially parallel to the substrate;
   a situating step of situating, on the porous plate, a fluorescent material-containing sealant in which a powder of fluorescent materials is kneaded with silicone resins that have been semi-cured by primary crosslinking;
   an extruding step of extruding the fluorescent material-containing sealant in a form of strings via the respective through holes toward the substrate while melting the fluorescent material-containing sealant by heat at (i) room temperature or (ii) a temperature lower than a secondary crosslinking temperature at which the silicone resins form secondary crosslinking;
   a filling step of filling the cavities with the respective strings of fluorescent material-containing sealant by cutting, to a predetermined length, each of the strings of fluorescent material-containing sealant thus extruded; and
   a curing step of curing the fluorescent material-containing sealant with which the cavities are filled, the curing being carried out by heating the fluorescent material-containing sealant at the secondary crosslinking temperature or higher,
   the silicone resins being configured to (i) reversibly change in viscosity in a temperature region between the room temperature and the temperature lower than the secondary crosslinking temperature and (ii) be completely cured in a temperature region encompassing the secondary crosslinking temperature or higher.

2. The method as set forth in claim 1, wherein
the fluorescent material-containing sealant, which is situated on the porous plate in the situating step, further contains a plasticizer for lowering an elastic modulus of the silicone resins which have been subjected to the secondary crosslinking.

3. The method as set forth in claim 1, wherein
a dimension of each of the through holes is smaller than an opening dimension of each of the cavities.

4. The method as set forth in claim 1, wherein
in the filling step and in the curing step, the substrate is heated from a direction toward which a bottom surface of the substrate faces.

5. The method as set forth in claim 1, wherein
in the filling step, the fluorescent material-containing sealant is cut by moving, in a direction parallel to a direction in which the substrate extends, a cut plate which (i) is provided between and substantially parallel to the porous plate and the substrate and (ii) has blades corresponding to the respective through holes.

6. The method as set forth in claim 4, wherein
in the filling step, the fluorescent material-containing sealant is cut by moving, after lower end parts of the strings of fluorescent material-containing sealant thus extruded have reached the respective cavities, the porous plate or the substrate so that the porous plate and the substrate are separated in a direction perpendicular to the substrate.

7. The method as set forth in claim 4, wherein
in the filling step, the fluorescent material-containing sealant is cut by injecting compressed air between the porous plate and the substrate after lower end parts of the strings of fluorescent material-containing sealant thus extruded have reached the respective cavities.

* * * * *